US012738314B2

(12) United States Patent
Zhang et al.

(10) Patent No.: US 12,738,314 B2
(45) Date of Patent: Sep. 15, 2026

(54) SYSTEMS AND METHODS FOR PERFORMING INDEPENDENT PLANE CONCURRENT MEMORY OPERATIONS IN NON-VOLATILE MEMORY STRUCTURES

(71) Applicant: Sandisk Technologies, Inc., Milpitas, CA (US)

(72) Inventors: Ke Zhang, Shanghai (CN); Liang Li, Shanghai (CN); Jiahui Yuan, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 170 days.

(21) Appl. No.: 18/224,202

(22) Filed: Jul. 20, 2023

(65) Prior Publication Data

US 2024/0296882 A1 Sep. 5, 2024

Related U.S. Application Data

(60) Provisional application No. 63/449,173, filed on Mar. 1, 2023.

(51) Int. Cl.

| | |
|---|---|
| ***G11C 16/10*** | (2006.01) |
| ***G11C 11/4076*** | (2006.01) |
| ***G11C 11/408*** | (2006.01) |
| ***G11C 11/4096*** | (2006.01) |

(52) U.S. Cl.
CPC ...... *G11C 11/4096* (2013.01); *G11C 11/4076* (2013.01); *G11C 11/4085* (2013.01)

(58) Field of Classification Search
CPC ......... G11C 16/08; G11C 16/10; G11C 16/30; G11C 16/0483
See application file for complete search history.

(56) References Cited

U.S. PATENT DOCUMENTS

| | | | | |
|---|---|---|---|---|
| 7,940,564 | B2 | 5/2011 | Park et al. | |
| 9,514,827 | B1 * | 12/2016 | Nam | G06F 3/0619 |
| 9,792,995 | B1 * | 10/2017 | Shah | G11C 7/1039 |
| 10,153,029 | B2 | 12/2018 | Kwak et al. | |
| 10,877,696 | B2 | 12/2020 | Wakchaure et al. | |
| 11,087,849 | B2 | 8/2021 | Chin et al. | |
| 11,475,954 | B2 * | 10/2022 | Chen | G11C 16/32 |
| 2009/0196102 | A1 * | 8/2009 | Kim | G11C 7/1045<br>365/185.11 |

(Continued)

*Primary Examiner* — Mushfique Siddique
(74) *Attorney, Agent, or Firm* — Dickinson Wright PLLC

(57) ABSTRACT

Method for performing a memory operation with respect to a memory structure having "N"-number of planes, each plane comprising "M"-number of blocks and "X"-number of word lines arranged in a serial order, and electrically connected with each plane are: a voltage bias source, an electronic switching component, and row decoder, the method comprising: with respect to each plane, selecting a block and a word line for application of the operation, wherein the operation has not been applied to the selected block and word line, the selected block of one plane is located in a different block group from the selected block of another plane, and the selected word line of one plane is in a different position within the serial order from a position of the selected word line of another plane; and using the voltage bias source, concurrently applying the operation to the selected blocks and selected word lines.

9 Claims, 32 Drawing Sheets

(56) References Cited

U.S. PATENT DOCUMENTS

| | | | | |
|---|---|---|---|---|
| 2009/0244983 | A1* | 10/2009 | Park | G11C 16/3427 365/185.11 |
| 2010/0088540 | A1* | 4/2010 | Chu | G11C 29/76 714/5.1 |
| 2015/0380097 | A1* | 12/2015 | Sato | G11C 16/26 365/185.12 |
| 2019/0006012 | A1* | 1/2019 | Shin | G11C 16/30 |
| 2019/0348127 | A1* | 11/2019 | Chin | G11C 16/08 |
| 2020/0194077 | A1* | 6/2020 | Sanad | G11C 16/24 |
| 2021/0149594 | A1 | 5/2021 | Shah | |
| 2021/0389879 | A1 | 12/2021 | Inbar et al. | |
| 2022/0032556 | A1* | 2/2022 | Yan | B29C 65/08 |
| 2022/0059171 | A1 | 2/2022 | Goss | |
| 2023/0023618 | A1* | 1/2023 | Zhang | G11C 16/30 |
| 2023/0148416 | A1* | 5/2023 | Guo | G11C 8/12 365/189.011 |

* cited by examiner

Threshold Voltage Window

Erased
rV1
rV2
rV3
"0"
"1"
"2"
"3"

"Erased"

W1
W2
W3
11
01
00
10
Upper Bit
Lower Bit
Vth

Threshold Voltage Window

Erased
"0"
"1"
"2"
"3"
"4"
"5"
"6"
"7"

"Erased"

V1
V2
V3
V4
V5
V6
V7
111
011
001
101
100
000
010
110
Upper Bit
Middle Bit
Lower Bit
Vth "Erased"
Threshold Voltage Window
"0"
"1"
"2"
"3"
"4"
"5"
"6"
"7"
"8"
"9"
"10"
"11"
"12"
"13"
"14"
"15"

"Erased"

1111
0111
0011
0001
1011
1001
1000
1100
1101
1110
0100
0010
1010
0000
0101
0110

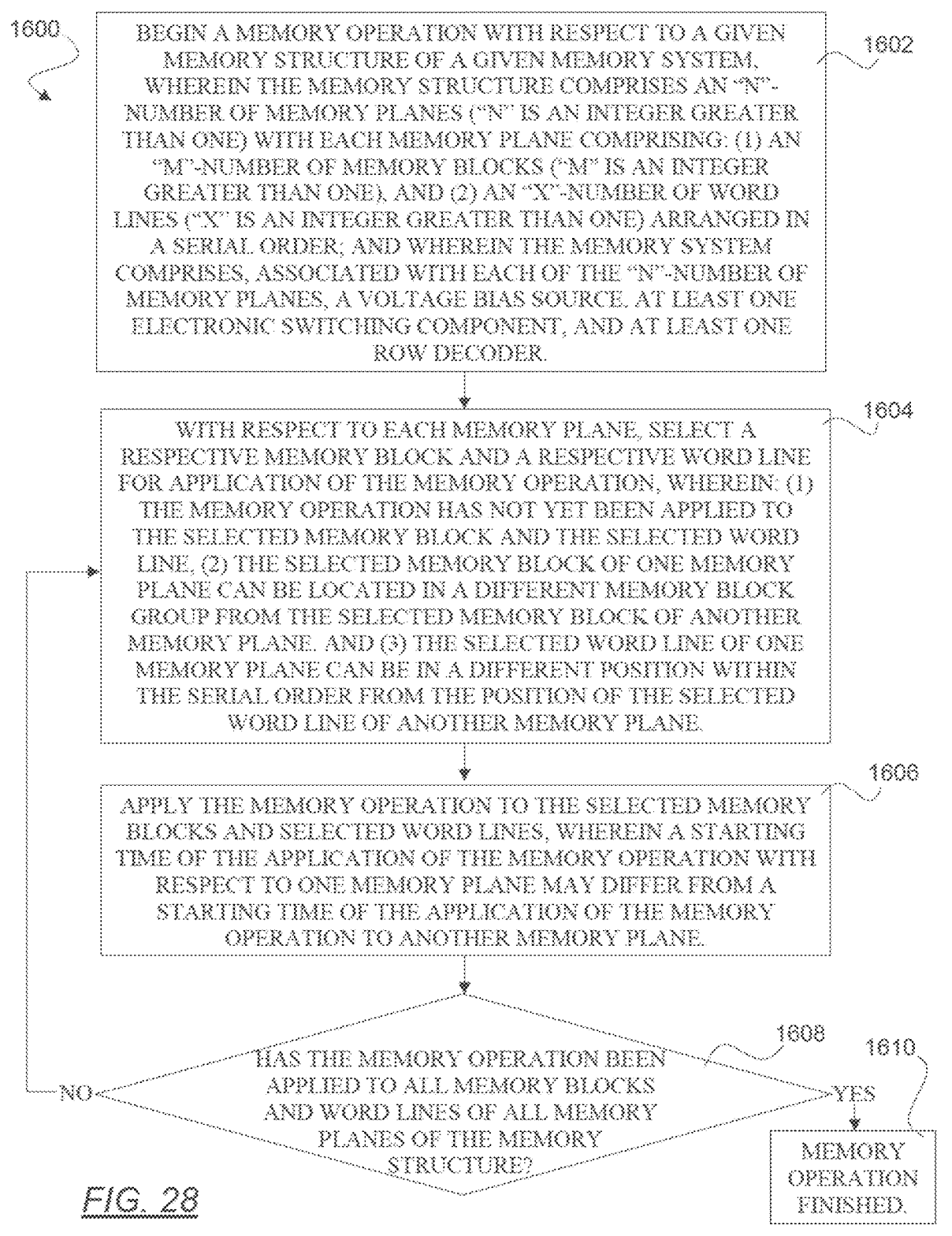

1600

1602
BEGIN A MEMORY OPERATION WITH RESPECT TO A GIVEN MEMORY STRUCTURE OF A GIVEN MEMORY SYSTEM, WHEREIN THE MEMORY STRUCTURE COMPRISES AN "N"-NUMBER OF MEMORY PLANES ("N" IS AN INTEGER GREATER THAN ONE) WITH EACH MEMORY PLANE COMPRISING: (1) AN "M"-NUMBER OF MEMORY BLOCKS ("M" IS AN INTEGER GREATER THAN ONE), AND (2) AN "X"-NUMBER OF WORD LINES ("X" IS AN INTEGER GREATER THAN ONE) ARRANGED IN A SERIAL ORDER; AND WHEREIN THE MEMORY SYSTEM COMPRISES, ASSOCIATED WITH EACH OF THE "N"-NUMBER OF MEMORY PLANES, A VOLTAGE BIAS SOURCE, AT LEAST ONE ELECTRONIC SWITCHING COMPONENT, AND AT LEAST ONE ROW DECODER.

1604
WITH RESPECT TO EACH MEMORY PLANE, SELECT A RESPECTIVE MEMORY BLOCK AND A RESPECTIVE WORD LINE FOR APPLICATION OF THE MEMORY OPERATION, WHEREIN: (1) THE MEMORY OPERATION HAS NOT YET BEEN APPLIED TO THE SELECTED MEMORY BLOCK AND THE SELECTED WORD LINE, (2) THE SELECTED MEMORY BLOCK OF ONE MEMORY PLANE CAN BE LOCATED IN A DIFFERENT MEMORY BLOCK GROUP FROM THE SELECTED MEMORY BLOCK OF ANOTHER MEMORY PLANE, AND (3) THE SELECTED WORD LINE OF ONE MEMORY PLANE CAN BE IN A DIFFERENT POSITION WITHIN THE SERIAL ORDER FROM THE POSITION OF THE SELECTED WORD LINE OF ANOTHER MEMORY PLANE.

1606
APPLY THE MEMORY OPERATION TO THE SELECTED MEMORY BLOCKS AND SELECTED WORD LINES, WHEREIN A STARTING TIME OF THE APPLICATION OF THE MEMORY OPERATION WITH RESPECT TO ONE MEMORY PLANE MAY DIFFER FROM A STARTING TIME OF THE APPLICATION OF THE MEMORY OPERATION TO ANOTHER MEMORY PLANE.

1608
HAS THE MEMORY OPERATION BEEN APPLIED TO ALL MEMORY BLOCKS AND WORD LINES OF ALL MEMORY PLANES OF THE MEMORY STRUCTURE?

NO

YES

1610
MEMORY OPERATION FINISHED.

FIG. 28

SYSTEMS AND METHODS FOR PERFORMING INDEPENDENT PLANE CONCURRENT MEMORY OPERATIONS IN NON-VOLATILE MEMORY STRUCTURES

CROSS-REFERENCE TO RELATED APPLICATIONS

This application claims the benefit of U.S. Provisional Application No. 63/449,173, filed on Mar. 1, 2023. The entire disclosure of the application referenced above is incorporated herein by reference.

TECHNICAL FIELD

This disclosure relates to non-volatile memory storage systems in solid-state drives or other devices, including but not limited to flash drives or embedded/removable flash packages. More specifically, this disclosure relates to systems and methods for programming non-volatile memory structures.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices.

With respect to some flash memory types, each individual memory cell comprises a floating gate that is positioned above and isolated from a channel region of a semiconductor substrate, wherein the floating gate is positioned between the source and drain regions. Also, a control gate is provided over and isolated from the floating gate. Accordingly, the threshold voltage ($V_{th}$) of the resulting transistor is controlled by and dependent on the amount of charge retained on the floating gate. Specifically, in a switch-like manner, the minimum amount of voltage that must be applied to the control gate before the transistor is activated to permit conduction between its source and drain is determined by the level of charge retained on the floating gate. As a result, bit-value data can be programmed onto and erased from the memory cell by changing the level of charge on a floating gate in order to change the threshold voltage characteristic of the transistor.

As explained in detail below, the number of bits that can be stored in an individual memory cell is dependent upon the number of distinct voltage ranges that may be partitioned within the threshold voltage window of that memory cell. For example, to store one bit of data (referred to as a binary data), the possible threshold voltages ($V_{th}$) of the memory cell are divided into two ranges, wherein the ranges are assigned as logical data “1” and “0” respectively. A memory cell of this type of storage density may be referred to as a “single-level cell” or SLC.

By further partitioning the threshold voltage window of a memory cell into additional distinct voltage ranges, multiple levels of information may be stored. Such a memory cell may be referred to as a “multi-state cell.” For example, to store two bits of data, the threshold voltage window of a cell may be partitioned into four distinct voltage ranges (or states), wherein each range is assigned a certain bit value equal to, for example, “11,” “10,” “01,” and “00.” Accordingly, after an erase operation, the threshold voltage is negative and, therefore, may be defined as logic “11.” Therefore, the positive threshold voltages may be used for the states of “10,” “01, “00.” A memory cell of this storage density may be referred to as, for example, a “multi-level cell” or MLC. In another example, to store three bits of data, the voltage threshold window of a cell may be partitioned into eight distinct voltage ranges (or states), wherein each range is assigned a certain bit value that is equal to, for example, “111,” “110,” “100,” “010,” “011,” “000,” “001,” and “101.” A memory cell of this storage density may be referred to, for example, as a “tri-level” or “triple-level cell” (TLC). In a further example, to store four bits of data, the voltage threshold window of a cell may be partitioned into 16 distinct voltage ranges (or states), wherein each range is assigned a certain bit value that is equal to, for example, “1111,” “1110,” “1100,” “1000,” “0111,” “0011,” “0001,” “0000,” “0001,” “1001,” “1101,” “1011,” “0110,” “0100,” “0101,” and “1010.” A memory cell of this storage density may be referred to, for example, as a “quad-level cell” (QLC).

In addition to the increasing storage densities with respect to a single memory cell, advances in non-volatile memory array structures have led to memory cells being stacked in a vertical direction with respect to a semiconductor substrate, thereby creating a three-dimensional array structure as opposed to a planar two-dimensional array structure.

The specific relationship between the data that is programmed into a memory cell and the threshold voltage levels of the memory cell depends upon the specific data encoding scheme that is adopted for the memory cells.

Therefore, a memory device that comprises multi-state data (by incorporating, for example, MLC-type and/or TLC-type cells, and/or QLC-type cells) has an increased storage capacity using, for example, the same MOSFET structure and wafer size as a SLC-type cell, thereby beneficially providing a comparative cost per bit savings in such memory devices. However, as a consequence of the increased density and tightened tolerances between the partitioned voltage ranges of multi-level memory structures, programming memory operations occur at a relatively slower speed in comparison to single-level (SLC) memory structures as a result of the data being programmed to multiple target threshold voltage ($V_{th}$) ranges and also requires a higher level of precision during programming. Therefore, it would be beneficial to derive and identify technologies and methodologies that effectively increase or improve the programming efficiency and speed in higher density memory structures, thereby boosting the performance parameters of the memory devices.

As described below, flash memory structure(s) (e.g., memory cells, memory holes, or elements) may be arranged and addressed as units within a given memory die. For example, memory cells may be arranged in one or more memory blocks. Further, these memory block(s) may, in turn, may be arranged in one or more planes. Accordingly, in order to increase, for example, the speed and the effectiveness of a programming operation of such a memory die, it would be beneficial to be able to synchronously and/or asynchronously program multiple units (e.g., memory planes) of a memory structure concurrently.

Additionally, a memory die may be comprised of a hybrid of memory structure types. For example, in a given memory die, one or more memory blocks thereof may consist of SLC-type memory cells, whilst one or more of the other memory blocks of the same die may instead consist of TLC-type, or QLC-type, memory cells. Further, as previously described, it may be possible to program a memory cell to a variety of memory structure types and will depend upon the specific encoding scheme that is implemented during a given programming operation. Accordingly, to improve upon the performance of such a memory device, it would also be advantageous to have the ability to concurrently (either synchronously or asynchronously) program a mixture or hybrid of multiple memory structure types during a single programming operation.

SUMMARY

As described in detail below, various embodiments include a method for performing a memory operation with respect to a memory structure. Specifically, the method comprises initiating a memory operation with respect to a memory system, wherein: the memory system comprises a non-volatile memory structure having an "N"-number of memory planes, with each memory plane comprising: (1) an "M"-number of memory blocks, and (2) an "X"-number of word lines that are arranged in a serial order; and electrically connected with each memory plane are: (1) a voltage bias source, (2) at least one electronic switching component, and (3) at least one row decoder. Furthermore, the method comprises, with respect to each memory plane, selecting a respective memory block and a respective word line for application of the memory operation, wherein: (1) the memory operation has not (yet) been applied to the selected memory block and the selected word line, (2) the selected memory block of one memory plane can be located in a different memory block group from the selected memory block of another memory plane, and (3) the selected word line of one memory plane can be in a different position within the serial order from a position of the selected word line of another memory plane. Additionally, the method comprises, using the voltage bias source, concurrently applying the memory operation to the respective selected memory blocks and the respective selected word lines. Further, according to certain embodiments, the voltage bias source comprises a single global voltage bias source that universally applies a pre-determined voltage bias to all memory planes during application of the memory operation. Alternatively, according to certain embodiments, the voltage bias source comprises multiple voltage bias sources, wherein each voltage bias source is associated with a specific one of the memory planes and, as such, a starting time of the application of the memory operation with respect to one memory plane may differ from a starting time of the application of the memory operation to another memory plane. In addition, according to certain embodiments, (1) "N" is an integer greater than one, (2) "M" is an integer greater than one, and (3) "X" is an integer greater than one. Further, according to certain embodiments, the memory structure comprises a plurality of NAND-type memory cells, and: (1) at least one of the memory blocks comprises a population of "single level" or SLC-type memory cells, and (2) at least one of the other memory blocks comprises a population of memory cells that have a higher storage density than an SLC-type memory cell. Also, according to certain embodiments, a memory block group comprises all memory blocks within a same memory array row.

Other embodiments include a memory controller comprising: (a) a communication pathway that is configured to couple to a memory system, wherein: (1) the memory system comprises a non-volatile memory structure having an "N"-number of memory planes, with each memory plane comprising: (i) an "M"-number of memory blocks, and (ii) an "X"-number of word lines arranged in a serial order; and (2) electrically connected with each memory plane are: (i) a voltage bias source, (ii) at least one electronic switching component, and (iii) at least one row decoder; and (b) the memory controller is configured to: (1) initiate a memory operation with respect to the memory system, then (2) with respect to each memory plane, select a respective memory block and a respective word line for application of the memory operation, and wherein: (i) the memory operation has not (yet) been applied to the selected memory block and selected word line, (ii) the selected memory block of one memory plane can be located in a different memory block group from the selected memory block of another memory plane, and (iii) the selected word line of one memory plane can be located in a different position within the serial order from a position in which there is located the selected word line of another memory plane; and (3) using the voltage bias source, concurrently apply the memory operation to the respective selected memory blocks and to the respective selected word lines. Further, according to certain embodiments, the voltage bias source is comprised of a single global voltage bias source that universally applies a pre-determined voltage bias to all memory planes during application of the memory operation. Alternatively, according to certain embodiments, the voltage bias source comprises multiple voltage bias sources, wherein each voltage bias source is associated with a specific one of the memory planes and, thus, a starting time of the application of the memory operation with respect to one memory plane may differ from a starting time of the application of the memory operation to another memory plane. In addition, according to certain embodiments, (1) "N" is an integer greater than one, (2) "M" is an integer greater than one, and (3) "X" is an integer greater than one. Further, according to certain embodiments, the memory structure comprises a plurality of NAND-type memory cells, and: (1) at least one of the memory blocks comprises a population of "single level" or SLC-type memory cells, and (2) at least one of the other memory blocks comprises a population of memory cells that have a higher storage density than an SLC-type memory cell. Also, according to certain embodiments, a memory block group comprises all memory blocks within a same memory array row.

Additional embodiments include a non-volatile memory system that comprises: (a) a memory structure having an "N"-number of memory planes, wherein each memory plane comprises: (1) an "M"-number of memory blocks, and (2) an "X"-number of word lines that are arranged in a serial order; (b) electrically connected with each memory plane: (1) a voltage bias source, (2) at least one electronic switching component, and (3) at least one row decoder; and (c) a memory controller coupled to the memory structure and: (1) initiating a memory operation with respect to the memory system, (2) with respect to each memory plane, selecting a respective memory block and a respective word line for application of the memory operation, and wherein: (i) the memory operation has not (yet) been applied to the selected memory block and selected word line, (ii) the selected memory block of one memory plane can be located in a different memory block group from the selected memory block of another memory plane, and (iii) the selected word line of one memory plane can be located in a different position within the serial order from a position in which there is located the selected word line of another memory plane; and then (3) using the voltage bias source, concurrently applying the memory operation to the respective selected memory blocks and to the respective selected word lines. Further, according to certain embodiments, the voltage bias source is comprised of a single global voltage bias source that universally applies a pre-determined voltage bias to all memory planes during application of the memory operation. Alternatively, according to certain embodiments, the voltage bias source comprises multiple voltage bias sources, wherein each voltage bias source is associated with a specific one of the memory planes and, thus, a starting time of the application of the memory operation with respect to one memory plane may differ from a starting time of the application of the memory operation to another memory plane. Additionally, according to certain embodiments, the memory structure comprises a plurality of NAND-type memory cells, and: (1) at least one of the memory blocks comprises a population of "single level" or SLC-type memory cells, and (2) at least one of the other memory blocks comprises a population of memory cells that have a higher storage density than an SLC-type memory cell. Further, according to certain embodiments, a memory block group comprises all memory blocks within a same memory array row.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIG. 28 is a flow diagram generally illustrating the several steps of an "independent-plane" memory operation approach, in accordance with another exemplary embodiment.

DETAILED DESCRIPTION

Figure 1:
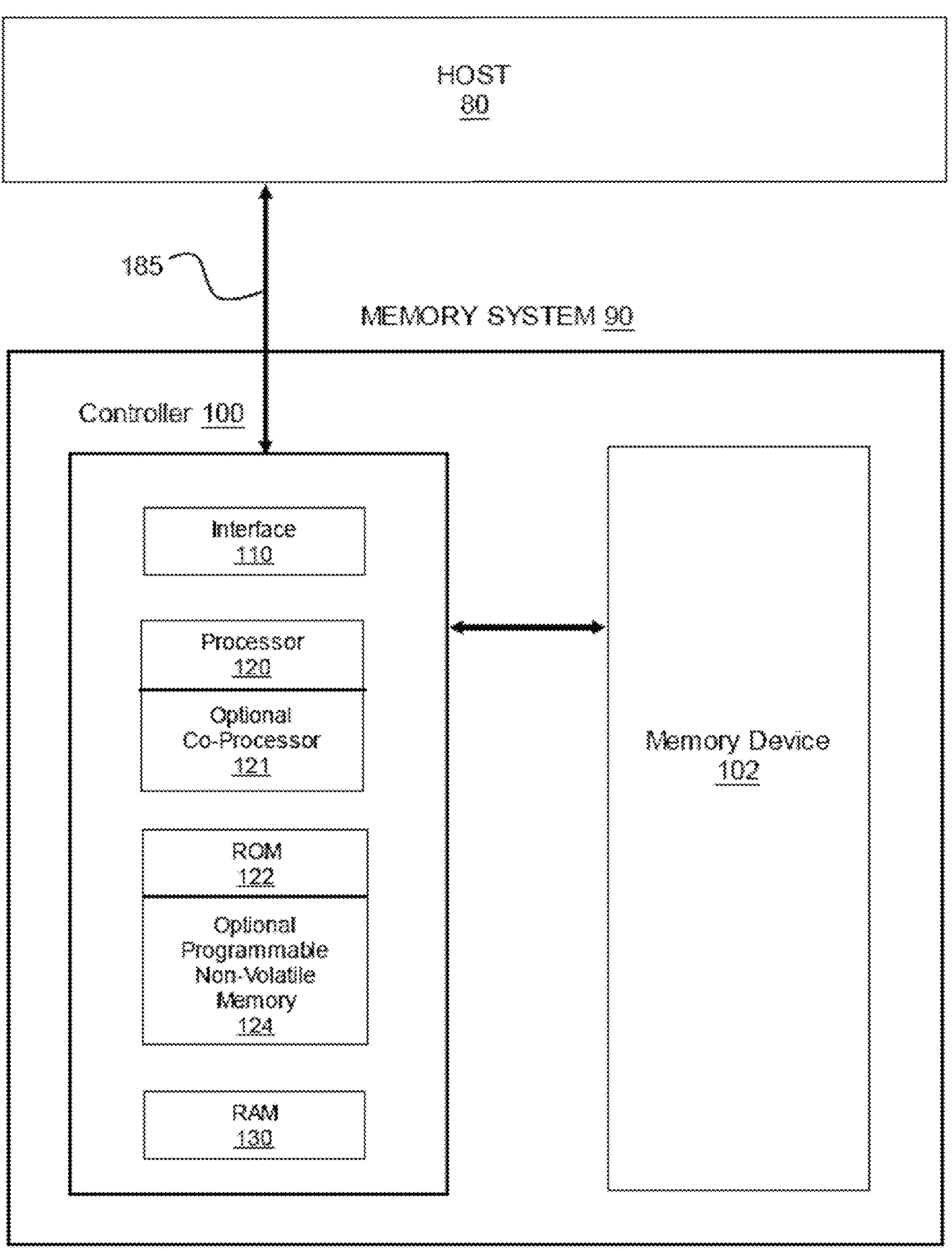
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Thus, methods and means for these functions are described herein. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as used herein, refer to a sequence of instructions designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions designed for execution on a computer system.

Additionally, the terms "couple," "coupled," or "couples," where used herein, are intended to mean either a direct or an indirect connection. Thus, if a first device couples, or is coupled to, a second device, that connection may be by way of a direct connection or through an indirect connection via other devices (or components) and connections.

Regarding the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

Various elements of the present disclosure are described below with reference to schematic flowchart diagrams and/or schematic block diagrams depicting methods, apparatuses, systems, and computer program processes according to exemplary embodiments of the present disclosure, wherein each block, or combinations of blocks, of the schematic flowchart and/or schematic block diagrams, can be implemented by specifically written computer program instructions. As is understood in the art, the computer program instructions are executed by a designated processor of a computer or other programmable data processing apparatus, thereby creating the mechanisms for implementing the functions, acts, and/or operations specifically set forth in the one or more blocks of the schematic flowchart and/or schematic block diagrams. Further, it is noted that, in certain alternative process implementations, the functions specified in a block may occur out of the precise order depicted in the schematic flowchart and/or block diagrams. For example, two blocks depicted in the diagram as occurring in succession may, in fact, be executed substantially at the same time (i.e., concurrently), or even executed in a reverse order, depending upon the functionality involved. In addition, other process steps and methods that are equivalent in function, logic, or effect to one or more blocks, or portions thereof, of the diagrams may be conceived and are contemplated as being within the scope of the present disclosure. Furthermore, although the schematic diagrams may depict various arrow types and directions and line types as a matter of illustration, they are not intended to limit the scope of corresponding embodiments. For instance, an arrow may represent or signify a waiting or monitoring period of unspecified duration between enumerated steps of the depicted exemplary embodiment.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, programmable non-volatile memory 124, and additional components. The controller 100 may, for example, be in the form of one or more application-specific integrated circuits (ASIC) in which the components included in such an ASIC generally depend on the particular application.

Figure 2:
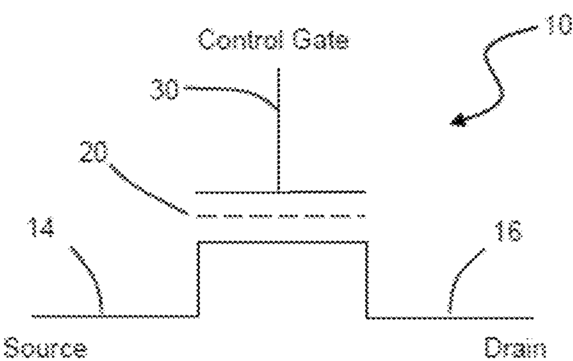
FIG. 2 is a schematic depiction of a non-volatile memory cell, in accordance with exemplary embodiments.

With respect to the memory device 102 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of the bit line.

Figure 3:
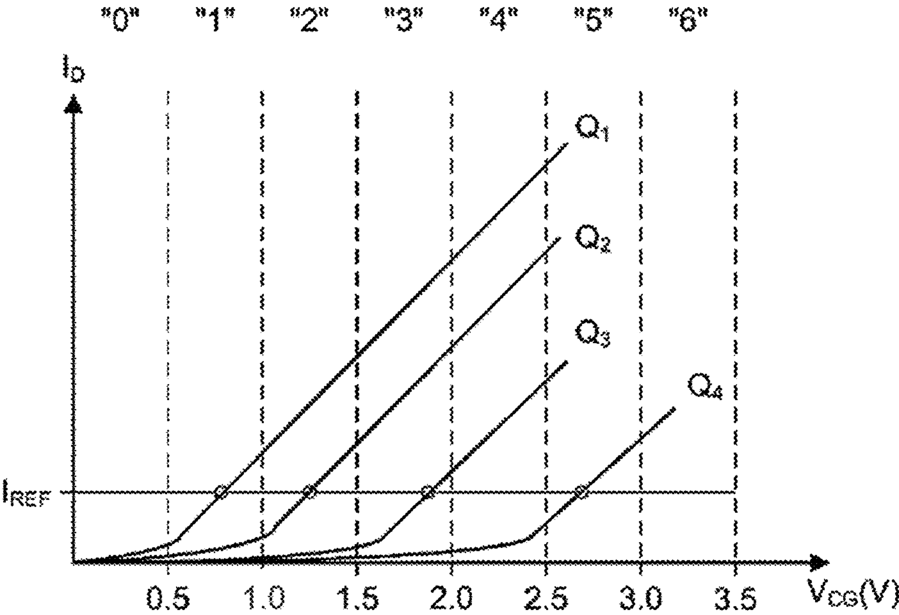
FIG. 3 depicts the relationship between a source-drain current ID and a control gate voltage $V_{CG}$ for four different charges Q1-Q4 that a floating gate of a non-volatile memory cell may be selectively storing at any one time and at a fixed drain voltage, in accordance with exemplary embodiments.

FIG. 3 provides a graphical illustration of the correlation between the source-drain current ID and control gate voltage $V_{CG}$ for, for example, a non-volatile memory cell 10 having four different charge states Q1-Q4 that the floating gate may be selectively storing at any given time. As shown, with a fixed drain voltage bias, there exists four solid ID versus $V_{CG}$ curves representing four charge levels that can be programmed on a floating gate of the memory cell, wherein the four charge levels respectively correspond to four of eight possible memory states. Therefore, as an example, the threshold voltage window of a population of memory cells may range from 0.5 V to 3.5 V. In such an example, seven programmed memory states assigned as "0," "1," "2," "3," "4," "5," "6," respectively, and one erased state (which is not shown in FIG. 3), may be demarcated by partitioning the threshold window into regions at intervals of 0.5 V each. Accordingly, if a reference current, $I_{REF}$, of 2 μA is used as shown, then a cell programmed with Q1 voltage may be considered to be in a memory state "1" as its curve intersects with $I_{REF}$ in the region of the threshold window that is demarcated by the voltage range $V_{CG}$=0.5 V and 1.0 V. Similarly, Q4 is in a memory state "5."

Thus, as mentioned above, the more states that a memory cell 10 is made to store, the more finely divided is its threshold voltage window. For example, in a memory cell 10 that has a threshold voltage window ranging from −1.5 V to 5 V, thereby providing a possible maximum width of 6.5 V, and is to store 16 memory states, each state may only occupy a voltage range of from 200 mV to 300 mV. Such a narrow voltage range will require higher precision in programming and reading operations in order to achieve the required resolution.

Figure 4A:
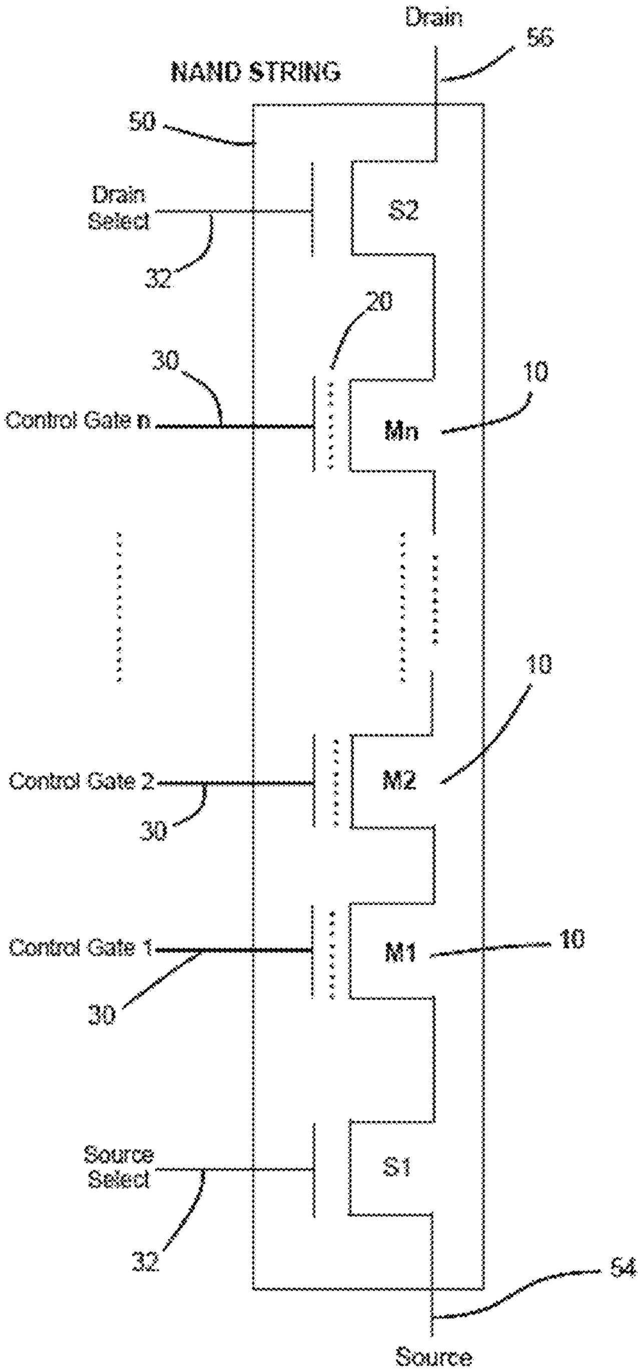
FIG. 4A schematically depicts a series of NAND-type memory cells that are organized into a string, in accordance with exemplary embodiments.

Individual memory cells 10 are organized into strings in which the memory cells are placed in series. For example, depicted in FIG. 4A is an exemplary embodiment of a string 50 comprising NAND-type memory cells in which the series of the cells' respective transistor elements M1, M2, . . . , Mn (wherein "n" may equal 4, 8, 16 or higher) are daisy-chained with respect to their sources and drains. Further, as discussed with respect to FIG. 3, each memory transistor 10 in the string 50 has a charge storage element 20 (e.g., a floating gate) for storing a certain amount of charge so as to represent an intended memory state of that cell. And, as explained in greater detail below, each memory transistor 10 comprises a control gate 30 that allows control over the read and write operations. Present at the source terminal 54 and drain terminal 56 of the string 50 are select transistors S1, S2 that control the transistor elements' connection to the outlying memory array. Specifically, when the source select transistor S1 is turned on, the source terminal 54 is coupled to a source line. Likewise, when the drain select transistor S2 is turned on, the drain terminal 56 is coupled to a bit line of the memory array.

Figure 4B:
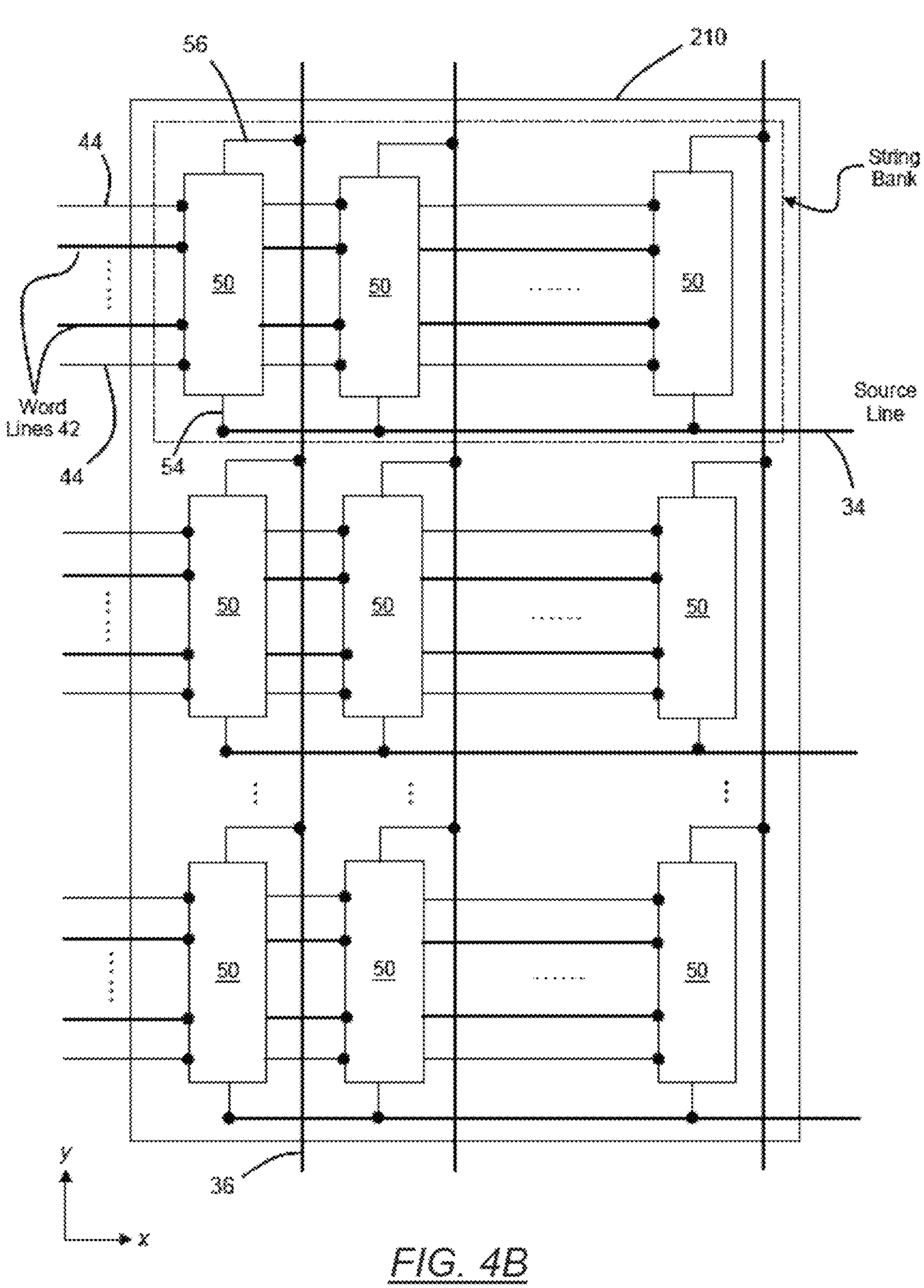
FIG. 4B schematically depicts an array of memory cells, comprising a plurality of NAND-type strings, such as the type depicted in FIG. 4A, in accordance with exemplary embodiments.

Expanding outward a hierarchical level, FIG. 4B is a schematic diagram depicting an exemplary embodiment of a memory array 210 comprised of a plurality of NAND strings 50 of the type illustrated in FIG. 4A. Along each column of NAND strings 50, a bit line 36 is coupled to the drain terminal 56 of each NAND string. In addition, along each bank of NAND strings 50, a source line 34 is coupled to the source terminals 54 of each NAND string. Further, the control gates 30 of the memory transistors 10 in a row of memory cells in the bank of NAND strings 50 are connected to the same word line 42. Accordingly, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, a conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provide control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines 42 and select lines 44 of the bank of NAND strings 50.

Figure 5:
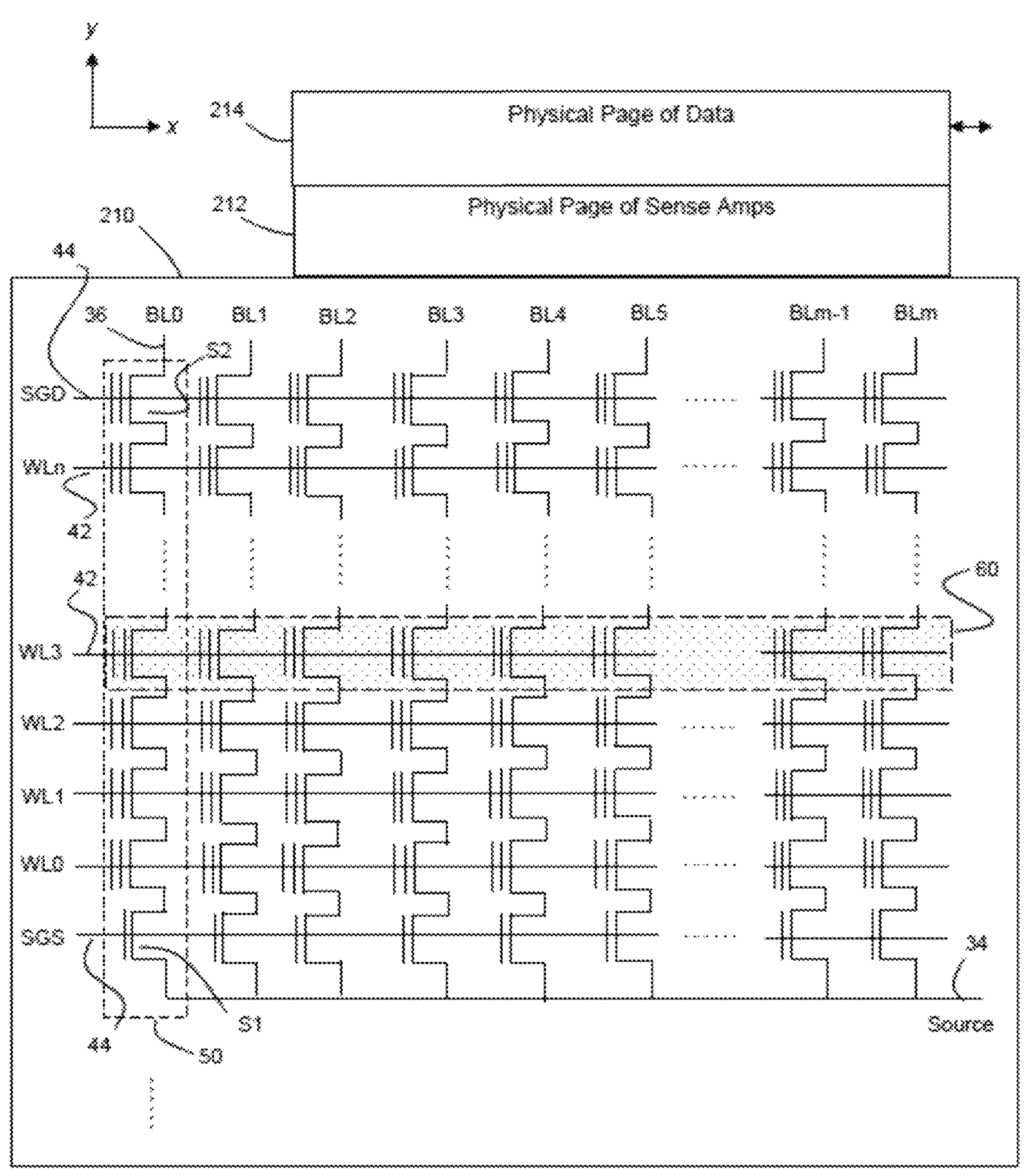
FIG. 5 depicts a page of memory cells being sensed or programmed in parallel, and in relation to a memory array organized in the NAND-type configuration, in accordance with exemplary embodiments.

Turning now to FIG. 5, there is depicted a detailed illustration of one bank of NAND strings 50 of a memory array 210 according to an exemplary embodiment thereof. This view is particularly useful in visualizing a row-by-row configuration of the memory array 210, wherein each row of the array 210 may be referred to as a "page." Accordingly, a physical page (such as page 60 denoted in FIG. 5) is a group of memory cells 10 that is enabled to be sensed or programmed in parallel. In fact, a page is the smallest unit of the memory device that may be programmed or written to. Programming of a page is accomplished by a corresponding page of sense amplifiers 212, wherein each sense amplifier may be coupled to a respective NAND string 50 via a bit line (e.g., see respective bit lines BL0, BL1, BL2, BL3, BL4, BL5, . . . , BLm−1, and BLm illustrated in FIG. 5). Thus, a page 60 is enabled by the control gates of the plurality of memory cells 10 in page 60, which are connected to a common word line 42, and each memory cell 10 of the page 60 is accessible by a sense amplifier via a bit line 36. Therefore, when programming or sensing a page 60 of memory cells 10, a programming or sensing voltage is respectively applied to the common word line (e.g., word line WL3 with respect to the page 60) together with appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page. For example, in a memory device of the SLC-type in which one bit of data is stored in each memory cell 10, one physical page 60 stores one logical page of data. Accordingly, in a memory device of the MLC-type in which two bits of data are stored in each memory cell 10, one physical page 60 can store two logical pages of data. As such, one or more logical pages of data are typically stored in one row (i.e., page 60) of memory cells. A page 60 can store one or more sectors wherein a sector is comprised of both user data and overhead data. In an exemplary embodiment, individual pages 60 may be divided into segments in which each segment contains the fewest number of memory cells 10 that may be written at one time in a basic programming operation.

Figures 6A, 6B, 6C:
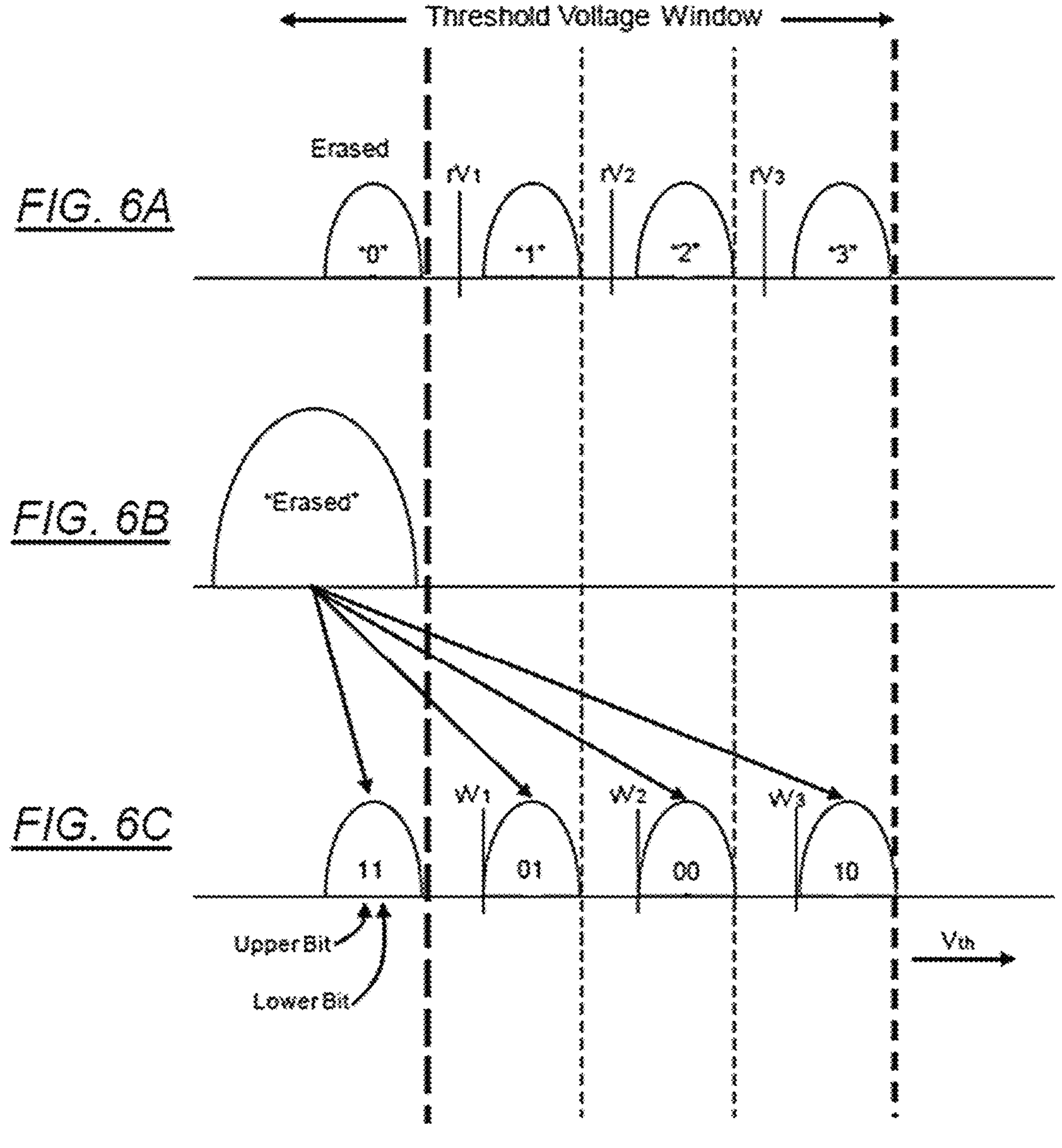
FIGS. 6A-6C depict stages of programming four states of a population of MLC NAND-type memory cells, in accordance with exemplary embodiments.

To illustrate an exemplary embodiment of the programming stages of a MLC-type memory device comprising a population of four-state memory cells, reference is made to FIGS. 6A-6C. In FIG. 6A, there is depicted a population of memory cells in which the characteristic threshold voltage window is divided into four distinct voltage distributions wherein each distribution corresponds to a programmable memory state (i.e., memory states "0," "1," "2," and "3"). FIG. 6B illustrates an initial distribution of "erased" threshold voltages for an erased memory. In FIG. 6C, much of the memory cell population is programmed such that the initial "erased" threshold voltage of a given memory cell 10 is moved to a higher value into one of the three divided voltage zones demarcated by verify levels $vV_1$, $vV_2$, and $vV_3$. Accordingly, each memory cell can be programmed to one of the three programmable states "1," "2," and "3," or remain in the "erased" state. On a bit level, a 2-bit code having a lower bit and an upper bit can be used to represent each of the four memory states. For example, as depicted in FIG. 6C, the memory states "0," "1," "2," and "3" may be assigned bit values "11," "01," "00," and "10" respectively. In such an example, the 2-bit data may be read from the memory by sensing in a "full-sequence" mode where the two bits are sensed together by sensing relative to the corresponding read demarcation threshold voltages $rV_1$, $rV_2$, and $rV_3$ in three sub-passes respectively.

Figures 7A, 7B, 7C:
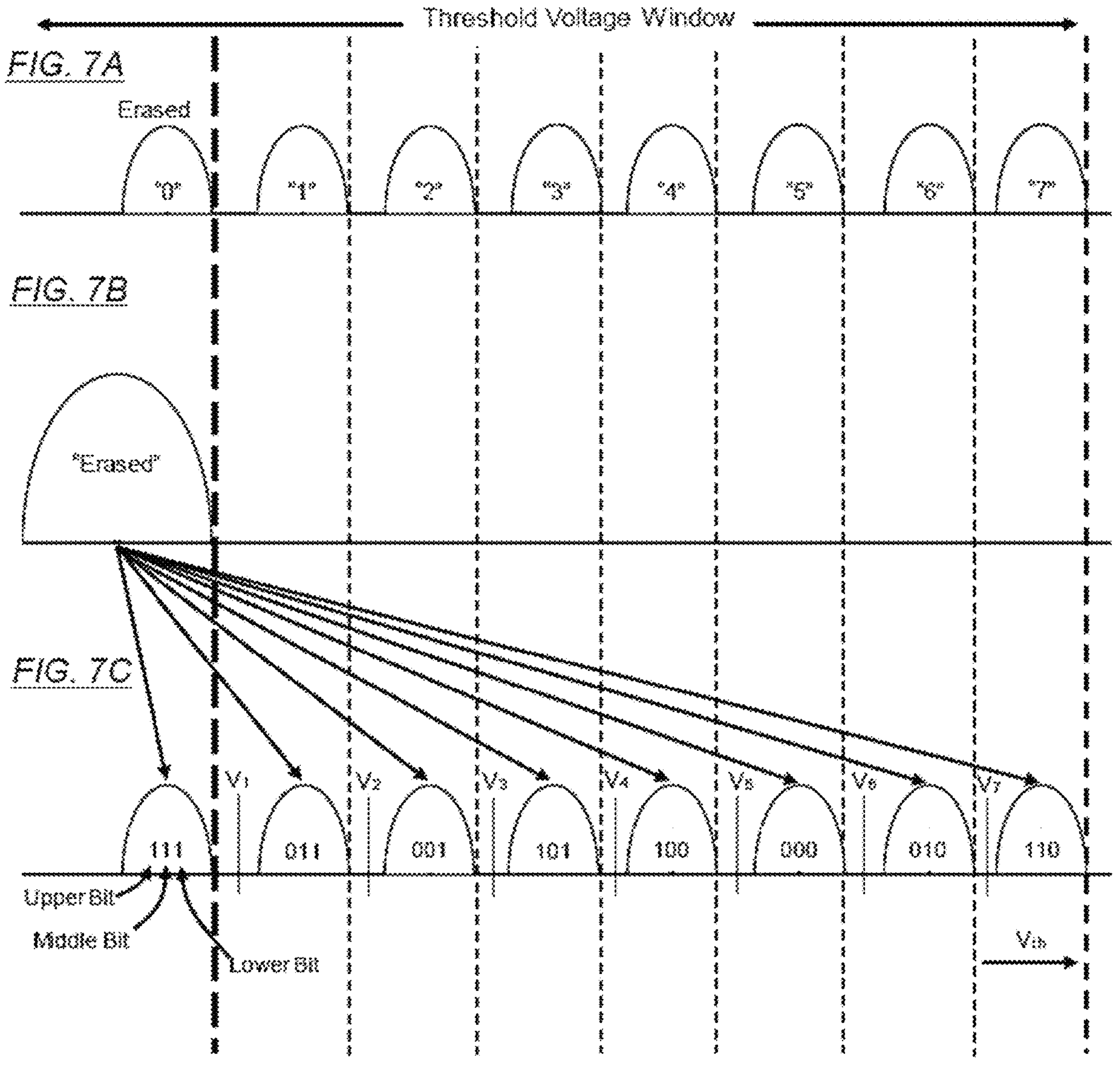
FIGS. 7A-7C depict stages of programming eight states of a population of TLC NAND-type memory cells, in accordance with exemplary embodiments.

Similarly, FIGS. 7A-7C illustrate programming stages of a TLC-type memory device comprising a population of eight-state memory cells, each cell being programmable into eight distinct distributions of threshold voltages that, in accordance with this particular embodiment, represent memory states "0," "1," "2," "3," "4," "5," "6," and "7," respectively (as shown in FIG. 7A). Thus, FIG. 7B depicts an initial distribution of "erased" threshold voltages for an erased memory. Further, FIG. 7C depicts an example of the memory after many of the memory cells have been programmed. As a result, a cell's threshold voltage is moved higher into one of the distinct voltage ranges demarcated by levels $V_1$, $V_2$, $V_3$, $V_4$, $V_5$, $V_6$, and $V_1$. Accordingly, each memory cell can be programmed to one of the seven programmed states "1" through "7," or can remain unprogrammed in the "erased" state. As a consequence of the programming, the initial distribution of the "erased" state as shown in FIG. 7B becomes narrower as indicated by the "0" state in FIG. 7C. In this case, a 3-bit code having lower, middle, and upper bits can be used to represent each of the memory states (i.e., "111," "011," "001," "101," "100," "000," "010," and "110") and the 3-bit data may also be read from the memory by sensing in the "full-sequence" mode where the three bits are sensed together by sensing relative to the demarcation threshold values $V_1$ through $V_7$ in seven sub-passes respectively.

Figures 8A, 8B, 8C:
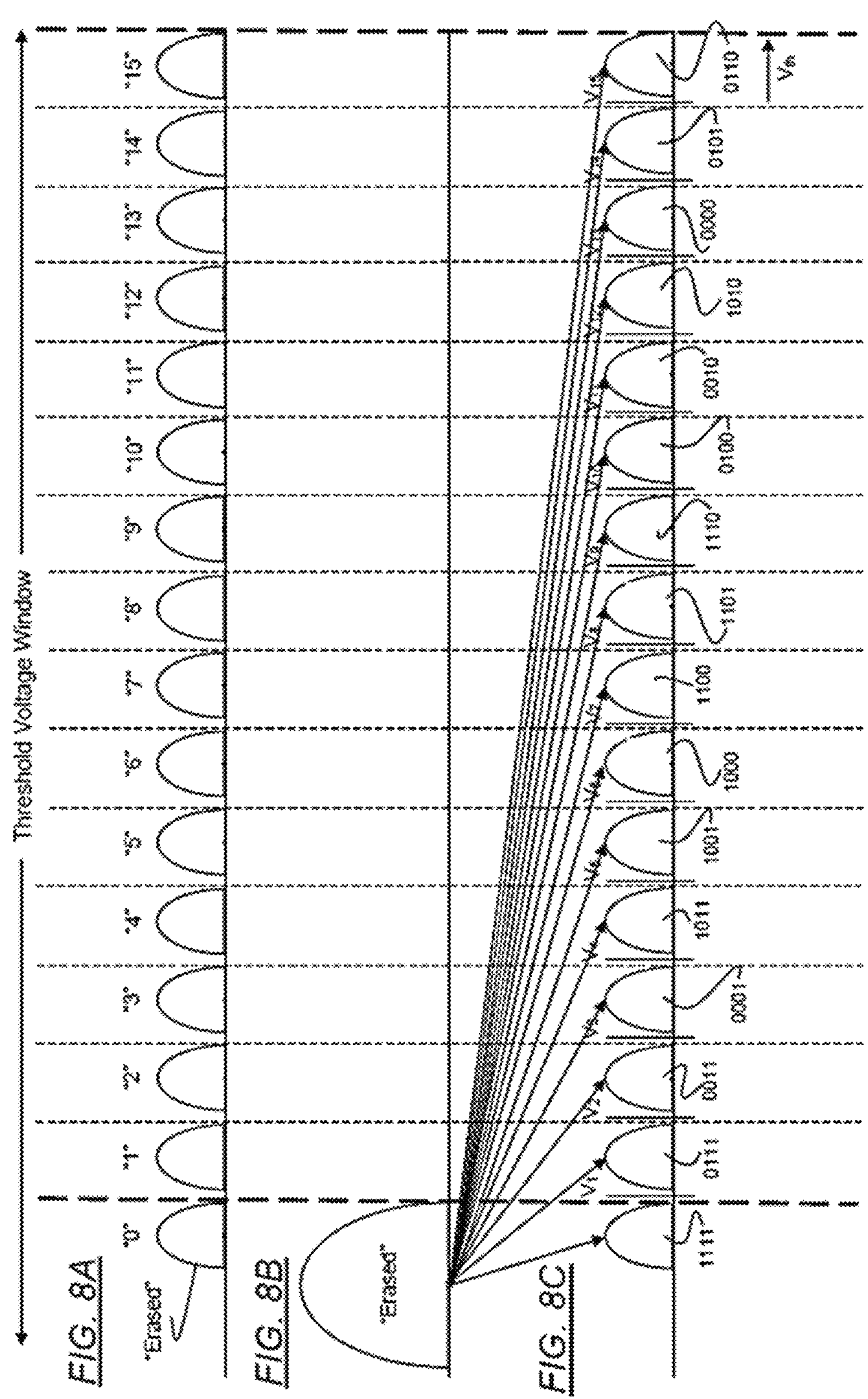
FIGS. 8A-8C depict stages of programming 16 states of a population of QLC NAND-type memory cells, in accordance with exemplary embodiments.

Continuing in a similar manner, FIGS. 8A-8C illustrate the programming stages of a QLC-type memory device comprising a population of 16-state memory cells, each cell being programmable into 16 distinct distributions of threshold voltages that, in accordance with this particular embodiment, represent memory states "0," "1," "2," "3," "4," "5," "6," "7," "8," "9," "10," "11," "12," "13," "14," and "15," respectively (as shown in FIG. 8A). Accordingly, FIG. 8B depicts an initial distribution of "erased" threshold voltages for an erased memory; whereas FIG. 8C depicts an example of the memory after programming. As depicted, a cell's threshold voltage is moved higher into one of the distinct voltage ranges, as demarcated by levels $V_1$, $V_2$, $V_3$, $V_4$, $V_5$, $V_6$, $V_7$, $V_8$, $V_9$, $V_{10}$, $V_{11}$, $V_{12}$, $V_{13}$, $V_{14}$, and Vis. Therefore, each memory cell can be programmed to one of 15 programmed states "1" through "15," or can remain unprogrammed in the "erased" state. Again, as a consequence of the programming, the initial distribution of the "erased" state as shown in FIG. 8B becomes narrower as indicated by the "0" state in FIG. 8C. Thus, according to this particular distribution, a 4-bit code having lower, middle, upper and top bits can be used to represent each of the memory states (i.e., "1111," "1110," "1100," "1101," "0101," "0100," "0000," "0010," "0110," "0111," "0011," "0001," "1001," "1011," "1010," and "1000").

Figure 9:
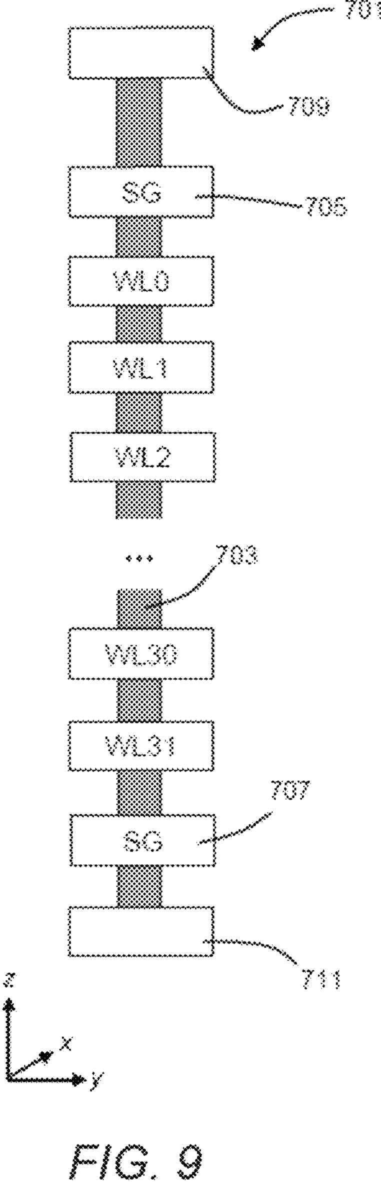
FIG. 9 depicts a vertical NAND-type string in accordance with an exemplary embodiment.

In FIGS. 4A-4B and 5 and the foregoing corresponding discussion, there is generally described a two-dimensional (or planar) memory array 210 (lying in a x-y plane, for example), which may comprise NAND-type memory cells. However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a z direction that is perpendicular to the x-y plane). For example, in FIG. 9 there is depicted an exemplary embodiment of a NAND-type string 701, which is operated in a similar manner as a planar two-dimensional NAND-type string (such as the NAND-type string 50 described above). In this configuration, a memory cell is formed at the juncture of a vertical bit line (see e.g., local bit line 703) and a word line (see e.g., word lines WL0, WL1, etc.), wherein a charge trapping layer located between the local bit line 703 and an intersecting word line stores charge (which dictates the threshold voltage of the transistor formed by the word line—gate—coupled to the vertical bit line—channel—that it encircles). To form such a vertical string 701, stacks of word lines are formed and memory holes are etched at the appropriate locations where cells are to be formed, wherein each memory hole is lined with a charge trapping layer and filled with a suitable local bit line/channel material. Dielectric layers are included for the necessary isolation. Further, located at either end of the NAND-type string 701 are select gates 705, 707, which allow for the selective connection to, or isolation from, external elements 709, 711 that include, for example, conductive lines such as common source lines or bit lines that serve large numbers of strings 701 of an array. In the particular embodiment shown in FIG. 9, the vertical NAND-type string 701 has 32 memory cells (i.e., at the juncture between local bit line 703 and word lines 0 through 31) connected in series. However, a NAND-type string 701 may comprise any suitable number of memory cells.

As described above, memory cells of the memory structure 200 may be arranged in a single memory device level in an ordered two-dimensional array of a plurality of rows and/or columns. Alternatively, a three-dimensional memory array may be arranged such that memory cells occupy multiple planes or multiple memory device levels, thereby forming a structure that has three dimensions (e.g., in the x, y, and z directions, wherein the z direction is substantially perpendicular and the x and y directions are substantially parallel to the major surface of the semiconductor substrate). In some exemplary embodiments, a three-dimensional memory structure 200 may be vertically arranged as a stack of multiple two-dimensional memory array device levels. In other exemplary embodiments, the three-dimensional memory structure 200 is arranged as multiple vertical columns (wherein each column extends substantially perpendicular to the major surface of the substrate, i.e., in the z direction) with each column having multiple memory cells. In this example, the vertical columns may be arranged in a two-dimensional configuration (i.e., in the x-y plane), thereby forming a three-dimensional arrangement in which the memory cells are on multiple vertically stacked memory planes. Other configurations of memory elements in three dimensions can also constitute a three-dimensional memory array. However, generally speaking, a three-dimensional NAND array may be constructed by tilting a two-dimensional memory structure, such as structures 50 and 210 of FIGS. 4A-B and 5, respectively, in the vertical direction that is perpendicular to the x-y plane (i.e., the z direction), such that each y-z plane of the three-dimensional structure corresponds to the page structure of FIG. 5, wherein each plane is at differing locations along the x axis. As a result, the global bit lines (e.g., BL0, . . . , BLm, of FIG. 5) each run across the top of the memory structure to an associated sense amplifier (e.g., SA0, . . . , SAm). Accordingly, the word lines (e.g., WL0, . . . , WLn, of FIG. 5), and the source and select lines (e.g., SSL0, . . . , SSLn, and DSL0, . . . , DSLn, respectively) extend in the x direction, with the bottom of each NAND string (e.g., string 50) connected to a common source line.

Figure 10:
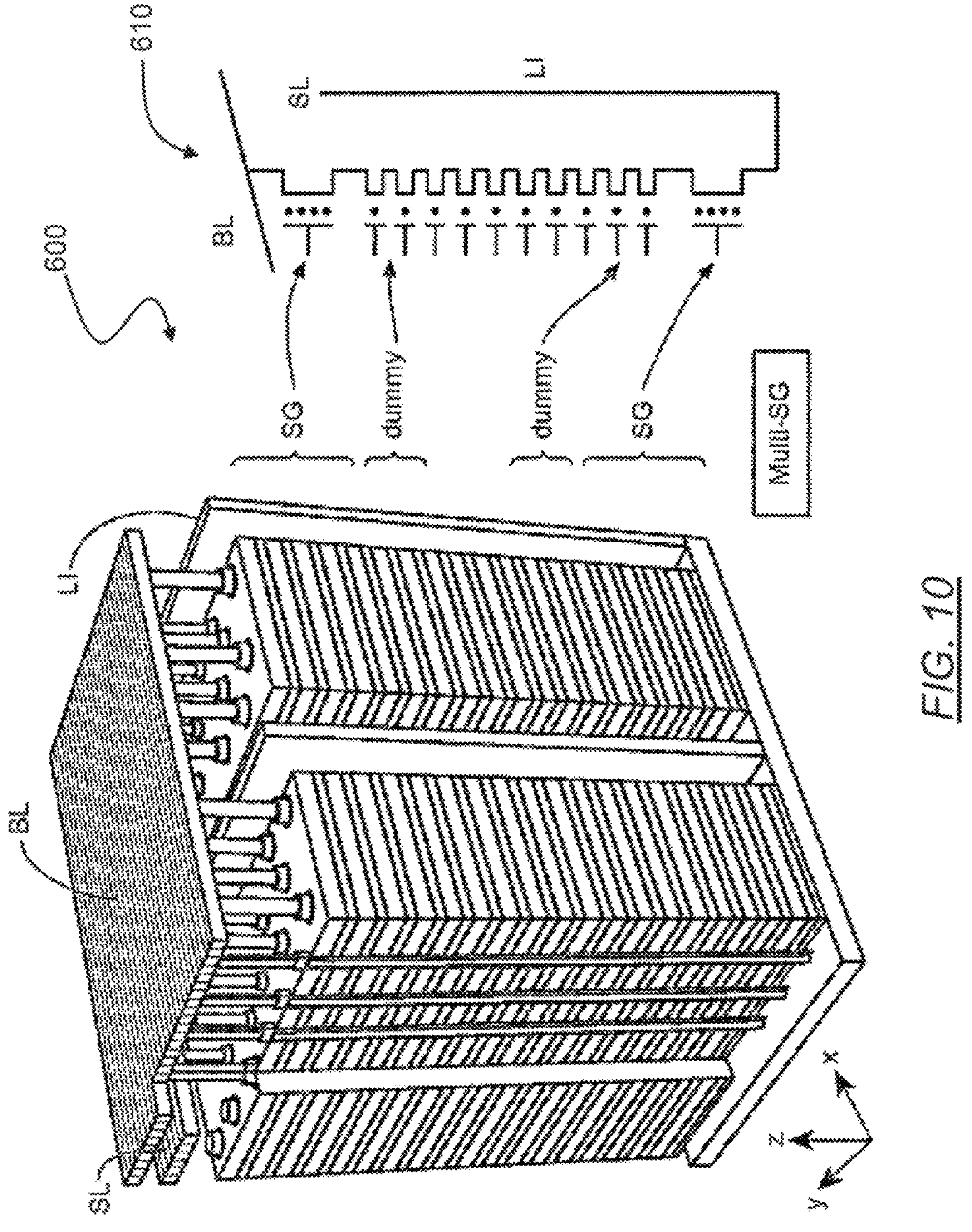
FIG. 10 is a perspective view of a representative subsection of a monolithic three-dimensional NAND-type memory array, in accordance with exemplary embodiments.

Referring now to FIG. 10, there is depicted an oblique perspective view of an example subsection of an embodiment of a three-dimensional NAND memory array 600 of the Bit Cost Scalable ("BiCS") type in which one or more memory device levels is formed above a single substrate. The example subsection corresponds to two of the page structures shown in FIG. 4B wherein, depending upon the particular embodiment, each may correspond to a separate memory block or may be different extensions of the same block. According to this embodiment, rather than lying in the same y-z plane, the NAND strings are pressed in the y-direction such that the NAND strings have a staggered configuration in the x-direction. Further, at the top of the array 600, the NAND strings are connected along global bit lines (BL) that span multiple of these subsections of the array 600 that run in the x-direction. In addition, global common source lines (SL) also run across multiple subsections of the memory array 600 in the x-direction and are connected to the sources at the bottom of the NAND strings by a local interconnect (LI) that operates as the local common source line of the individual extension. However, dependent upon the embodiment, the global source lines (SL) can span the whole, or just a subsection, of the memory array 600. Depicted on the right side of FIG. 10 is a schematic representation of the fundamental elements of one of the vertical NAND strings 610 of the memory array 600. Similar to the NAND string 50 of FIG. 4A, the string 610 is comprised of a series of interconnected memory cells. The string 610 is connected to an associated bit line (BL) through a drain select gate (SGD). A source select gate (SDS) connects the string 610 to a global source line (SL) through an associated local source line (LI). Further included in this particular embodiment are several dummy cells located at the ends of the string 610. Due to their proximity to select gates (SGD, SDS) and, thereby, their susceptibility to disturbs, the dummy cells are not used to store user data.

Figure 11:
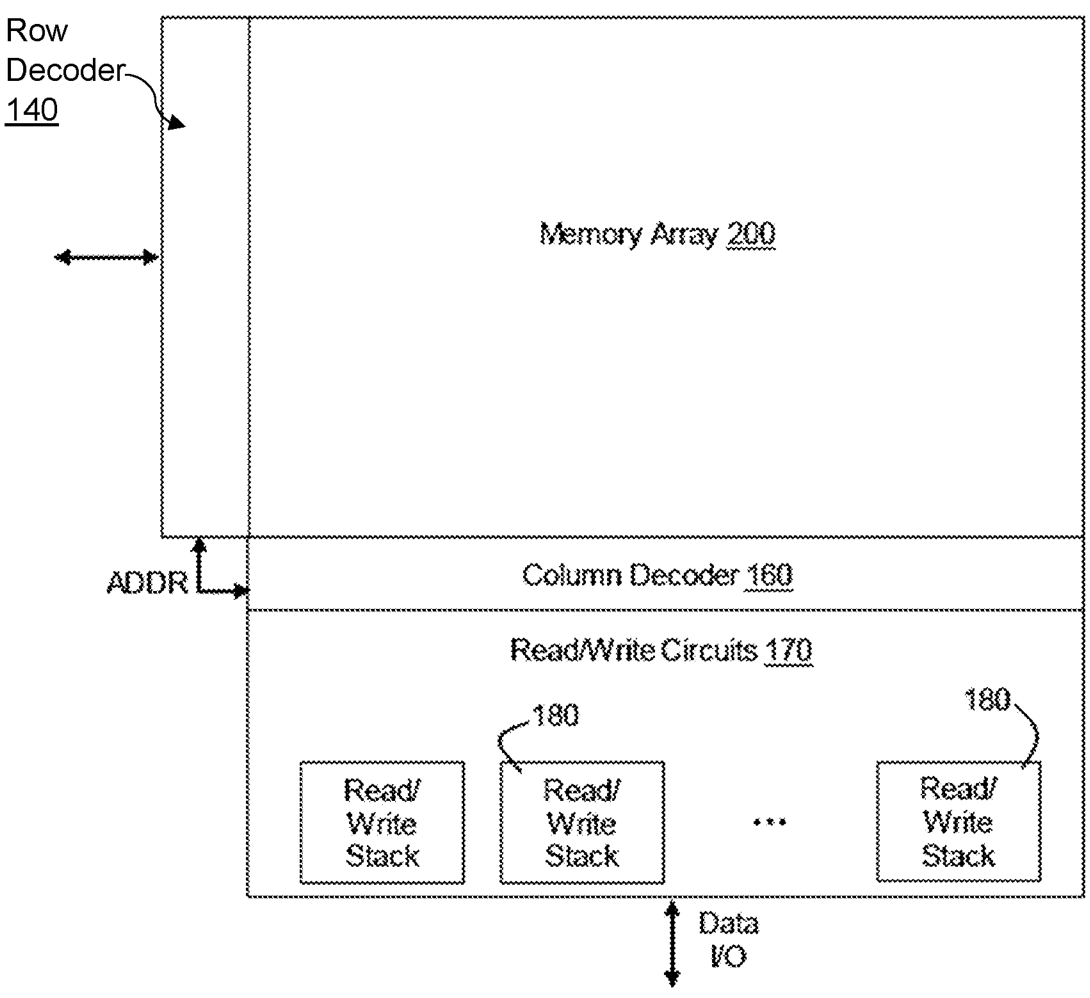
FIG. 11 schematically depicts a configuration of a non-volatile memory array that is accessible by read/write circuits via row and column decoders, in accordance with exemplary embodiments.
Figure 12:
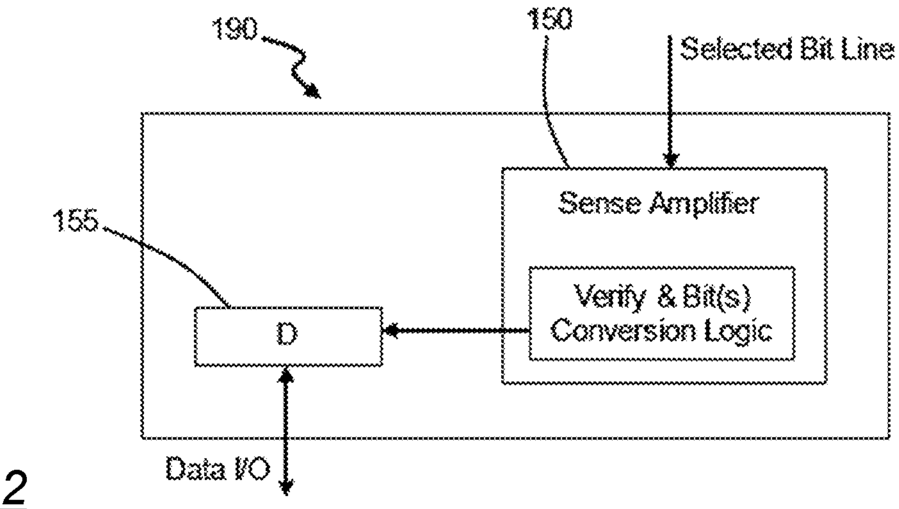
FIG. 12 is a block diagram of an individual read/write module, in accordance with an exemplary embodiment.

Referring back to the overall architecture of a memory system that is, for example, depicted in FIG. 1, a schematic depiction of a typical arrangement of a memory array of such a system is illustrated in FIG. 11. In this exemplary embodiment, there is shown a non-volatile memory array 200 that is accessible by read/write circuits 170 by way of row decoder 140 and column decoder 160. As previously described above, individual memory cells of the memory array 200 are addressable via a set of selected word line(s) and bit line(s). Accordingly, the row decoder 140 selects one or more word lines and the column decoder 160 selects one or more bit lines in order to apply the appropriate voltages to the respective gates of the addressed memory cells. Further, read/write circuits 170 are provided to read or write the memory states of the addressed memory cells, wherein the read/write circuits 170 comprise a number of read/write modules connectable via bit lines to the memory elements of the array 200. A schematic block diagram of such a read/write module 190 is provided in FIG. 12, according to an exemplary embodiment thereof. In operation, during a read or verify step, a sense amplifier 150 determines the current that is flowing through the drain of an addressed memory cell that is connected via a selected bit line. The level detected by the sense amplifier 150 is converted by a level-to-bits conversion logic to a set of data bits to be stored in a data latch 155. Now referring back to FIG. 11, the read/write circuits 170 are organized into banks of read/write stacks 180 wherein each read/write stack 180 is a stack of read/write modules 190.

Figure 13A:
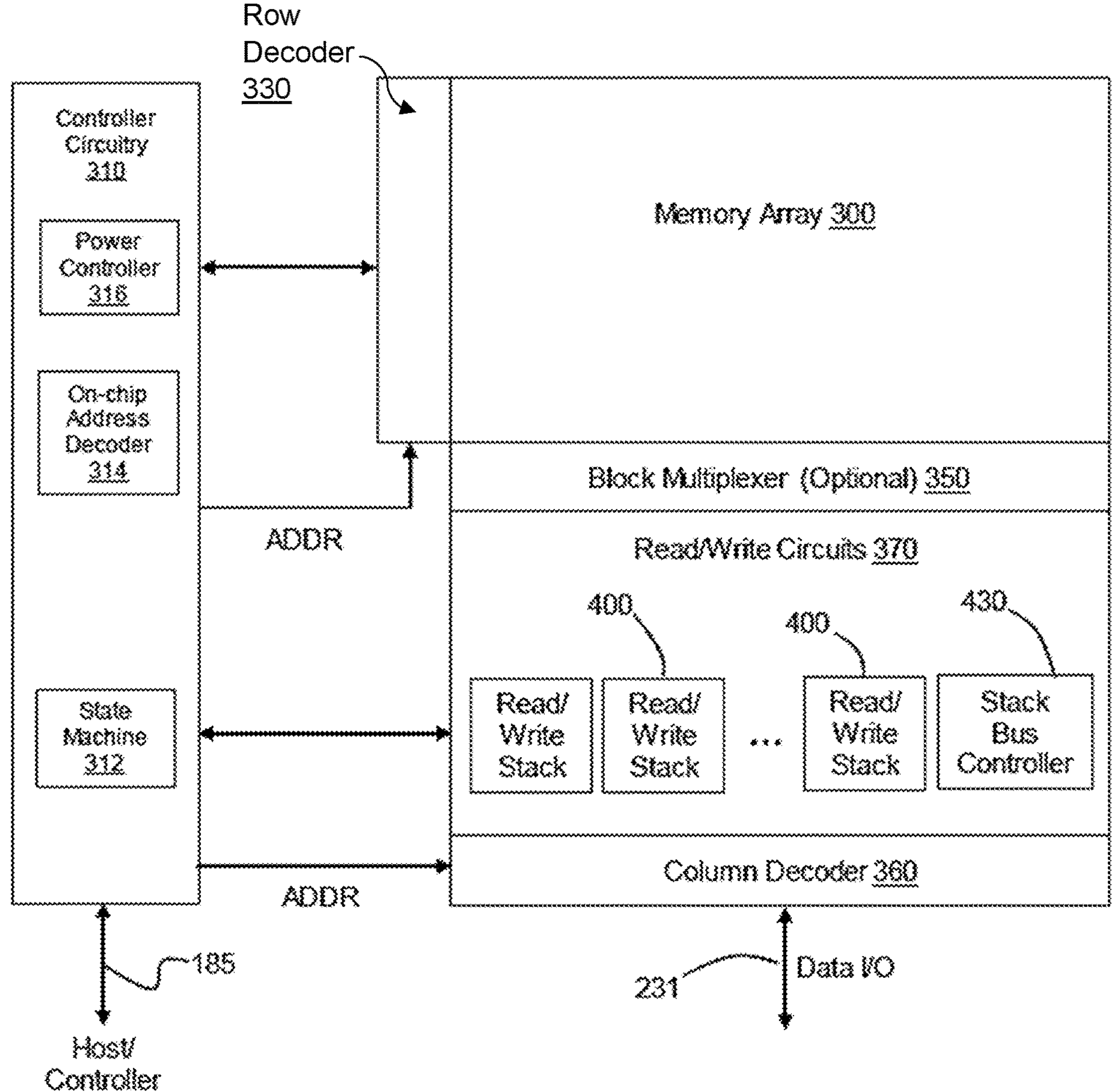
FIG. 13A schematically depicts a memory device with a bank of partitioned read/write stacks, in accordance with exemplary embodiments.

Referring now to FIG. 13A, there is shown an exemplary embodiment of a memory device (such as memory device 102 in FIG. 1, for example) that is comprised of a non-volatile memory array 300 (which may include the NAND-type SLC, MLC, TLC, and/or QLC memory cells that are in a two- or three-dimensional configuration), control circuitry 310, and read/write circuits 370. Further, as is depicted, read/write circuits 370 are comprised of one or more banks of partitioned read/write stacks 400, thereby allowing a block (or "page") of memory cells to be read or programmed in parallel wherein, according to an exemplary embodiment, a "page" of memory cells constitutes a contiguous row of memory cells. Memory array 300 is addressable by word lines via row decoder 330 and by bit lines via column decoder 360. Alternatively, the memory array 300 may comprise rows of memory cells partitioned into multiple blocks or pages. Hence, in such an exemplary embodiment, a block multiplexer 350 is provided to multiplex the read/write circuits 370 to the individual blocks.

With respect to the control circuitry 310, it operates in conjunction with the read/write circuits 370 to perform memory operations on the memory array 300. In this particular embodiment, the control circuitry 310 includes a state machine 312, an on-chip address decoder 314, and a power controller 316. The state machine 312 provides chip level control of memory operations. The on-chip decoder 314 provides an address interface between that that is used by the host or a memory controller to the hardware address used by the decoders 330, 360. Lastly, the power controller 316 controls the power and voltages that are supplied to the word lines and bit lines during memory operations.

Figure 13B:
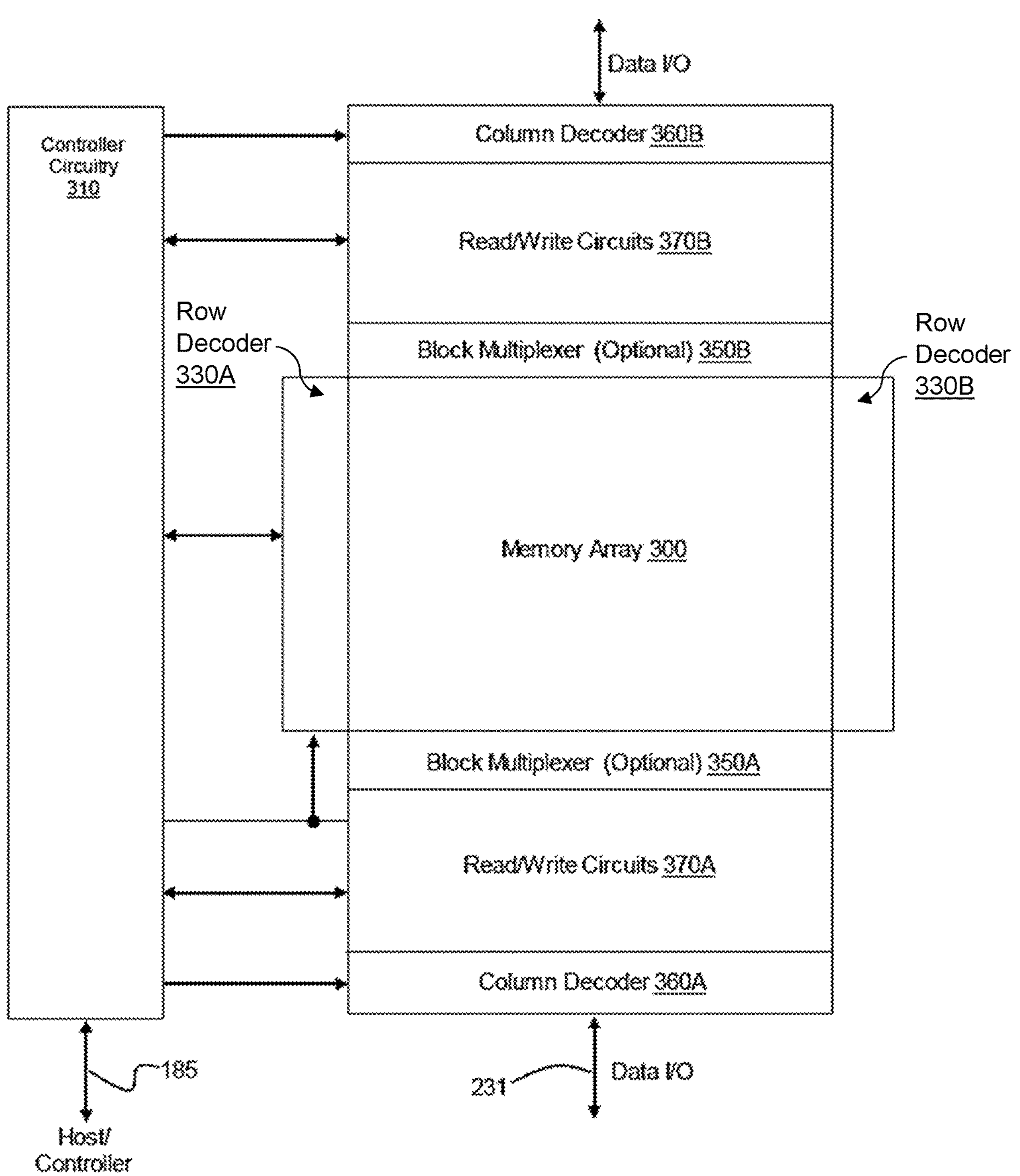
FIG. 13B schematically depicts the memory device of FIG. 13A in a slightly different configuration, in accordance with exemplary embodiments.

FIG. 13B depicts a slightly different exemplary embodiment of the memory device of FIG. 13A. In this particular embodiment, access to memory array 300 by the various peripheral circuits is implemented in a symmetrical manner on opposite sides of the memory array 300. As a result, the access lines and circuitry on each side of the memory array 300 are reduced in half when compared to the configuration in FIG. 13A. Specifically, the row decoder 330 is split into multiple row decoders 330A, 330B, and the column decoder 360 is split into multiple column decoders 360A, 360B. Furthermore, in such an embodiment in which a row of memory cells is partitioned into multiple blocks, block multiplexer 350 is split into multiple block multiplexers 350A, 350B. The read/write circuits 370 are likewise divided into read/write circuits 370A (connecting to bit lines from the bottom of memory array 300) and read/write circuits 370B (connecting to bit lines from the top of memory array 300). Accordingly, the density of the read/write modules (as well as the partitioned read/write stacks 400) is, in essence, reduced by half.

Figure 14:
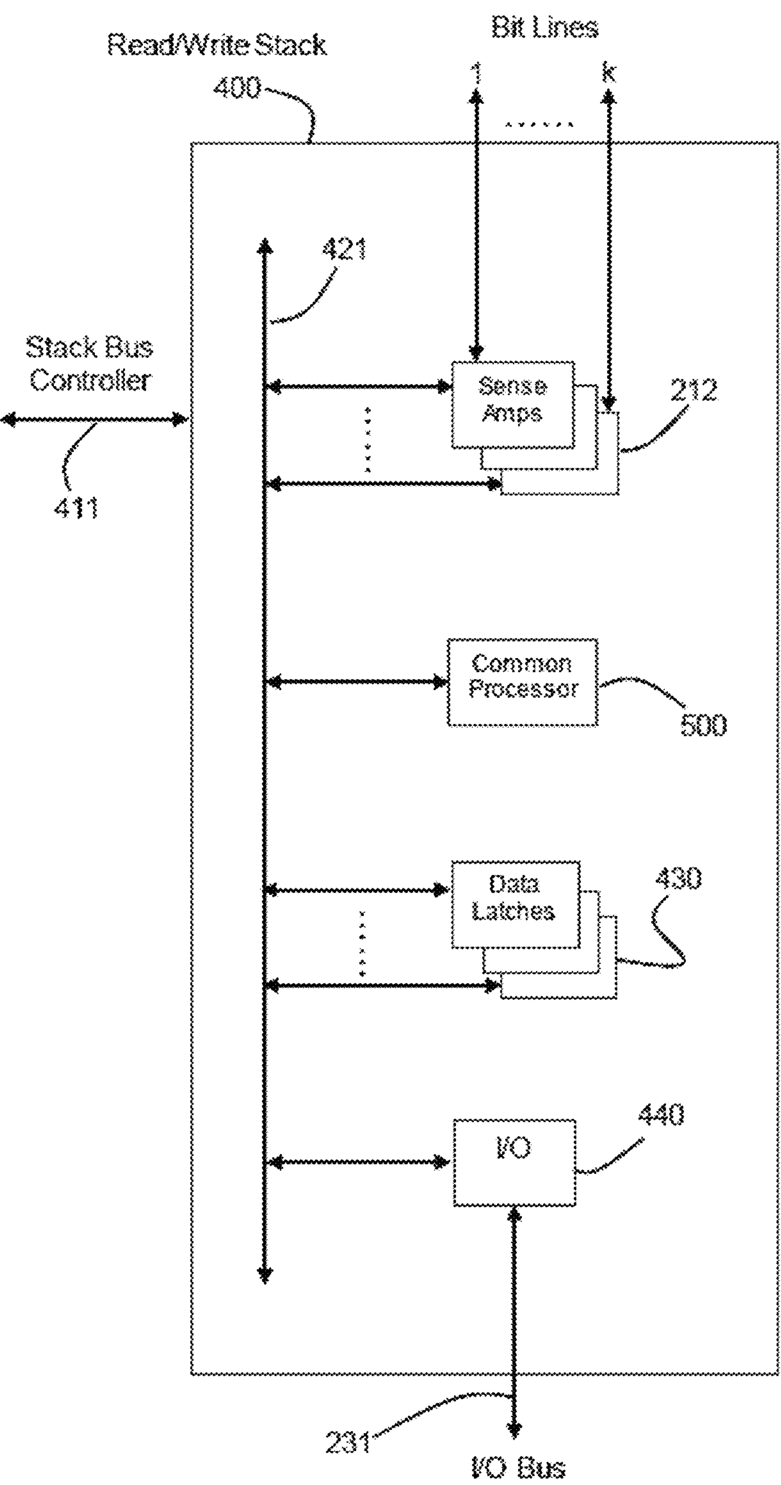
FIG. 14 schematically depicts various components of a read/write stack, such as the read/write stacks depicted in FIG. 13A, in accordance with exemplary embodiments.
Figure 15A:
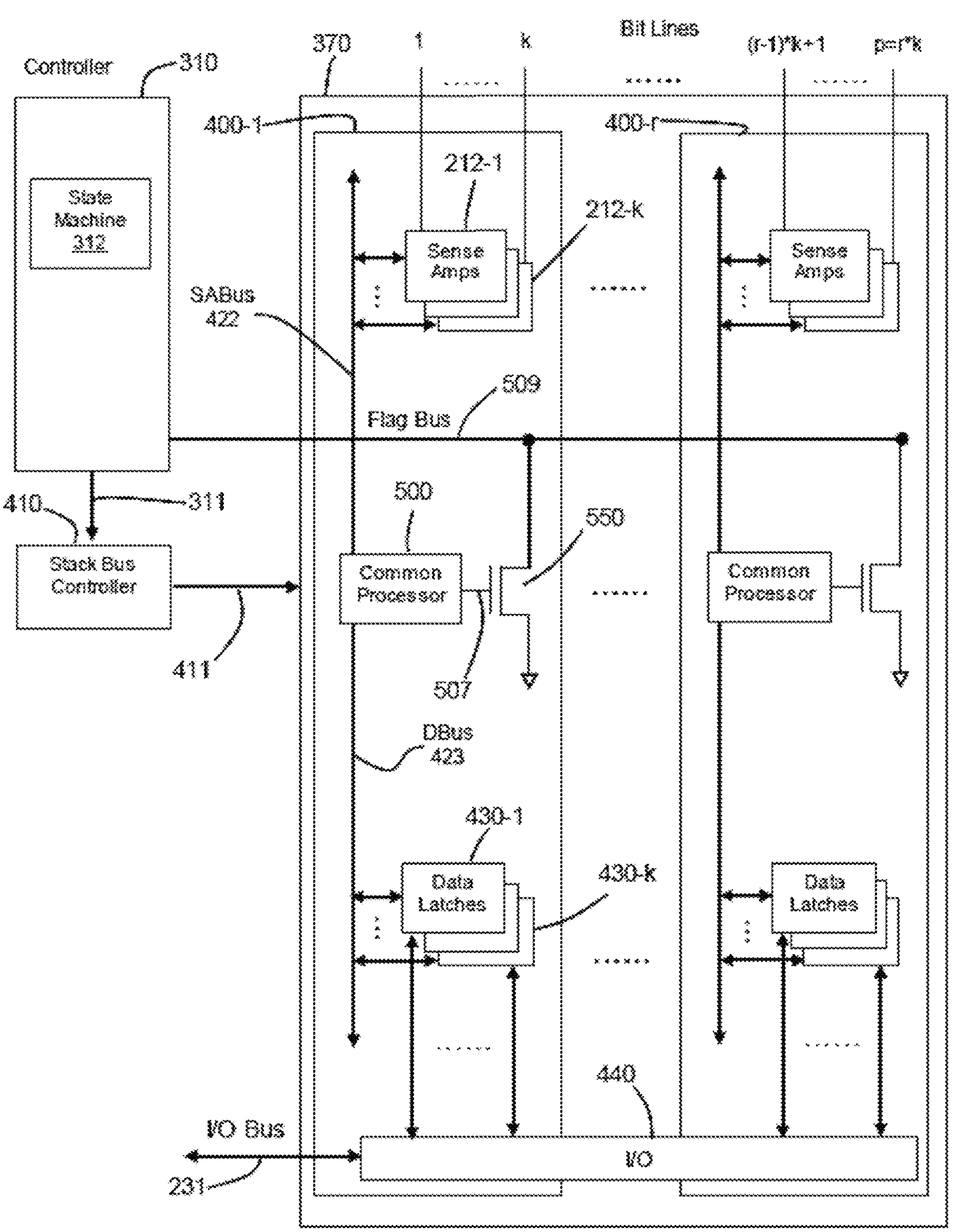
FIG. 15A schematically depicts a plurality of read/write stacks arranged amongst read/write circuits of a memory device, such as the memory device depicted in FIG. 13A, in accordance with exemplary embodiments.

Referring now to FIG. 14, there is illustrated an exemplary embodiment of certain components in a read/write stack, such as the read/write stacks 400 of FIG. 13A. According to this particular architecture, a read/write stack 400 comprises a stack of sense amplifiers 212 for sensing a "k" number of bit lines, an I/O module 440 for input or output of data over an I/O bus 231, a stack of data latches 430 for storing input and/or output data, a common processor 500 to process and store data among the read/write stack 400, and a stack bus 421 for communication among the read/write stack 400 components. In addition, a stack bus controller provides control and timing signals via lines 411 for controlling the various components of read/write stack 400. FIG. 15A depicts an exemplary embodiment for incorporating the read/write stack 400 of the embodiment of FIG. 14 amongst the read/write circuits 370 of the memory devices depicted in FIGS. 13A-13B. As indicated above, each of read/write stacks 400 operates on a group of "k" number bit lines in parallel. Therefore, if a page in memory array 300 has p=r*k bit lines, there will be a "r" number of read/write stacks—i.e., read/write stacks 400-1, . . . , 400-*r*. Accordingly, the entire bank of partitioned read/write stacks 400-1, . . . , 400-*r*, operating in parallel allows a block (or a page) of p cells along a row to be read or programmed in parallel, there being p read/write modules for the entire row of cells. As each read/write stack 400-1, . . . , 400-*r* serves "k" memory cells, the total number of read/write stacks in a bank may be expressed as r=p/k. Further, in accordance with this example, each read/write stack correspondingly has a stack of sense amplifiers 212-1, . . . , 212-*k* that serves a segment of "k" memory cells in parallel. In addition, each read/write stack correspondingly has a stack of data latches 430-1, . . . , 430-*k*, wherein each data latch is associated with a memory cell. As such, there is an I/O module 440 enabling data latches 430-1, . . . , 430-*k* to exchange data externally via an I/O bus 231.

Still referring to FIG. 15A, there is also shown a stack bus controller 410 that receives signals from the memory controller 310 (via lines 311) and in turn provides control and timing signals to the read/write circuits 370 via lines 411. Communication among the read/write stacks 400 is implemented by an interconnecting stack bus controlled by stack bus controller 410. Therefore, the control lines 411 provide control and clock signals from the stack bus controller 410 to the components of the read/write stacks 400-1, . . . , 400-*r*. In this particular example, the interconnecting stack bus is divided into a SABus 422 and a DBus 423, wherein SABus 422 provides for communication between the common processor 500 and the stack sense amplifiers 212-1, . . . , 212-*k*, and the DBus 423 provides a communication pathway between the common processor 500 and the stack of data latches 430-1, . . . , 430-*k*. With respect to the common processor 500, it further comprises an output 507 for output of a status signal of a memory operation, such as an error condition. As is depicted in FIG. 15A, this status signal may, for example, be used to drive a gate of a n-transistor 550 that is tied to a Flag Bus 509 in a Wired-Or configuration, wherein the Flag Bus 509 is pre-charged by the controller 310 and is pulled down when a status signal is asserted by any of read/write stacks 400-1, . . . , 400-*r*.

Figure 15B:
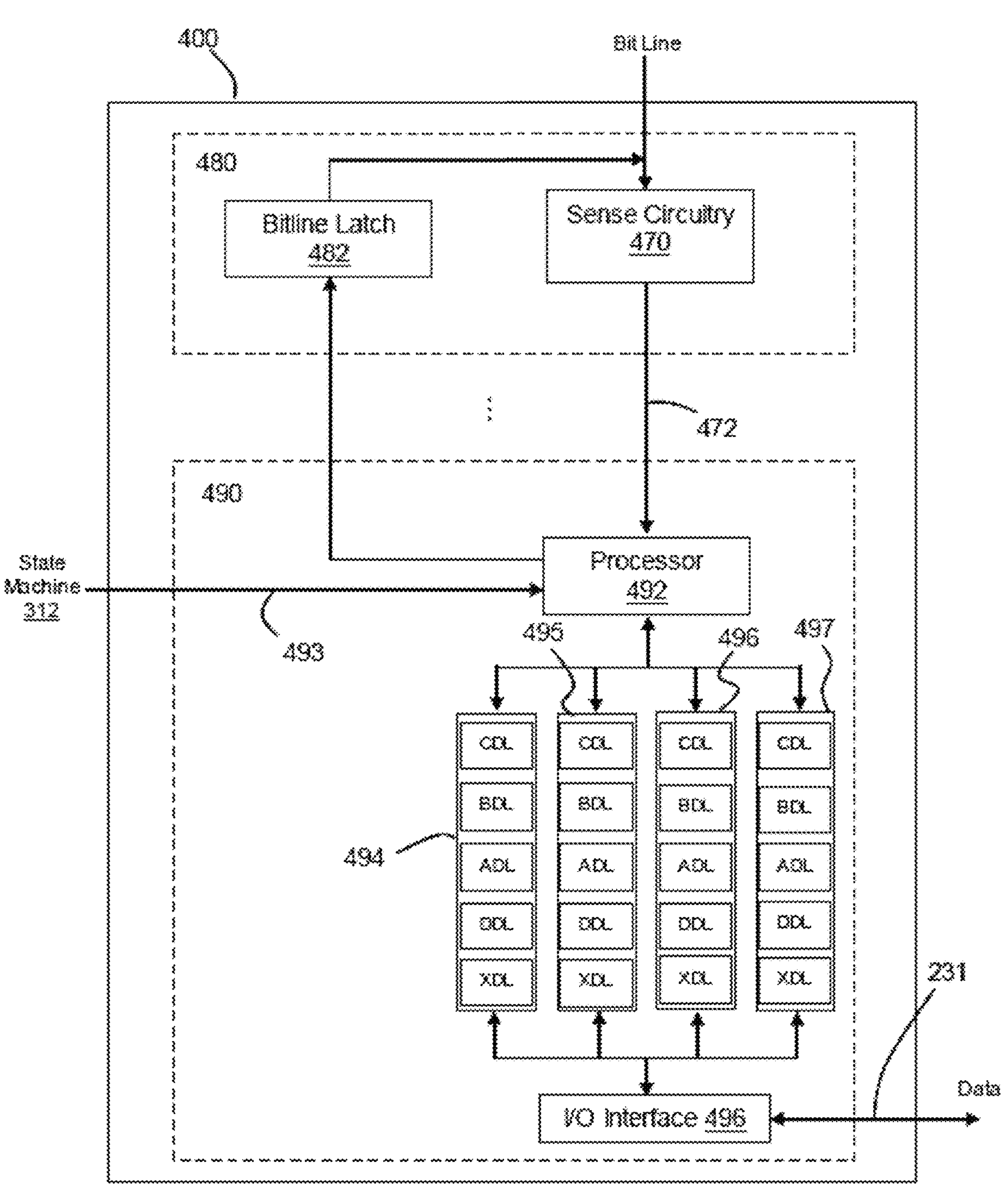
FIG. 15B is a block diagram depicting a sense block of a read/write stack, such as the read/write stacks depicted in FIG. 13A, in accordance with exemplary embodiments.

Further, an exemplary embodiment of an individual sense block (as encompassed by a read/write stack 400) is depicted in FIG. 15B. Sense block 400 is partitioned into one or more core portions comprising the sense modules 480 or sense amplifiers, and a common portion, referred to as a managing circuit 490. In one embodiment, there is a separate sense module 480 for each bit line and one common managing circuit 490 for a set of multiple, e.g., four or eight, sense modules 480. Each of the sense modules in a group communicates with the associated managing circuit via data bus 472. Thus, there are one or more managing circuits which communicate with the sense modules of a set of storage elements 10.

Sense module 480 comprises sense circuitry 470 that performs sensing by determining whether a conduction current in a connected bit line is above or below a predetermined threshold level. Sense module 480 also includes a bit line latch 482 that is used to set a voltage condition on the connected bit line. For example, a predetermined state latched in bit line latch 482 will result in the connected bit line being pulled to a state designating program inhibit (e.g., 1.5-3 V). As an example, a flag=0 can inhibit programming, while flag=1 does not inhibit programming.

In the exemplary embodiment of FIG. 15B, the managing circuit 490 comprises a processor 492, four example sets of data latches 494, 495, 496, and 497, and an I/O interface 496 coupled between the sets of data latches 494-497 and the data bus 231. One set of data latches may be provided for each sense module 480, and data latches identified by XDL, DDL, ADL, BDL, and CDL may be provided for each set. In some cases, additional data latches may be used. In one exemplary approach, in a memory device which uses eight data states, XDL stores user data, DDL stores an indication of whether quick pass write programming is used, ADL stores a lower page of data, BDL stores a middle page of data, and CDL stores an upper page of data.

Processor 492 performs computations, such as to determine the data stored in the sensed storage element and store the determined data in the set of data latches. Each set of data latches 494-497 is used to store data bits that are determined by processor 492 during a read operation, and to store data bits imported from the data bus 231 during a programming operation which represent write data that is meant to be programmed into the memory. The I/O interface 496 provides an interface between data latches 494-497 and the data bus 231.

During reading, the operation of the system is under the control of state machine 312 that controls the supply of different control gate voltages to the addressed storage element 10. As it steps through the various predefined control gate voltages corresponding to the various memory states supported by the memory, the sense module 480 may trip at one of these voltages and a corresponding output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494-497. In another embodiment of the managing circuit 490, the bit line latch 482 operates in a double duty capacity, both as a latch for latching the output of the sense module 480 and also as a bit line latch as described above.

During program or verify operations, the data to be programmed (write data) is stored in the set of data latches 494-497 from the data bus 231. The programming operation, under the control of the state machine 312, comprises a series of programming voltage pulses applied to the control gates of the addressed storage elements. Each program pulse is followed by a read back (verify) to determine if the storage element has been programmed to the desired memory state. In some cases, processor 492 monitors the read back memory state relative to the desired memory state. When the two are in agreement, the processor 492 proceeds to set the bit line latch 482 to cause the bit line to be pulled to a state designating program inhibit. This inhibits the storage element coupled to the bit line from further programming even if program pulses appear on its control gate. In other embodiments, the processor initially loads the bit line latch 482 and the sense circuitry sets it to an inhibit value during the verify process.

As mentioned, each set of data latches 494-497 may be implemented as a stack of data latches for each sense module. In one exemplary embodiment, there are three data latches per sense module 480. In some implementations, data latches are implemented according to a shift register so that the parallel data that is stored therein is converted to serial data for data bus 231, and vice versa. For example, all data latches corresponding to the read/write block of M storage elements can be linked together to form a block shift register so that a block of data can be input or output by serial transfer. In particular, the bank of read/write modules may be adapted in order that each of its set of data latches will shift data into or out of the data bus in sequence as if they are part of a shift register for the entire read/write block.

The data latches identify when an associated storage element 10 has reached certain mileposts in a programming operation. For example, latches may identify if a storage element's Vin is below a particular verify level. Data latches indicate whether a storage element currently stores one or more bits from a page of data. For example, with respect to one exemplary embodiment, the ADL latch is flipped (e.g., from 0 to 1) when a lower page bit is stored in an associated storage element. Further, the BDL latch is flipped when a middle page bit is stored in an associated storage element. And the CDL latch is flipped when an upper page bit is stored in an associated storage element. A bit is stored in a storage element when the $V_{th}$ exceeds an associated verify level.

As mentioned above, these high storage density memory structures, such as the BiCS type described, for example, with respect to the exemplary embodiment that is depicted in FIG. 10, may comprise a three-dimensional memory structure in which the memory elements (e.g., memory cells) are organized in a series of vertically stacked memory planes according to a "scalable" memory architecture. However, despite the ability to gain or increase in memory storage density (or capacity) by introducing (or adding), to a relatively fixed size memory structure, further memory planes in the vertical direction, the current implementations are commonly limited by the inability to address (or issue a command to) more than just a single memory unit (e.g., memory array, memory plane, memory block, word line, etc.) at a time during a memory operation (e.g., during a program, erase, or read operation). Therefore, without a correlative or comparable improvement or boost in the processing capability, an increase in memory storage density, in effect, may result in a tradeoff or a downgrade in the actual performance of the memory device (e.g., $T_{prog}$, or the amount of time consumed during a programming operation).

According to certain exemplary embodiments, it may be possible to improve the processing capability (and, by extension, the performance parameters of a scalable memory structure) by being able to issue, for example, independent plane level commands (e.g., a programming command) to a memory structure. In other words, a single command may be permitted to start independently with respect to each memory plane of the memory structure. Accordingly, the multiple memory planes of a memory structure may be addressed during a memory operation according to a concurrent approach (as opposed to a serial methodology), thereby boosting the performance of the memory structure. Furthermore, the ability to independently address each memory plane also, according to some exemplary embodiments, allows for issuing a plane-specific command to one memory plane that differs from a plane-specific command that is issued to a different memory plane. In a further example, it may be possible, when desirable, to vary the time at which a command is applied to one memory plane versus another memory plane, thus allowing for the ability to discretely manage, schedule (or time), and track a memory operation on, for example, an individual plane-by-plane level. For purposes of demonstrating certain exemplary embodiments of such an independent plane command approach, the following is a general description of an exemplary memory system architecture.

Figure 16:
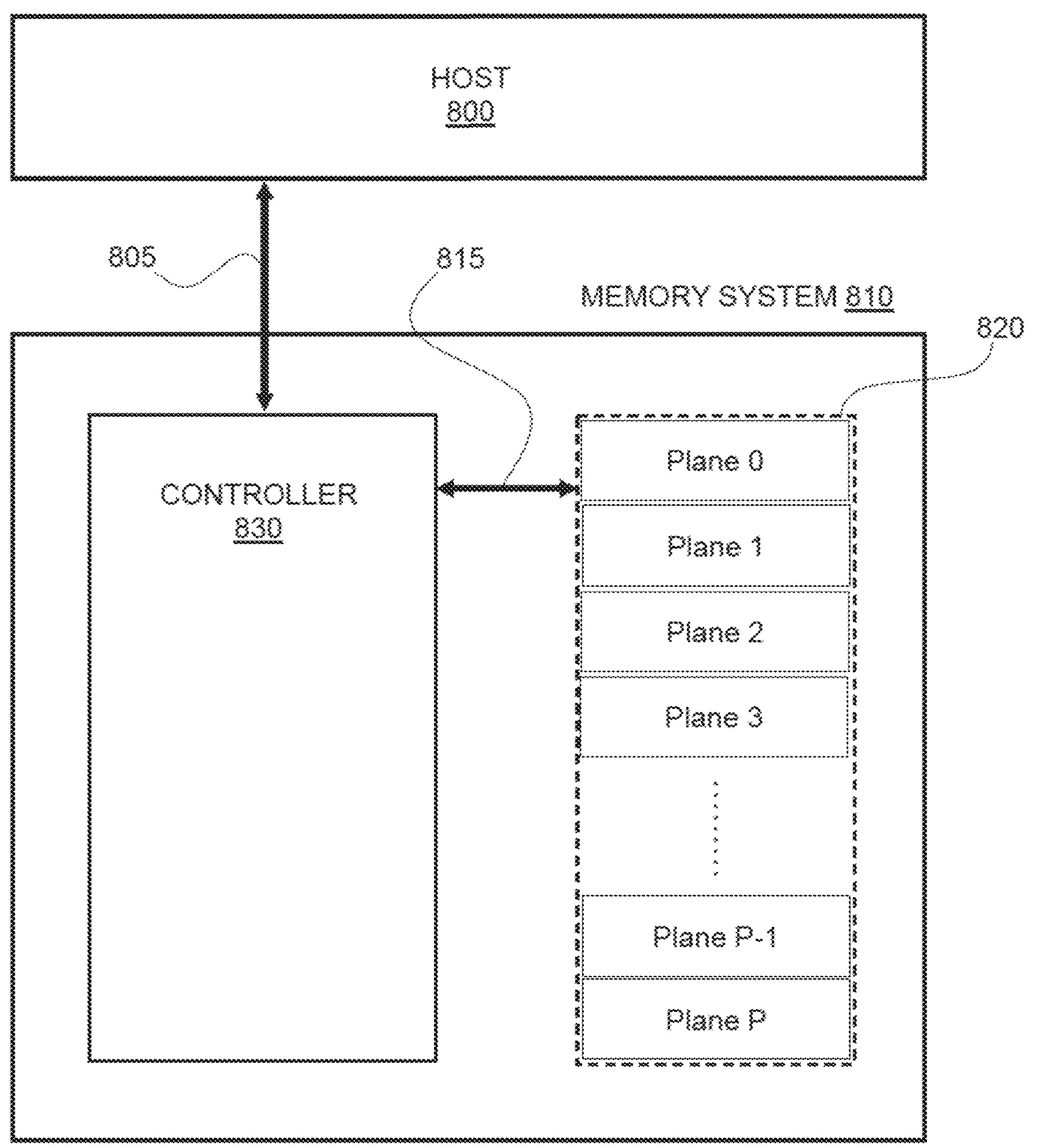
FIG. 16 is a block diagram of a memory system, in accordance with exemplary embodiments.

By way of background, there is shown in FIG. 16 a high level block diagram of an exemplary embodiment of a non-volatile memory system 810. In a manner resembling the memory system 90 depicted in FIG. 1, memory system 810 operates according to, and in communication with, a host device 800 through one or more host interfaces 805. As was previously described, one or both of the host device 800 and the memory system 810 may be located within an electronic computing device (e.g., a PC, laptop, tablet, server, etc.). Alternatively, memory system 810 may be remotely accessed through, for example, a network (e.g., a local area network (LAN) via an Ethernet channel, or by way of a wide area network (WAN) via a cellular data or Internet channel). Further, most basically, memory system 810 comprises a memory device 820 and a controller 830 (e.g., ASIC), whereby the memory device 820 is in bi-directional electronic communication with the controller 830. The memory device 820 may comprise a memory storage medium that is configured to store one or more bits of information/data. Memory device 820 may comprise either or both of volatile and non-volatile memory structures. According to this particular example, memory device 802 includes block addressable memory structures-namely, three-dimensional NAND-type memory structures. Furthermore, memory device 820 can include one or more of the single-level cell (SLC)-type, multi-level cell (MLC)-type, triple-level cell (TLC)-type, quad-level cell (QLC)-type, etc. As depicted in FIG. 16, controller 830 can communicate with the host device 800 by way of the interface(s) 805. Specifically, controller 830 can communicate with computing elements (not shown) of the host device 800 to, upon the appropriate command, program (write) data to the memory device 820 and/or read data from the memory device 820. More specifically, the controller 830 may be configured to receive commands (or requests) from host device 800 and generate and perform commands with regard to operations of the memory device 820. Such memory operations include, and relate to aspects of, for example, reading (or sensing), programming (or writing), and erasing data that is stored within the memory device 820. As pictured in FIG. 16, the controller 830 is electrically coupled (see connection 815) with the memory device 820 in order for the controller 830 to command, or to otherwise control, the memory device 820 to cause memory operations to occur (e.g., read, program, erase, cease, suspend, resume, etc.). According to certain embodiments, input/output (I/O) pins and signal channels/lines may communicatively couple the controller 830 and the memory device 820, thereby enabling the transmission of read and write data between the controller 830 and the memory device 820.

In particular, the controller 830 may be communicatively coupled to individual word lines (WLs) of the memory device 820 in order to select one or more specific word lines, apply the intended read voltage biases (VREAD), the intended program voltage biases ($V_{PGM}$) (in combination with the appropriate bit line potential voltage biases (VBL)), and the intended erase voltage biases (VERA). Additionally, the controller 830 may be communicatively coupled to individual bit lines (BLs) of the memory device 820 in order to read (or sense) the data stored within the memory device 820, determine a state of the memory device during a programming operation, and control the bit line potential levels to promote and inhibit the programming and erasing of specific memory structures within the memory device 820.

As mentioned above, the memory device 820 may be comprised of three-dimensional NAND-type memory structures and, conventionally, a memory die of this type is comprised of multiple memory planes with each memory plane comprising a population of memory cells. Therefore, as illustrated in FIG. 16, the memory device 820 according to this particular embodiment is comprised of several memory planes, which are referenced there as "Plane 0," "Plane 1," "Plane 2," "Plane 3," . . . , "Plane P−1," and "Plane P," wherein "P" is any integer that is greater than zero (0).

Figure 17:
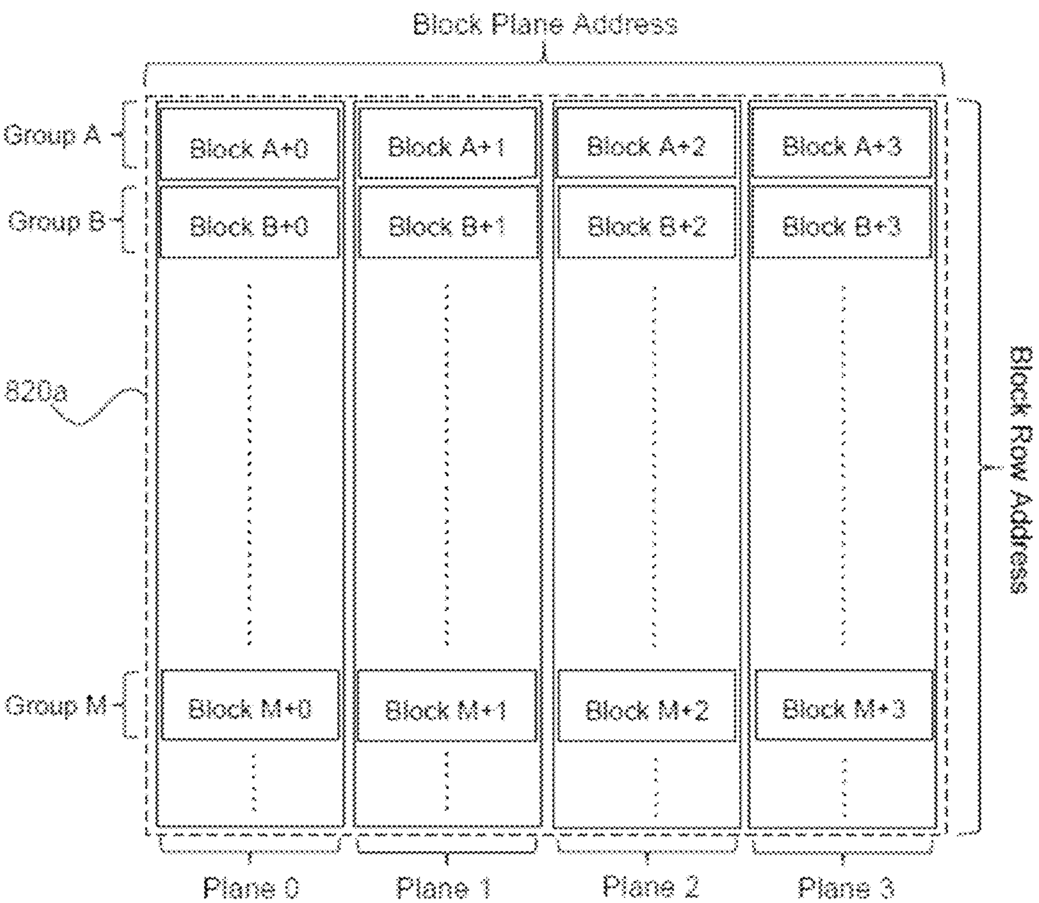
FIG. 17 is a block diagram of a memory device, in accordance with exemplary embodiments.

Referring now to FIG. 17, for purposes of simplicity with respect to the following explanation, there is depicted only a subset 820*a* of memory device 820 of the exemplary embodiment in FIG. 16. Namely, only four (4) of the memory planes, i.e., "Plane 0" through "Plane 3" are shown. As depicted, each of the four planes is further divided into a number of memory blocks. As described in greater detail below, each memory block is identified by its "block address." As mentioned above with respect to all non-volatile memory structures, a memory block constitutes one unit of erase in which all memory cells within the same memory block are erased together. In other words, a memory block is typically the smallest erasable conglomerate (or unit) in a NAND memory die. According to some embodiments, a memory block comprises a number of memory cells that are coupled to the same bit line. In addition, a memory block may include one or more pages of memory cells. In the illustrative example depicted in FIG. 17, the multiple memory blocks that comprise each memory plane (i.e., "Plane 0" through "Plane 3") may be referenced and addressed according to each memory block's respective addressable memory block group or groupings. In this particular embodiment, the memory block group addresses are delineated according using a coordinate-type system. Specifically, each memory block is addressable by its respective row and respective plane. Accordingly, as depicted in FIG. 17, beginning with a memory block "Group A", the memory block group comprises the memory blocks that are located within a "Row A" (which may be referenced as row "0") of each of "Plane 0" through "Plane 3." Therefore, beginning at the top leftmost position in FIG. 17, there is located a memory block having the "block address" of "Block A+0," whereby the memory block is located in "Row A" within "Plane 0." Next, moving one coordinate position to the right is the next memory block that is positioned within "Row A," which is located in "Plane 1." Therefore, the "block address" of this next sequential memory block is "Block A+1." Proceeding one more coordinate position to the right is, by extension, a memory block with the "block address" of "Block A+2." Accordingly, this next sequential memory block is located within "Row A" and in "Plane 2." Likewise, moving an additional coordinate position towards the right, there is a memory block having the "block address" of "Block A+3," indicating that the memory block is located within "Row A" and in "Plane 3." This same "block address" assignment convention may then be applied to each subsequent row (i.e., "Row B" (which may be referenced as row "1" given that it is the next sequential row following "Row A" or row "0"), . . . , "Row M" (wherein "M" is any integer that is greater than "1", etc.) of memory blocks that exist across the multiple memory planes of the memory device 820.

As previously mentioned above, the performance of a memory operation (e.g., read, program, erase, etc.) as applied to a given memory die is ordinarily limited to occurring one memory plane at a time according to, for example, the direction of a single state machine that controls the voltage biasing that is applied to the entire memory die. In other words, if, for example, a programming operation is being performed with respect to one memory plane of a memory structure, the remaining memory planes of that memory structure must nonetheless remain idle (or otherwise paused) until the programming operation as applied to the current memory plane is completed. Taking, for example, the exemplary embodiment of memory structure 820*a* in FIG. 17, a plane-by-plane memory operation methodology requires that a memory operation must only be applied to one or more of the memory blocks located within a single memory plane (e.g., "Plane 0") of the memory structure 820*a*, and completed, before the same (or any other) memory operation can proceed onward (or can be initiated) with respect to any other memory plane (e.g., "Plane 1," "Plane 2," or "Plane 3") of memory structure 820*a*. Accordingly, as a result of this single plane limitation, a memory device may experience (and exhibit) a persistent and problematic degree of latency in its overall performance that can be perceivable to an end user.

Figure 18A:
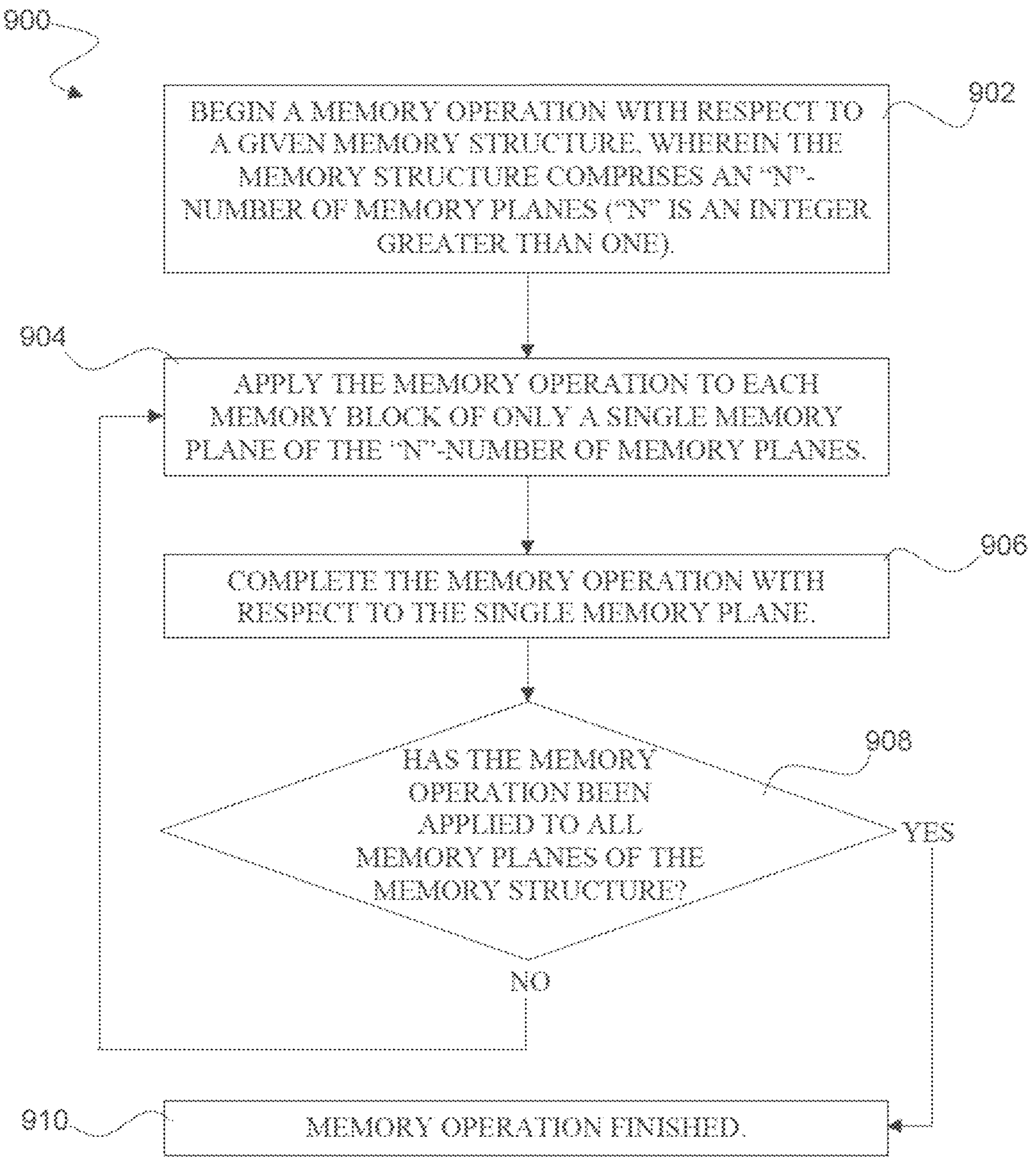
FIG. 18A is a flow diagram generally illustrating several steps of a "plane-by-plane" sequential memory operation approach, in accordance with an exemplary embodiment.
Figure 18B:
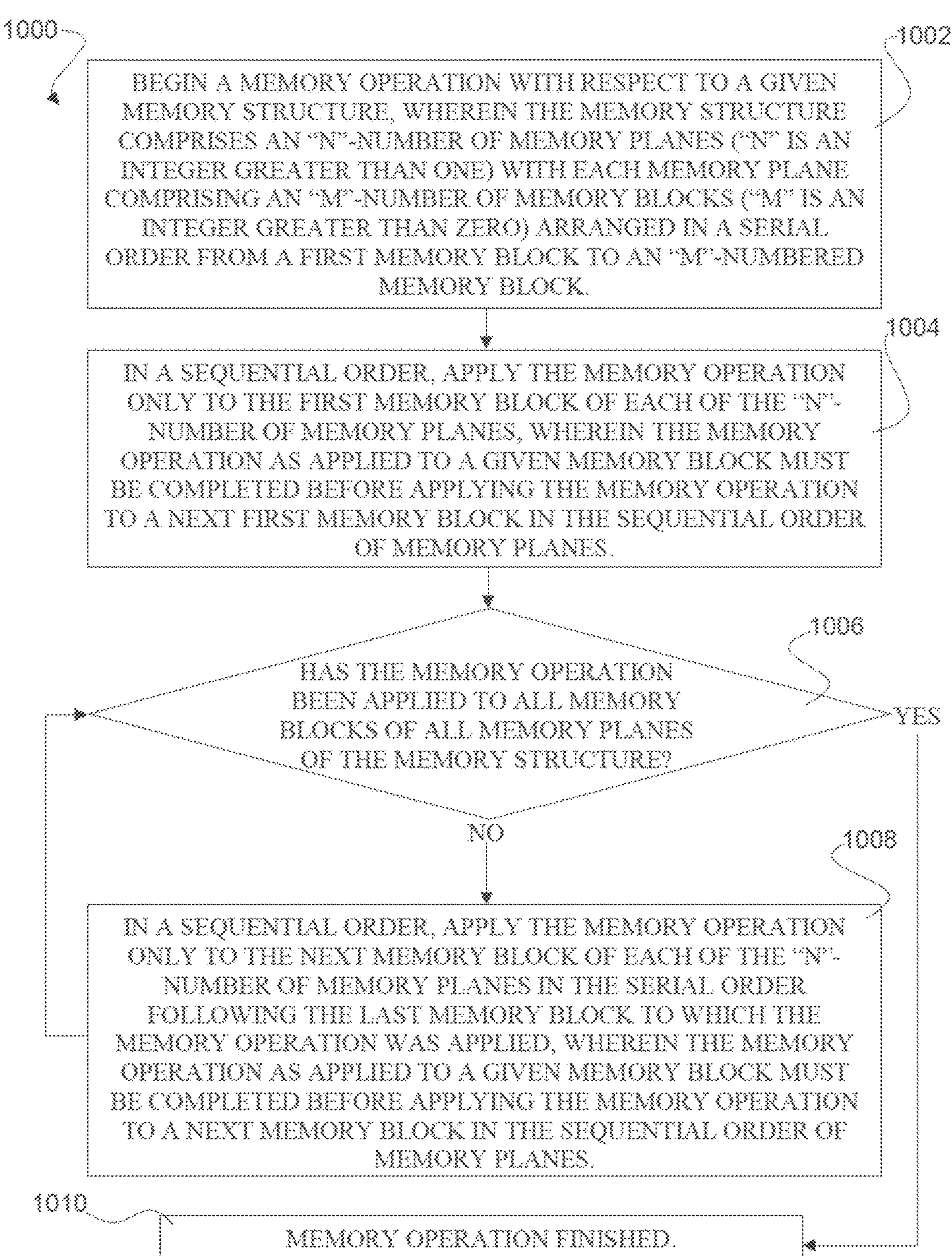
FIG. 18B is a flow diagram generally illustrating several steps of a "plane-by-plane" sequential memory operation approach, in accordance with another exemplary embodiment.

Generally depicted in FIGS. 18A and 18B are just two examples of memory operation processes that adhere to (or are limited or confined by) a "plane-by-plane" or "single plane" approach. Beginning with the exemplary embodiment that is outlined according to the flow diagram in FIG. 18A, the methodology or process 900 that is depicted there applies a memory operation (e.g., read, program, or erase) to every memory block of a memory plane before proceeding onward to apply the memory operation to the next memory plane. Accordingly, as indicated in an initial step 902, a memory operation is initiated with respect to a given memory structure, wherein the memory structure comprises an "N"-number of memory planes (wherein "N" is an integer greater than one). Next, at step 904, the memory operation is applied to each memory block of only a single memory plane of the "N"-number of memory planes and, as a result, at step 906, the memory operation is completed with respect to this single memory plane. Thereafter, at step 908, a determination is made as to whether the memory operation has been applied to all of the "N"-number of memory planes comprising the memory structure. If, at this juncture, the memory operation is complete with respect to all memory planes, the memory operation is finished (thus, see step 910). However, if the memory operation has not yet been applied to every one of the "N"-number of memory planes, the methodology or the process 900 returns to step 904 in which the memory operation is likewise applied to each of the memory blocks of a memory plane to which the memory operation has not yet been applied. Thus, this repeated process continues until the memory operation is applied to all of the "N"-number of memory planes.

Accordingly, in an instance in which the methodology or process 900 is applied to memory device 820*a* of the exemplary embodiment depicted in FIG. 17, the methodology or process 900 would proceed as follows. As indicated in FIG. 17, according to this particular embodiment, the memory device 820*a* comprises four memory planes, i.e., "Plane 0" through "Plane 3." Thus, in this case, "N" equals four (4). As such, in a step 904, a specific memory operation is first applied to every memory block of just one of the memory planes of memory device 820*a*. For example, a program memory operation may be applied to "Block A+0," . . . , "Block M+0", etc., of "Plane 0" until every memory block of "Plane 0" has been programmed (completed at step 906). Thereafter, at step 908, an inquiry is made to determine whether all of the remaining memory planes (i.e., "Plane 1" through "Plane 3") have been programmed and, logically, the determination is made that "Plane 1" through "Plane 3" are still unprogrammed. Accordingly, the process 900 returns to step 904 and the program memory operation is then similarly applied to each memory block of one of the unprogrammed memory planes. For example, the program memory operation may now be applied to "Block A+1" through "Block M+1," etc., of "Plane 1." Therefore, this plane-by-plane methodology or process 900 is continually repeated until every memory block of each of "Plane 0" through "Plane 3" of the memory device 820*a* is programmed. Once this occurs, the program memory operation is complete (see step 910).

The methodology or process 1000 generally depicted in the flow diagram set forth in FIG. 18B is a possible alternative exemplary embodiment of a "plane-by-plane" approach. In contrast to the methodology or process 900 indicated in FIG. 18A, the methodology or process 1000 applies a memory operation to just one memory block of one memory plane and, once completed, then moves onward in a sequential manner to applying the memory operation to a memory block of a next memory plane. In other words, unlike the process 900, the memory operation herein is not applied to every memory block of a memory plane before continuing onward to a different memory plane. Rather, the memory operation is applied to the multiple memory planes in a sequential order vis-à-vis one memory block at a time. Thus, beginning at step 1002, a memory operation is initiated with respect to a given memory structure. In this instance, the memory structure comprises an "N"-number of memory planes, wherein "N" is an integer greater than one. Also, each of the "N"-number of memory planes comprises an "M"-number of memory blocks, wherein "M" is an integer greater than zero. Furthermore, the "M"-number of memory blocks comprising each memory plane are arranged in a serial order from a first memory block to an "M"-numbered memory block. Continuing at step 1004, a memory operation (e.g., read, program, erase) is applied to the memory planes in a sequential order. However, in this initial stage, the memory operation is applied only to the first memory block (according to the serial order of the "M"-number of memory blocks) of each memory plane. Importantly, in so doing, the memory operation as applied to a given memory block must be completed before applying the memory operation to a next first memory block within the sequential order of the memory planes. Thereafter, once the memory operation is complete with respect to the first memory block of each memory plane, a determination is made as to whether the memory operation has been applied to all of the memory blocks of all of "N"-number of memory planes of the memory structure (see step 1006). If the determination is made that the memory operation has been applied to all of the memory blocks, the memory operation is then regarded as finished (see step 1010). However, if the determination is made that the memory operation has not been applied to every memory block of every memory plane, the process proceeds to step 1008. At step 1008, the memory operation is again applied to the multiple memory planes according to the sequential order. However, at this juncture, the process move forward to the next memory block within each memory plane according to the serial order following the last memory block to which the memory operation is applied. Importantly, the memory operation as applied to a given memory block must be completed before applying the memory operation to a next memory block in the sequential order of the memory planes. Accordingly, this process repeats or continues, sequentially proceeding through the memory planes, until the determination is made (at step 1006) that the memory operation has now been applied to every memory block of each memory plane comprising the memory structure. For purposes of demonstration, the following description describes a scenario in which the methodology or process 1000 may be applied to the memory device 820*a* of the exemplary embodiment in FIG. 17.

As indicated in FIG. 17, according to this particular embodiment, the memory device 820*a* comprises four memory planes, i.e., "Plane 0" through "Plane 3." Thus, in this case, "N" equals four (4). In addition, as depicted, the memory planes are disposed in a sequential order beginning with "Plane 0" and ending at "Plane 3." Further, as described above, each memory plane depicted in FIG. 17 comprises multiple memory blocks. For purposes of this particular scenario, one may assume that each memory plane has a total of "M"-number memory blocks, wherein the memory blocks within each memory plane are disposed in a serial order beginning with a first memory block (i.e., "Block A+______") and finishing at the "M"-numbered memory block (i.e., "Block M+______"). Accordingly, based upon this architecture, step 1002 of the methodology or process 1000 begins with an initiation of a memory operation, wherein, at step 1004, the memory operation is applied to only the first memory block of each memory plane according to the sequential order of the memory planes. Further, as indicated at step 1004, the memory operation as applied to a given memory block must first be completed before then continuing onward to apply the memory operation to the next memory block in the sequential order. Therefore, beginning at "Plane 0," the memory operation is applied to the first memory block, "Block A+0." Once this is complete, the process proceeds to applying the memory operation to the first memory block (i.e., "Block A+1") of the next memory plane within the sequential order (i.e., "Plane 1"). Once complete, the process then continues in the identical sequential manner with respect to "Block A+2" of "Plane 2," and thereafter to "Block A+3" of "Plane 3." After the memory operation is applied to each first memory block of each memory plane, the methodology or the process 1000 proceeds to step 1006. As described above, at step 1006, an inquiry is made as to whether, at this juncture, the memory operation has now been applied to every memory block of each memory plane that comprises the memory structure. In this particular case, each of the four memory planes (i.e., "Plane 0" through "Plane 3") of the memory device 820*a* comprises more than just a first memory block (i.e., each memory plane comprises an "M"-number of memory blocks). Therefore, the methodology or process 1000 continues. Thus, at step 1008, the memory operation is then sequentially applied to the four memory planes, but only to one memory block within each memory plane. Specifically, the memory operation is applied to the next memory block in the serial order following the last memory block to which the memory operation was applied. Therefore, in the current working example of the embodiment of memory device 820*a*, the next stage is to apply the memory operation to the memory block of each memory plane that, in accordance with the serial order defined above, falls after the first memory block. Therefore, beginning with the first memory plane that appears in the sequential order of the memory planes, i.e., "Plane 0," the memory operation is applied to "Block B+0" of "Plane 0." And once that is complete, the memory operation is next applied to "Block B+1" of "Plane 1," then to "Block B+2" of "Plane 2," and lastly, to "Block B+3" of "Plane 3." Accordingly, at this point, the process 1000 has again proceeded through the entire sequential order of memory planes (i.e., "Plane 0" through "Plane 3") and as such, returning to step 1006, a new determination must be made as to whether the memory operation has now been applied to all memory blocks of each memory plane of the memory structure. Given that each memory plane of memory device 820*a* comprises an "M"-number of memory blocks, this process 1000 will repeat until it is determined that the memory operation has been applied to all of the "M"-number memory blocks within each of the four memory planes.

Figure 19:
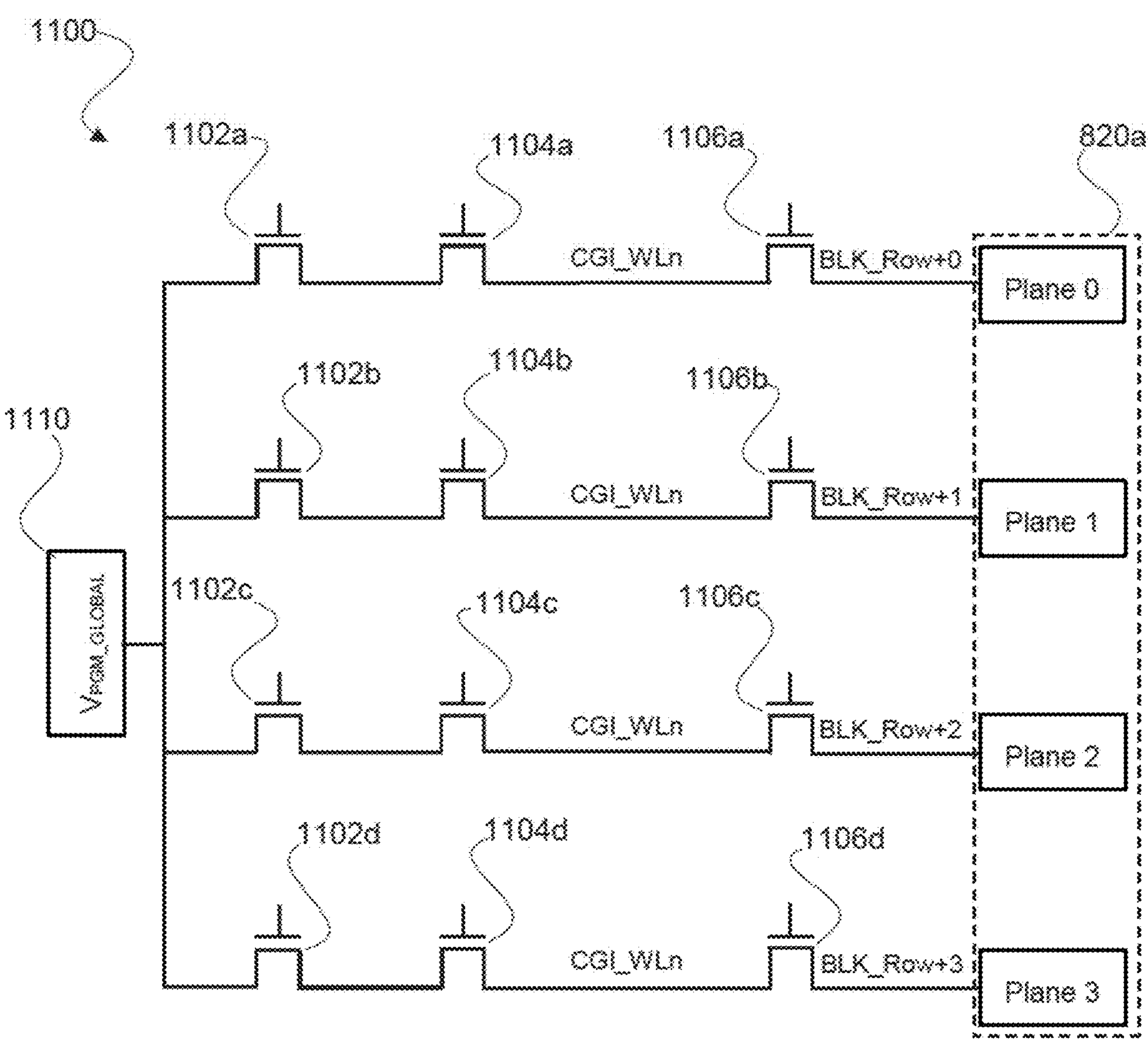
FIG. 19 schematically depicts a circuitry implementation employed in a "multi-plane" concurrent memory operation approach, in accordance with exemplary embodiments.

As an improvement to the plane-by-plane approach just described with respect to memory operations, some exemplary embodiments of memory devices permit (or allow for) a "multi-plane" memory operation approach in which a memory operation may be concurrently applied to more than one memory plane at a time. One example of such a memory device is depicted in FIG. 19. Shown in FIG. 19 is a memory device architecture 1100 in which, for purposes of illustration, comprises the four-memory plane structure of memory device 820*a* according to the exemplary embodiment set forth in FIG. 17. In this particular embodiment, in order to accomplish a concurrent or "multi-plane" memory operation approach, a single global voltage biasing source 1110 (e.g., $V_{PMG\_GLOBAL}$ as utilized to perform a program memory operation) is electrically coupled (and applied) to all of the memory planes that comprise the memory device. In the schematic diagram set forth in FIG. 19, the memory element array(s) comprising each of "Plane 0" through "Plane 3" of memory device 820*a* are, according to this specific embodiment, electrically coupled to the global voltage biasing source 1110 via one or more electronic switching components. Specifically, beginning with the circuitry path that lies between the global voltage biasing source 1110 and the memory element array(s) of "Plane 0," placed in series is a first electronic switching component 1102*a* that is followed by a second electronic switching component 1104*a*. According to one non-limiting example, the first electronic switching component 1102*a* may comprise, for example, a CG driver (or control gate driver). Also, the second electronic switching component 1104*a* may comprise, for example, a high voltage switch (HVSW). Further, in-between the second electronic switching component 1104*a* and "Plane 0" lies a row decoder component 1106*a*. As such, this specific combination of components (i.e., 1102*a*, 1104*a*, 1106*a*) permits a voltage bias generated at the global voltage biasing source 1110 to be applied to the memory elements of "Plane 0." More specifically, during application of a pre-determined voltage bias while performing a memory operation, the high voltage switch 1104*a* provides for the selection of word lines (WLs) of the memory array(s) of "Plane 0" (see signal CGI_WLn). Further, row decoder component 1106*a* provides for the selection of the memory elements within the memory array(s) of "Plane 0" that have a specific row address (see signal BLK_Row+0). Similarly, with respect to the memory element array(s) of the remaining memory planes of memory device 820*a*, each of "Plane 1," "Plane 2," and "Plane 3" are respectively electrically coupled to the same global voltage biasing source 1110 (e.g., $V_{PMG\_GLOBAL}$) via a likewise series of electronic components. Namely, each memory plane of "Plane 1," "Plane2," and "Plane 3" is electrically coupled to global voltage biasing source 1110 by way of a respective first electronic switching component (e.g., CG driver) (1102*b*, 1102*c*, and 1102*d*, respectively), a respective second electronic switching component (e.g., the high voltage switch (HVSW)) (1104*b*, 1104*c*, and 1104*d*, respectively) (see signals CGI_WLn), and a respective row decoder component (1106*b*, 1106*c*, and 1006*d*, respectively) (see signals BLK_Row+1, BLK_Row+2, and BLK_Row+3, respectively). Importantly, it is also noted that the exemplary embodiment pictured in FIG. 19 is intended to be only a possible illustrative example and is not intended to limit the circuitry implementation to only those electronic components and the configuration that are shown. Rather, any suitable combination and configuration of electronic components may be employed, whereby the circuitry implementation provides for the concurrent selective application to the multiple memory planes of a memory device (e.g., memory device 820*a*) a pre-determined voltage bias from a common electrically coupled global voltage biasing source (e.g., source 1110) during the performance of a memory operation.

As mentioned above, the circuitry architecture (and similarly operating architectures) allow a memory operation to be performed concurrently across multiple memory planes of a memory device. However, despite achieving some degree of time-savings in the performance speed, this "multi-plane" approach also has inherent limitations that diminish (or otherwise circumscribe) the time-saving potential. For example, because this "multi-plane" approach is dependent upon using a single global voltage biasing source (or, for example, a single state machine) with respect to each memory plane of a memory device, the exact same memory operation (e.g., read, program, erase) must be applied to every memory array of the several memory planes. Furthermore, the page type of the memory operation must also be identical as the voltage biasing that is required in order to access the different page types that comprise a memory array (e.g., lower page, upper page, etc.) is different. Additionally, according to some exemplary embodiments, it may be necessary to apply a single memory operation command to every memory plane such that the timing of the memory operation (i.e., the commencement, completion, and elapsed time/duration) is necessarily dictated (or otherwise hampered) by the slowest memory element (e.g., page type) of a memory device, and asynchronous memory operations are, by definition, impossible.

Figure 20A:
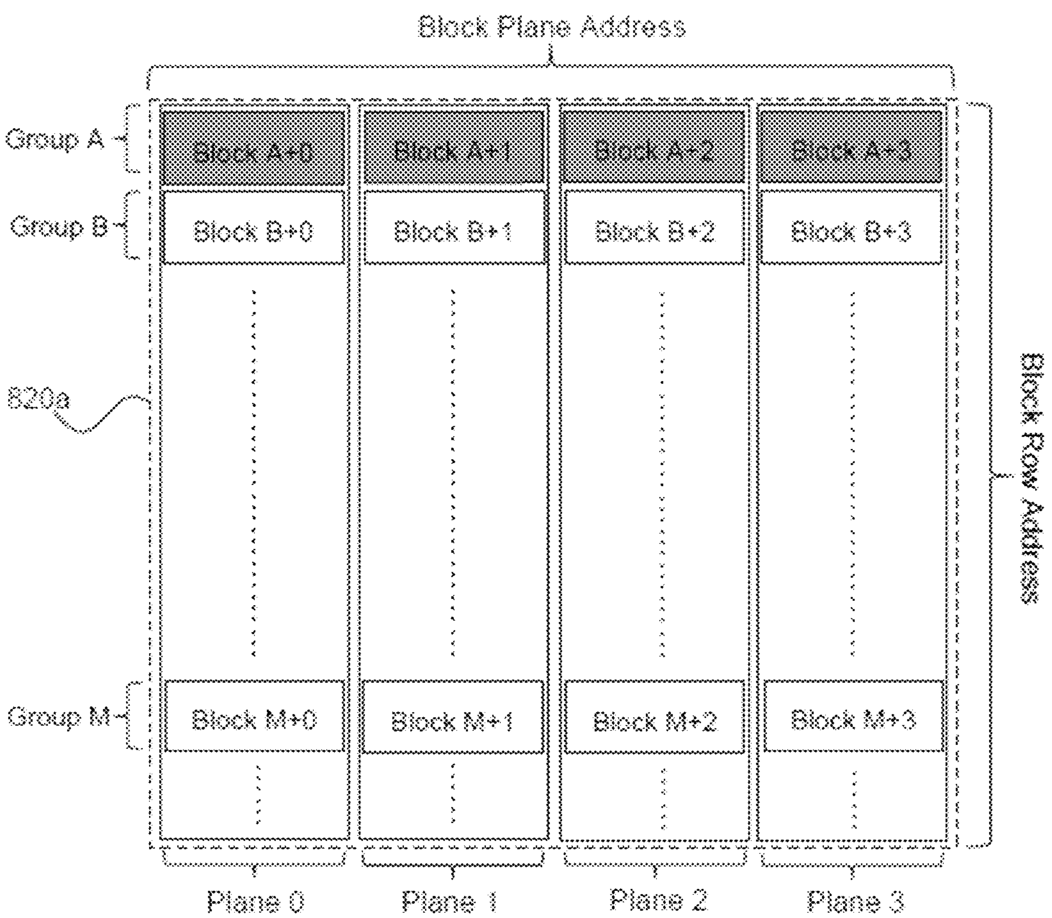
FIGS. 20A-20C illustrate a "block selection rule" that is inherent to the "multi-plane" concurrent memory operation approach conducted vis-à-vis the circuitry implementation of depicted in FIG. 19, in accordance with exemplary embodiments.
Figure 20B:
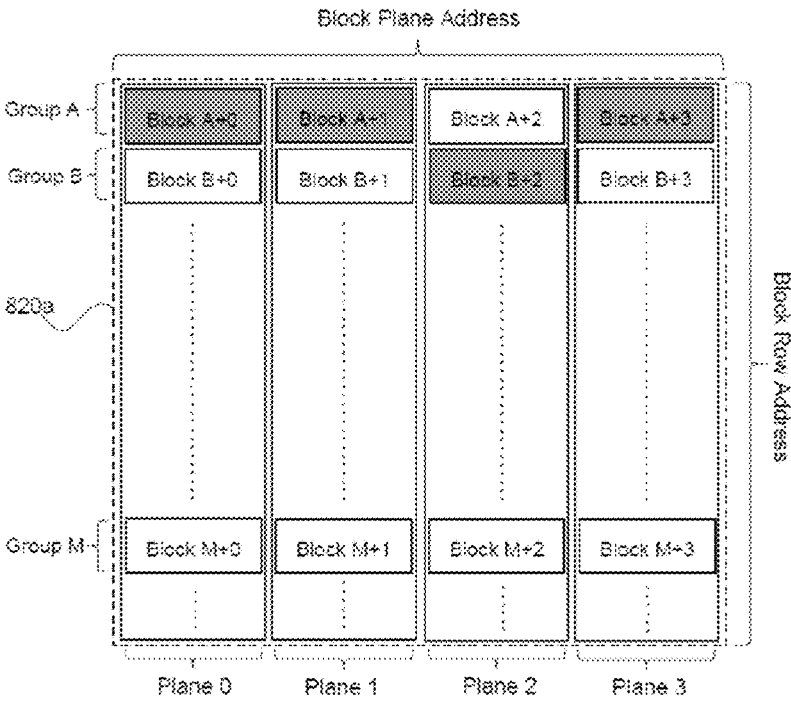
Figure 20C:
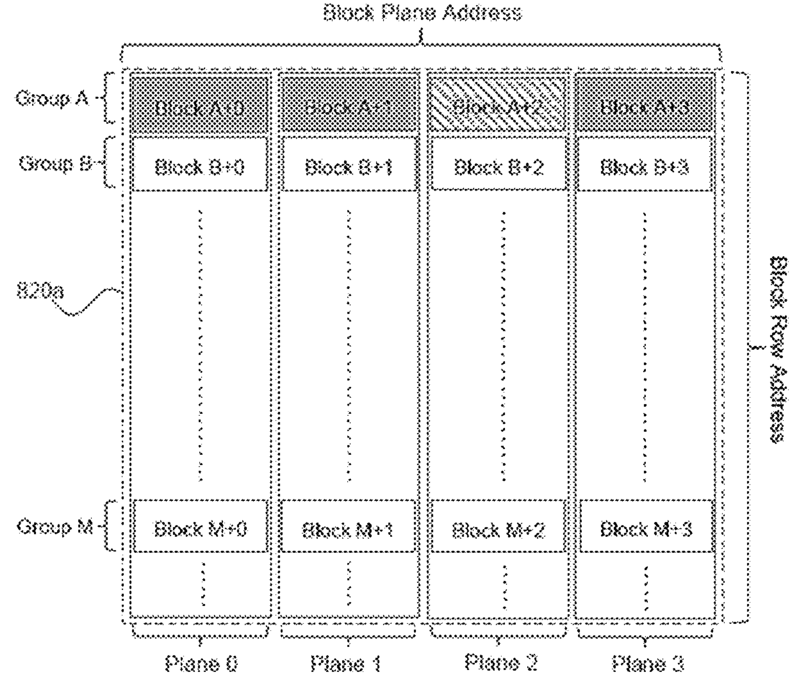

At focus in the diagrams provided in FIGS. 20A-20C is a particular example of a restriction that is inherently imposed by the "multi-plane" or concurrent approach and critically impacts the flexibility of such an approach. This restriction may be referred to as the "block selection rule" and is a corollary of the necessity of utilizing a global voltage bias source. The "block selection rule" dictates that, when employing a "multi-plane" approach, a memory operation may only be applied to a fixed memory block group. More specifically, although a memory operation may be applied to multiple memory planes of a memory structure in a concurrent manner, the memory operation can only be applied concurrently to the group of memory blocks that are located within the same memory array row according to each of their respective "block addresses." For illustrative purposes, FIG. 20A demonstrates the "block selection rule" as applied to the four memory planes (i.e., "Plane 0" through "Plane 3") of the exemplary embodiment of the memory device 820*a* shown in FIG. 17. In this example, the darkened memory blocks in FIG. 20A indicate the memory blocks currently selected for the concurrent application of a memory operation. Specifically, the memory blocks "Block A+0," "Block A+1," "Block A+2," and "Block A+3" are indicated as selected in FIG. 20A. In accordance with the "block selection rule," every selected memory block is located within the same memory array row (i.e., "Row A") and, therefore, are all within the same memory block group (i.e., "Group A"). Accordingly, the "block selection rule" requires that the complete memory block row be selected for application of a memory operation.

In FIG. 20B, the same memory device 820*a* depicted in FIG. 20A is again shown. However, in FIG. 20B, an improper or non-compliant (as well as impossible) memory block selection in view of the "block selection rule" is indicated. Here, as indicated by the darkened memory blocks, only three of the total four memory blocks selected (i.e., the memory blocks "Block A+0," "Block A+1," and "Block A+3") are actually located within the same row (i.e., "Row A"). Wrongly, the fourth memory block selected (i.e., memory block "Block B+2) is in a different row (i.e., "Row B"). Accordingly, and inflexibly, the proscriptions of the "block selection rule" do not support an arbitrary memory block selection during a "multi-plane" concurrent approach.

Referring now to FIG. 20C, there is depicted another example of an inefficiency or constraint as a result of the "block selection rule." Again, for purposes of illustration and comparison, the exemplary embodiment of memory device 820*a* (as set forth in FIG. 17) is pictured in FIG. 20C as the operational environment in this example. Similar to the conditions indicated in FIG. 20A, a proper memory block selection is made in accordance with the "block selection rule." Namely, all of the selected memory blocks (as indicated in FIG. 20C by the darkened memory blocks) are located within the same row (i.e., "Row A"). However, in this instance, one of the memory blocks that is located within "Row A" (i.e., memory block "Block A+2") is inoperable or inapplicable for purposes of the memory operation. For example, the memory block may be defective. In another example, the memory block may already be fully programmed and, therefore, in the case in which the memory operation being applied is a programming operation, this memory block would first need to be erased before it could be re-programmed. Due to the "block selection rule" in which the concurrent memory operation is permissible only with respect to a fixed memory block group (in this case, all memory blocks within "Row A" or "Group A"), the loss or lack of one or more of the memory blocks located within that fixed memory block group causes a break in the fixed memory block group. This amounts to a reduction in the storage capacity that is available during the concurrent memory operation and may drastically decrease the speed of the memory operation.

Figure 21A:
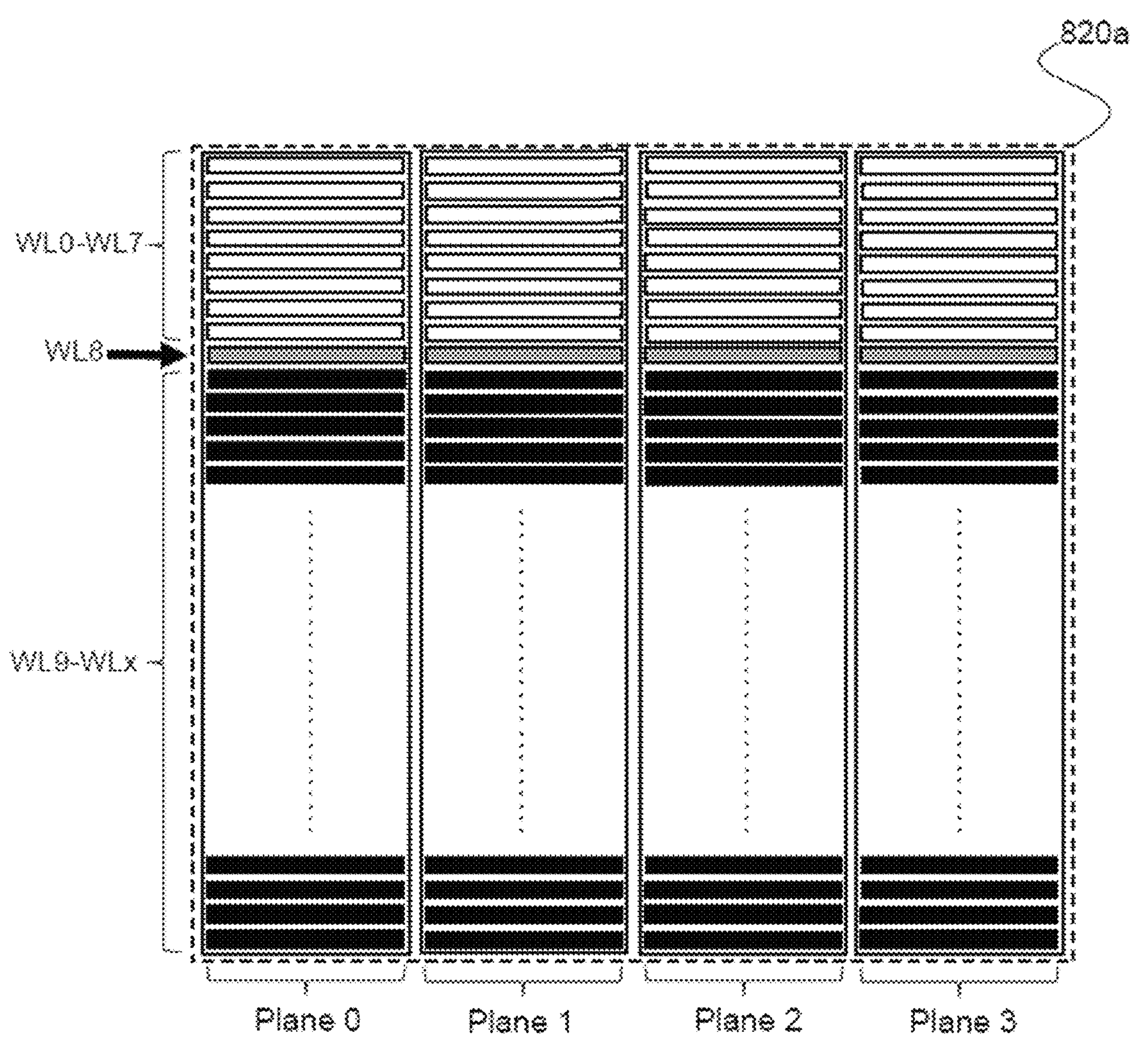
FIGS. 21A-21B illustrate a "word line selection rule" inherent to the "multi-plane" concurrent memory operation approach conducted vis-à-vis the circuitry implementation of depicted in FIG. 19, in accordance with exemplary embodiments.
Figure 21B:
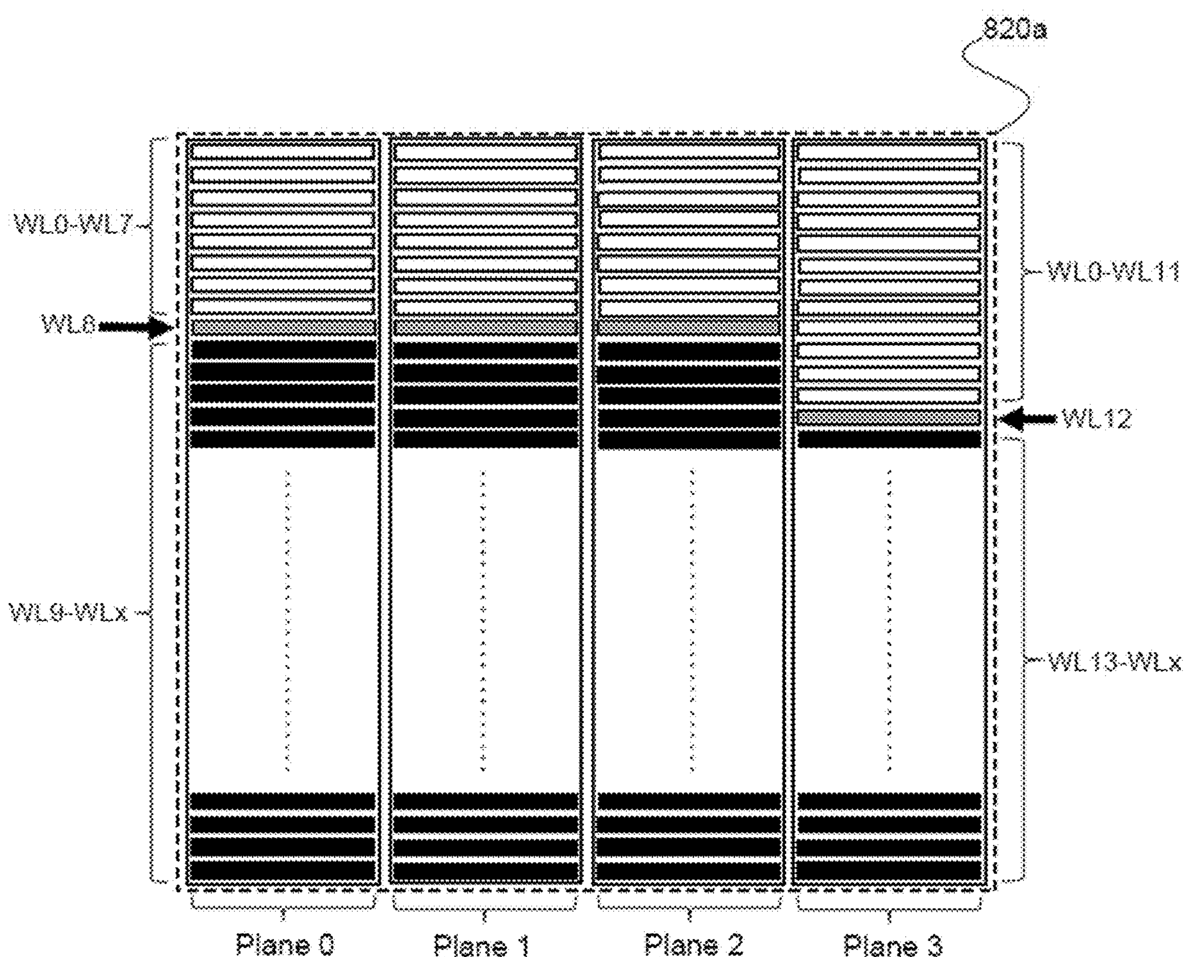

With respect to FIGS. 21A and 21B, there is depicted another example of an inherent restriction of a "multi-plane" concurrent approach that also limits the workability and the mutability of the approach. As dictated by the necessity of using a single global voltage bias source, the "multi-plane" concurrent approach further requires that, when applying a memory operation concurrently to multiple memory planes within a memory structure, the memory operation must be applied to the same word line (WL) selection across the memory planes. Accordingly, this requirement may be referred to as the "word line selection rule." Illustrated in FIG. 21A is an example of both a permissible and a feasible word line selection in view of the "word line selection rule." Again, for purposes of comparison and consistency with the above discussion, this example is provided in the context of the exemplary embodiment of memory device 820*a* (as depicted in FIG. 17). As depicted in FIG. 21A, the memory element arrays of each of the four memory planes (i.e., memory planes "Plane 0" through "Plane 3"), comprise a plurality of word lines (WLs). Specifically, each memory plane comprises a set of word lines "WL0" through "WLx," wherein "x" is an integer greater than zero (0). In this example, with respect to each memory plane, the memory operation (e.g., read, program, erase) that is being applied concurrently to the several memory planes, is, as indicated in FIG. 21A, applied to the same word line (i.e., word line "WL8") within each memory plane. Therefore, this word line selection is in accordance with the "word line selection rule." As indicated in FIG. 21A, the memory operation has been applied to word lines "WL9" through "WLx" and has not yet been applied to word lines "WL0" through "WL7."

Referring now to FIG. 21B, depicted there is, with regard to the "word line selection rule," an example of an impermissible (and impossible) word line (WL) selection during the performance of a memory operation. In contrast to the operating conditions that were demonstrated in FIG. 21A, the word line selection in this case is not identical across the four memory planes. As indicated in FIG. 21B, while the same word line "WL8" is selected with respect to each of "Plane 0" through "Plane 2," a different word line "WL12" is selected with respect to "Plane 3." This disparate word line selection is unsupported by the existing "multi-plane" concurrent approach.

Furthermore, in certain instances, it may not be possible to select the same word line (WL) with respect to each memory plane of a memory structure during a particular memory operation. For example, it is possible that a memory plane comprises one or more partially programmed ("open") memory blocks. Therefore, if applying a programming operation concurrently to the memory planes, it will not be possible to select a word line that is within a programmed portion of such a partially programmed memory block (due to the fact that a programmed memory element must first be erased before it can be re-programmed). In such a case, there will be a break in the fixed memory block group as a result. Therefore, as discussed above in regard to FIGS. 20A through 20C, and the "block selection rule," such a break in the fixed memory block group reduces the storage capacity that is available in the "multi-plane" concurrent approach, thereby diminishing the efficiency and speed that should otherwise result from the ability to concurrently perform a memory operation across multiple memory planes within a memory structure.

Additionally, also as a result of the necessity of a single global voltage bias source operating concurrently across multiple memory planes in the existing "multi-plane" approach, there is no ability to apply a memory operation to a hybrid of memory types. For example, as described in detail above, in order to program a memory element of the TLC-type, a different voltage bias paradigm is required from the voltage bias paradigm that is needed to program a memory element of the SLC-type, as the threshold voltage ($V_{th}$) distribution of a TLC-type memory element are vastly different from the threshold voltage ($V_{th}$) distribution of a SLC-type memory element. Therefore, a "multi-plane" concurrent approach cannot be used to apply a memory operation in a hybrid sequence.

Therefore, although a "multi-plane" concurrent memory operation approach may be effectively utilized in certain instances, its limited flexibility based upon the restrictions noted above (as well as others) greatly impacts the achievable efficiency in performance, as well as presents a significant challenge to memory block management. Further, these disadvantageous are increasingly problematic and acute as the amount of storage capacity and the degree of complexity continues to accelerate in future generations of non-volatile (solid-state) memory devices. Accordingly, it would be beneficial to derive systems and methods that improve the flexibility of a "multi-plane" concurrent memory operation approach. One solution is to incorporate into a concurrent memory operation approach "independent-plane" level memory operations. As described in greater detail below, "independent-plane" level memory operations enable the application of different bias voltages for each memory plane of a memory structure, thereby allowing for concurrent application of multiple plane-specific memory operation commands.

Figure 22:
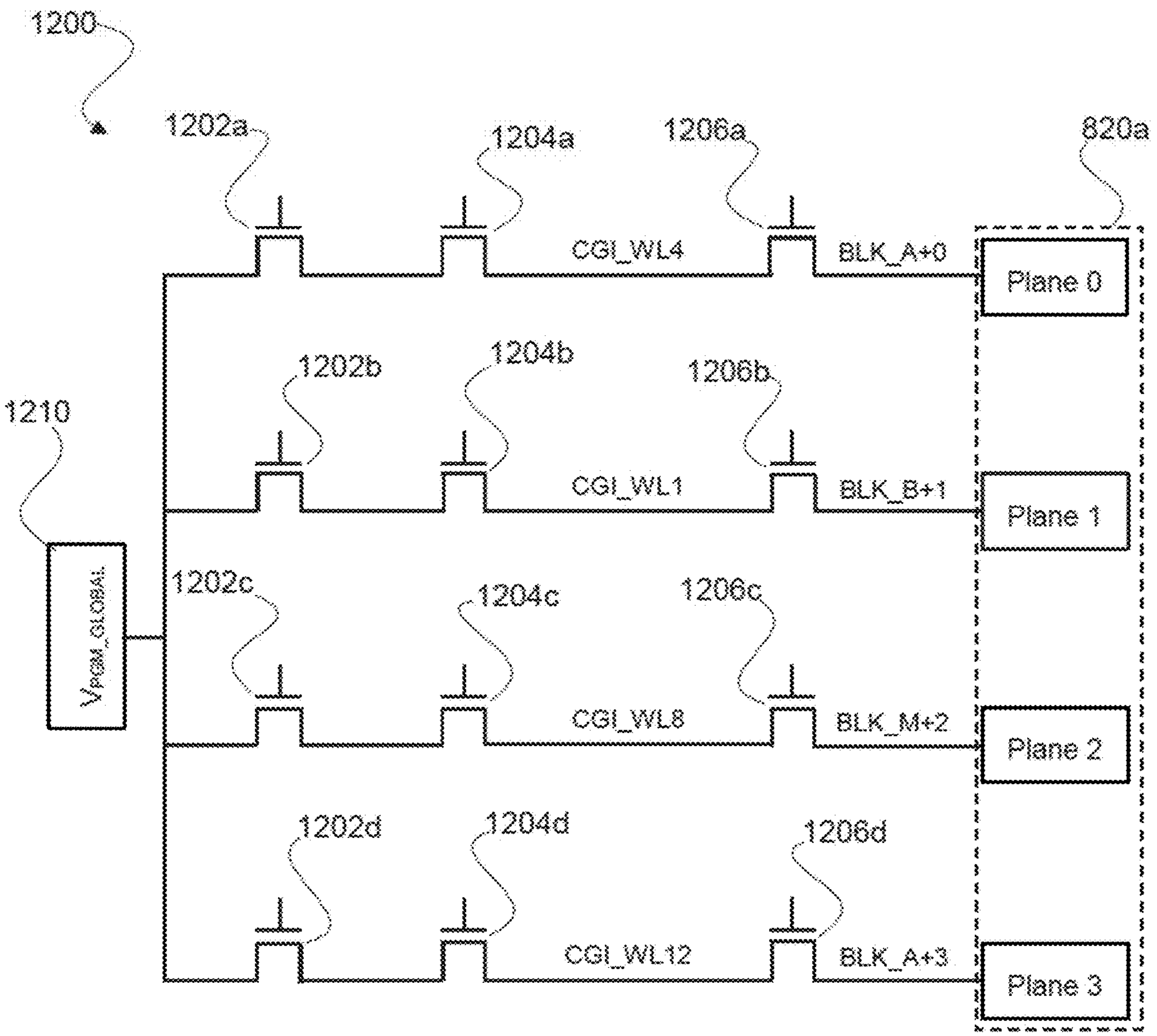
FIG. 22 schematically depicts a circuitry implementation that is employed in an "independent-plane" concurrent memory operation approach, in accordance with an exemplary embodiment.

Referring now to FIG. 22, there is depicted an exemplary embodiment of a circuitry implementation 1200 that may be employed to provide "independent-plane" level memory operations. In this particular illustration, the circuitry implementation is applied to the same multiple (i.e., four) memory planes of the exemplary embodiment of memory device 820*a* (as depicted in FIG. 17). Accordingly, the memory device 820*a* is shown as comprising memory planes "Plane 0," "Plane 1," "Plane 2," and "Plane 3." In a similar manner to the circuitry implementation 1100 of the exemplary embodiment that is depicted in FIG. 19, this circuitry implementation 1200 likewise utilizes just a single global voltage bias source 1210 (e.g., $V_{PGM\_GLOBAL}$) to carry out concurrent memory operations applied to the four memory planes. Further, also in a similar fashion to the circuitry implementation 1100, each memory plane is electrically coupled to the global voltage bias source 1210 via a series of electronic switching components-namely, a series of a first electronic switching component (e.g., CG driver) (1202*a*, 1202*b*, 1202*c*, and 1202*d*, respectively), a second electronic switching component (e.g., high voltage switch, (HVSW)) (1204*a*, 1204*b*, 1204*c*, and 1204*d*, respectively), and a row decoder (1206*a*, 1206*b*, 1206*c*, and 1206*d*, respectively). However, in stark contrast to the electronic switching components (1102*a-d*, 1104*a-d*, 1106*a-d*) of the circuitry implementation 1100, the electronic switching components in this particular embodiment are plane-separated such that a plane-specific memory operation signal may be sent (or transmitted) uniquely to a particular memory plane rather than across the entire memory structure (as in the case of a "multi-plane" concurrent approach). Accordingly, it is now possible to apply concurrent, but plane-specific, memory operations to all memory planes that comprise a given memory structure or memory device. As such, there are no inherent constraints on arbitrary memory block selection and differing word line (WL) selection. Importantly, it should be noted that the specific electronic components set forth in FIG. 22, as well as the particular circuitry configuration thereof, are intended to demonstrate a single non-limiting example. Accordingly, any suitable circuitry implementation that provides for the "independent-plane" memory operation that is described herein may be employed.

Figure 23:
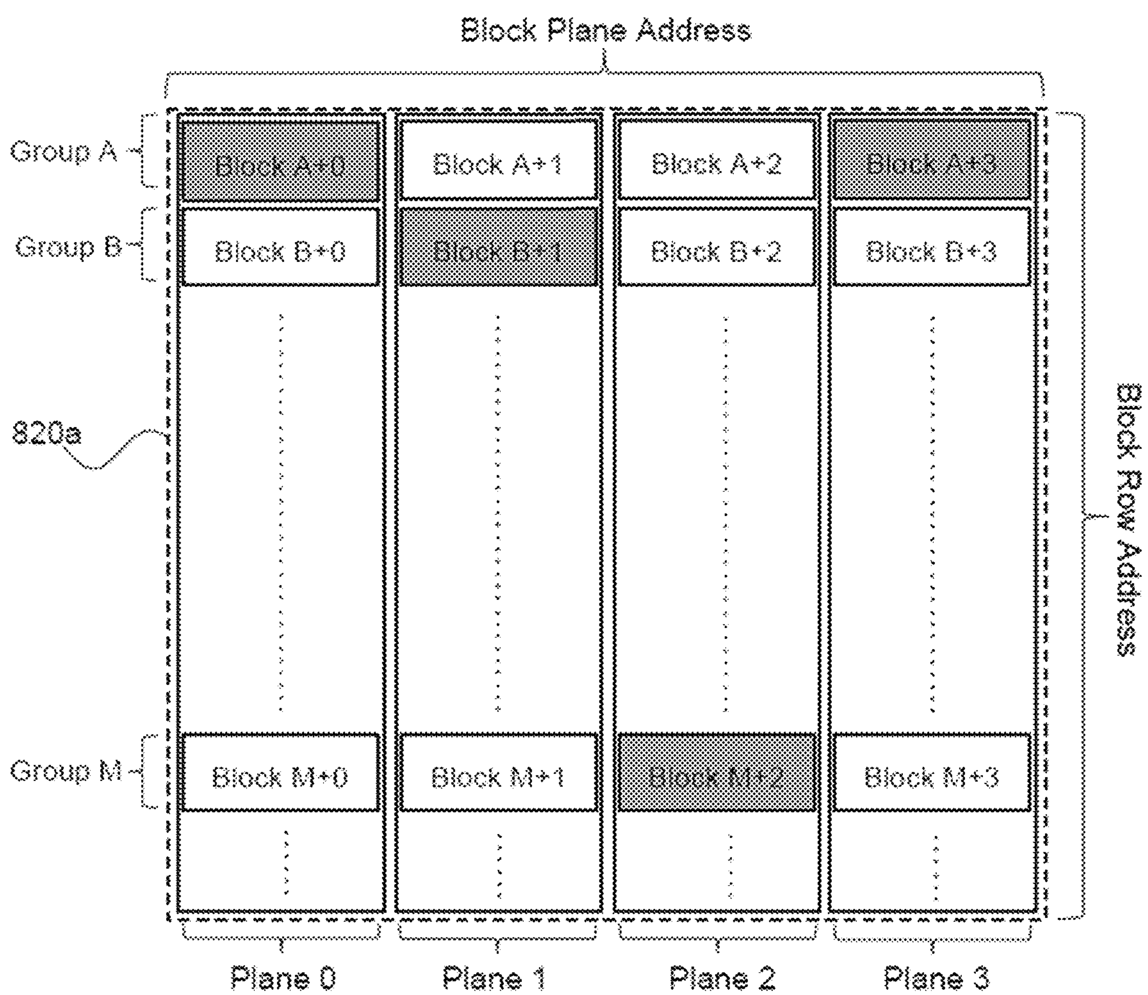
FIG. 23 illustrates a possible memory block selection as permitted during an "independent-plane" concurrent memory operation approach, in accordance with exemplary embodiments.

For example, FIG. 23 demonstrates just one illustrative example of the freedom in memory block selection permitted by the circuitry implementation 1200 of the embodiment depicted in FIG. 22. Corresponding to FIG. 22, the operational environment that is pictured in FIG. 23 are the four memory planes ("Plane 0" through "Plane 3") comprising the exemplary embodiment of memory device 820*a*. As described in detail above, each memory plane is comprised of multiple memory blocks. As indicated by the darkened memory blocks, the particular memory blocks that are selected for application of a memory operation (e.g., read, program, erase) are not all located within the same "block address" row. Rather, the selected memory blocks are located in different "block address" rows. Specifically, according to this particular example, the memory blocks having the following "block addresses" are selected: "Block A+0," "Block B+1," Block M+2," and "Block A+3."

Figure 24:
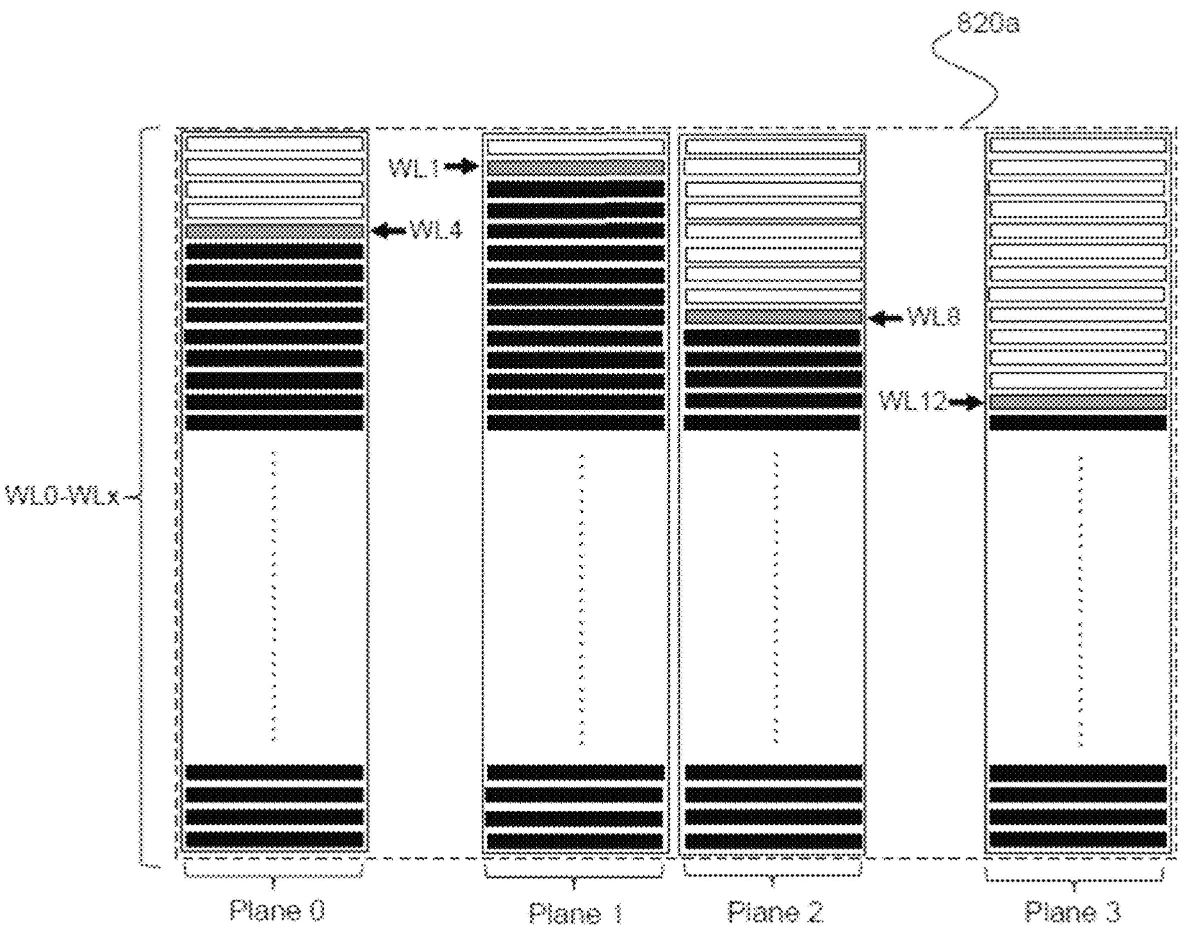
FIG. 24 illustrates a possible word line selection as permitted during an "independent-plane" concurrent memory operation approach, in accordance with exemplary embodiments.

Additionally, FIG. 24 depicts an example of the flexibility or variability in word line (WL) selection during a memory operation that is now afforded by the "independent-plane" memory operation approach. In this specific example, the exemplary embodiment of memory device 820*a* (as set forth in FIG. 17) constitutes the operational environment, once again, for consistency with the previous discussion. Accordingly, in an identical manner to the device embodiment depicted in FIG. 21B, each memory plane (i.e., "Plane 0" through "Plane 3") of memory device 820*a* is comprised of a set of word lines (WL), which are referenced therein as "WL0" through "WLx" (where "x" is an integer greater than zero). As indicated in FIG. 24, a word line (WL) selection for application of a memory operation is made with respect to each memory plane. Specifically, with respect to "Plane 0," word line "WL4" is selected. Also, with respect to "Plane 1," word line "WL1" is selected. In addition, with respect to "Plane 2," word line "WL8" is selected. Further, with respect to "Plane 3," word line "WL12" is selected. Therefore, unlike the strict confines in word line (WL) selection that are inherent in the "multi-plane" concurrent memory operation approach discussed above, here, it is possible to select differing word lines across the multiple memory planes for the concurrent application of the memory operation.

Referring back to the circuitry implementation 1200 of the exemplary embodiment depicted in FIG. 22, the block (or schematic) diagram therein, for purposes of providing a demonstration or a working example, is annotated with the precise signals (commands or pathways) corresponding to the specific memory block selections and word line selections indicated in the examples illustrated in FIGS. 23 and 24. Namely, in regard to "Plane 0," as indicated, a signal "CGI_WL4" is outputted from the second electronic switching component 1204*a*, and a signal "BLK_A+0" is outputted from the row decoder 1206*a*. Additionally, with respect to "Plane 1," a signal "CGI_WL1" is outputted from the second electronic switching component 1204*b*, and a signal "BLK_B+1" is outputted from the row decoder 1206*b*. Further, regarding "Plane 2," a signal "CGI_WL8" is outputted from the second electronic switching component 1204*c*, and a signal "BLK_M+2" is outputted from the row decoder 1206*c*. Also, regarding "Plane 3," a signal "CGI_WL12" is outputted from the second electronic switching component 1204*d*, and a signal "BLK_A+3" is outputted from the row decoder 1206*d*.

Furthermore, with the ability to address each memory plane independently, it is also possible to apply a memory operation to a hybrid of memory element types in which there are differing voltage bias requirements. For example, as mentioned above, it may be possible that a memory structure is intended to, when programmed, comprise both SLC-type and, for example, TLC-type (or QLC-type) memory elements. Due to the disparity in voltage bias requirements between these two different memory element types, it is altogether impossible to concurrently apply a memory operation to both memory element types under a "multi-plane" concurrent memory operation regime. However, if applying an "independent-plane" concurrent memory operation approach in which each memory plane may be addressed individually, it is no longer necessary to apply a uniform (or global) voltage bias to all of the memory planes of a given memory structure. Rather, a voltage bias that is applied to one memory plane of the memory structure may differ from another voltage bias that is being applied concurrently to a different memory plane of the memory structure.

Figure 25:
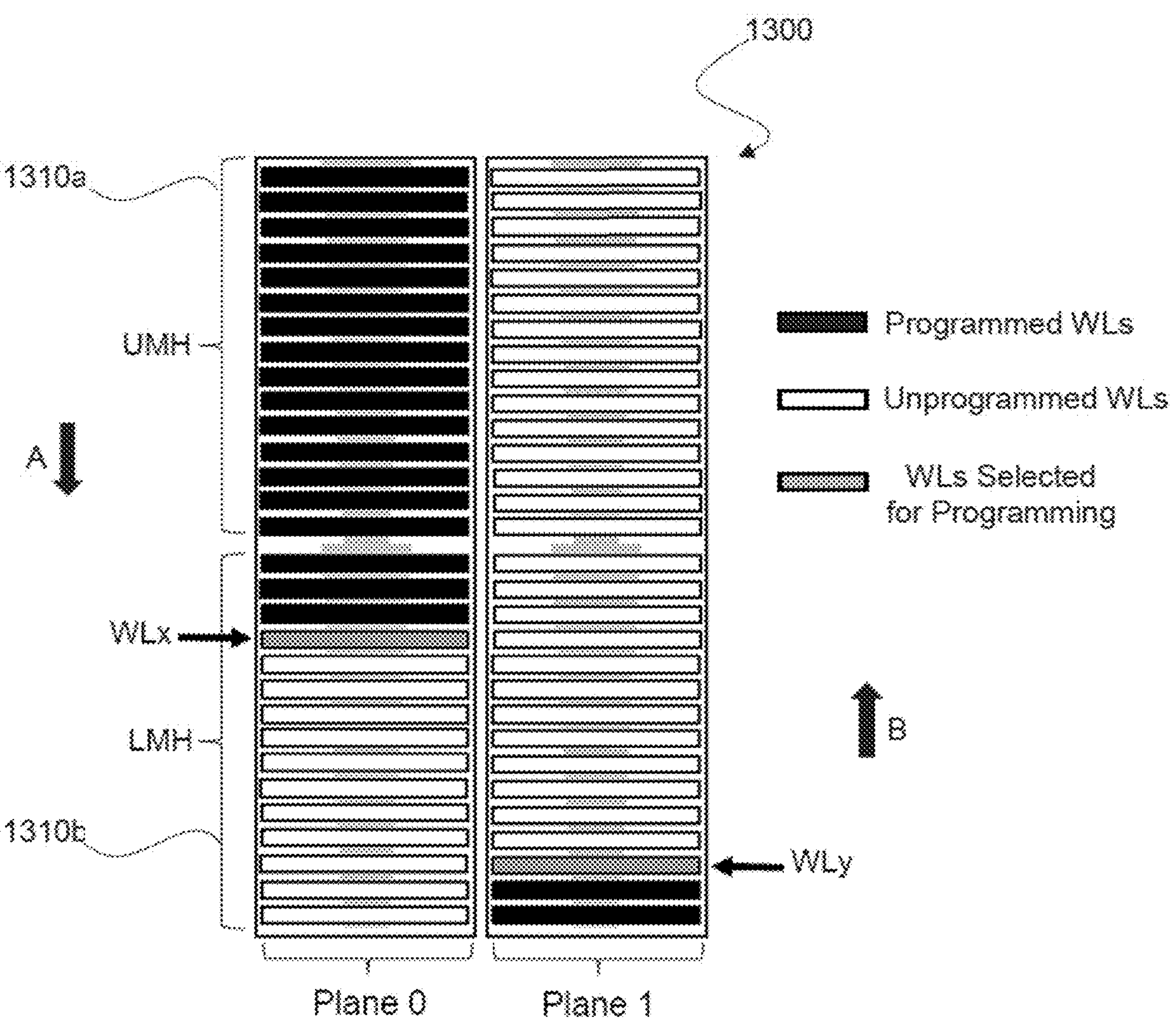
FIG. 25 illustrates another possible word line selection as permitted during an "independent-plane" concurrent memory operation approach, in accordance with exemplary embodiments.

Directing attention now to FIG. 25, there is pictured one exemplary embodiment of a memory structure 1300 comprising a dual memory plane architecture in the form of a three-dimensional NAND-type configuration. Specifically, memory structure 1300 comprises a first memory block ("Plane 0") and a second memory block ("Plane 1") with each memory block divided into an "upper memory hole" section 1310*a* (i.e., "UMH") and a "lower memory hole" section 1310*b* (i.e., "LMH"). In this example, the memory structure 1300 is undergoing a programming memory operation according to an "independent-plane" concurrent memory operation approach. As indicated in FIG. 25, each of "Plane 0" and "Plane 1" are, at this point, partially programmed to different degrees, with "Plane 0" programmed to a greater degree in comparison to "Plane 1." In addition, "Plane 0" is being programmed according to the programming order indicated by arrow "A" in FIG. 25. By contrast, "Plane 1" is being programmed according to the reverse order indicated by arrow "B." As also indicated, at this juncture, a word line "WLx" of "Plane 0" is currently selected for programming, whereas a different word line, "WLy," of "Plane 1" is currently selected for programming. Accordingly, as discussed above, an "independent-plane" concurrent memory operation approach supports the selection of different word lines across the multiple memory planes of a memory structure. Importantly, different programming orders are also achievable using an "independent-plane" concurrent memory operation approach.

It should be noted that an "independent-plane" concurrent memory operation approach may be implemented (or carried out) according to a specific command, or series of specific commands, such that an "independent-plane" concurrent memory operation may comprise a selectable mode that may be initiated only when desired. According to one exemplary embodiment, the following executable computer program code command(s) may be utilized to enter (or otherwise enable) an "independent-plane" programming (or write) mode ("IPW"):

```
CMD ZZ; ADD(yy); DATA(01); //enabling different word line (WL)
selection;
CMD ZZ; ADD(yy); DATA(02); //enabling arbitrary memory block group
  selection;
CMD ZZ; ADD(yy); DATA(03); //enabling different word line (WL) and
  arbitrary memory block group selection
```

Furthermore, the following executable computer program code command(s) may be utilized to exit (or otherwise disable) an "independent-plane" programming (or write) mode ("IPW"), according to one exemplary embodiment:

CMD ZZ; ADD(yy); DATA(00)

Using as a working example the dual memory plane architecture comprising memory structure 1300 of the exemplary embodiment depicted in FIG. 25, the following executable computer program code command sequence may be, according to an exemplary embodiment, employed in order to apply an "independent-plane" concurrent SLC programming approach to "Plane 0" and "Plane 1":

```
ZZh- ADD(yyh) - Data(11h); //Enter multi plane IPW mode
A2h- 80h- address(5cyc/PB0) - Data in - 11h => busy -> ready =>
A2h- 80h- address(5cyc/PB1) - Data in - 10h => busy (tProg) -> ready
=>
ZZh- ADD(yyh) - Data(00h); //Exit multi plane IPW mode
```

As the selection of different word lines is enabled in this mode, the default word line (WL) layer offset for VPGM, PD1_CLK, and P5TOP7_CLK, should be disabled or unified as concurrent programming of different word lines is supported by the single global voltage bias ($V_{PGM\_GLOBAL}$) source. In contrast to VPGM, the VPASS of the unselected word lines can be supplied by "independent-plane" VUSEL/VUSLL/VUSELH, thereby supporting different VPASS word line layers for a respective memory plane.

It should be noted that, regarding SLC program operations, the word line (WL) layer offset can define different voltage bias level(s) (VPGMSLC) for different word lines. However, the IPW mode can require the same voltage bias level (VPGM) for all selected word lines. Therefore, the following "Table 1" may provide, according to an exemplary embodiment, proposed look-up values for F_IPW_VPGM to define the final VPGM on all of the selected word lines:

TABLE 1

| [7] | [6] | [5] | [4] | [3] | [2] | [1] | [0] | Default | Option |
|---|---|---|---|---|---|---|---|---|---|
| | | | | | | 0 | 0 | x | Disable WL layer offset |
| | | | | | | 0 | 1 | | Based on plane with min VPGM |
| | | | | | | 1 | 0 | | Based on plane with max VPGM |

Further, with respect to TLC program operations, the beginning voltage bias level (VPGM) may be, according to certain exemplary embodiments, determined by a "multi-plane" smart verify algorithm.

Additionally, the signal "PD1_CLK" defines the program pulse width. Thus, for increased storage densities (i.e., storage densities higher than SLC), the following "Table 2" may provide, according to an exemplary embodiment, proposed look-up values for F_IPW_IPD1:

TABLE 2

| [7] | [6] | [5] | [4] | [3] | [2] | [1] | [0] | Default | Option |
|---|---|---|---|---|---|---|---|---|---|
| | | | | 0 | 0 | | | x | Disable WL layer offset |
| | | | | 0 | 1 | | | | Based on plane with min PD1__CLK |
| | | | | 1 | 0 | | | | Based on plane with max PD1__CLK |

Further, the signal "P5TOP7_CLK" determines the pre-charge timing during a programming operation. Accordingly, the word line layer offset with respect to signal "P5TOP7_CLK" ensures that a sufficient pre-charge time period is employed in connection with each selected word line. When the "IPW" mode is enabled, the final F_IPW_P5TP07 for all accessed word lines should be identical and determined by the word line with a "max P5TOP7-_CLK."

Figure 26:
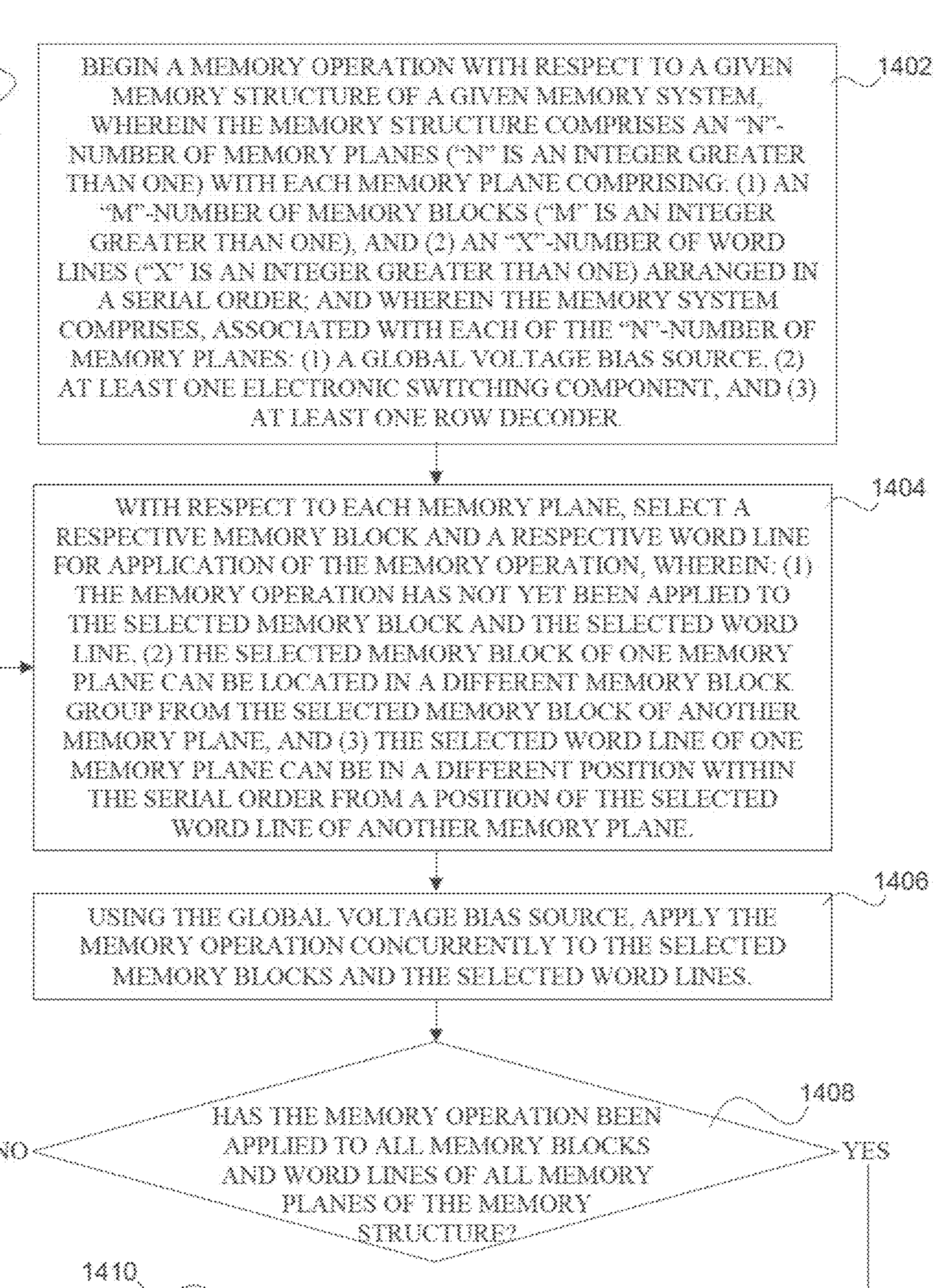
FIG. 26 is a flow diagram generally illustrating the several steps of an "independent-plane" concurrent memory operation approach, in accordance with an exemplary embodiment.

Referring now to FIG. 26, there is provided a flow diagram generally outlining an exemplary embodiment of a process 1400 for performing an "independent-plane" concurrent memory operation (e.g., read, program, erase). Accordingly, beginning at step 1402, a memory operation is initiated with respect to a given memory structure (e.g., the memory device 820*a* depicted in FIG. 17) of a given memory system (such as a memory system that comprises the circuitry implementation 1200 pictured in FIG. 22). According to this specific embodiment, the memory structure comprises an "N"-number of memory planes (wherein "N" is an integer that is greater than one), with each memory plane comprising: (1) an "M"-number of memory blocks (wherein "M" is an integer greater than one), and (2) an "X"-number of word lines (WLs) that are arranged in a serial order (wherein "X" is an integer greater than one). Also, according to this specific embodiment, the memory system comprises, associated with each memory plane: (1) a global voltage bias source, and (2) at least one electronic switching component and at least one row decoder. Next, at step 1404, in regard to each memory plane, a respective memory block and a respective word line thereof is selected for application of the memory operation. It is noted that, with respect to the particular selection: (1) the memory operation has not yet been applied to the selected memory block and the selected word line, (2) the selected memory block of one memory plane can be located in a different memory block group from the selected memory block of another memory plane, and (3) the selected word line of one memory plane can be in a different position within the serial order from a position of the selected word line of another memory plane. Thereafter, at step 1406, using the global voltage bias source, the memory operation is applied concurrently to the selected memory blocks and selected word lines. Once complete, a determination is made as to whether the memory operation has been applied to all memory blocks and all word lines of all memory planes of the memory structure (see step 1408). If the determination is made that the memory operation has been applied to the entirety of the memory structure, then the memory operation is deemed finished (see step 1410). However, if the determination is made that the memory operation has not yet been applied to the entirety of the memory structure, the process 1400 returns to the selection step (i.e., step 1404). Accordingly, the process 1400 will cycle through steps 1404, 1406, and 1408 until the memory operation has been applied to the entire memory structure.

Figure 27:
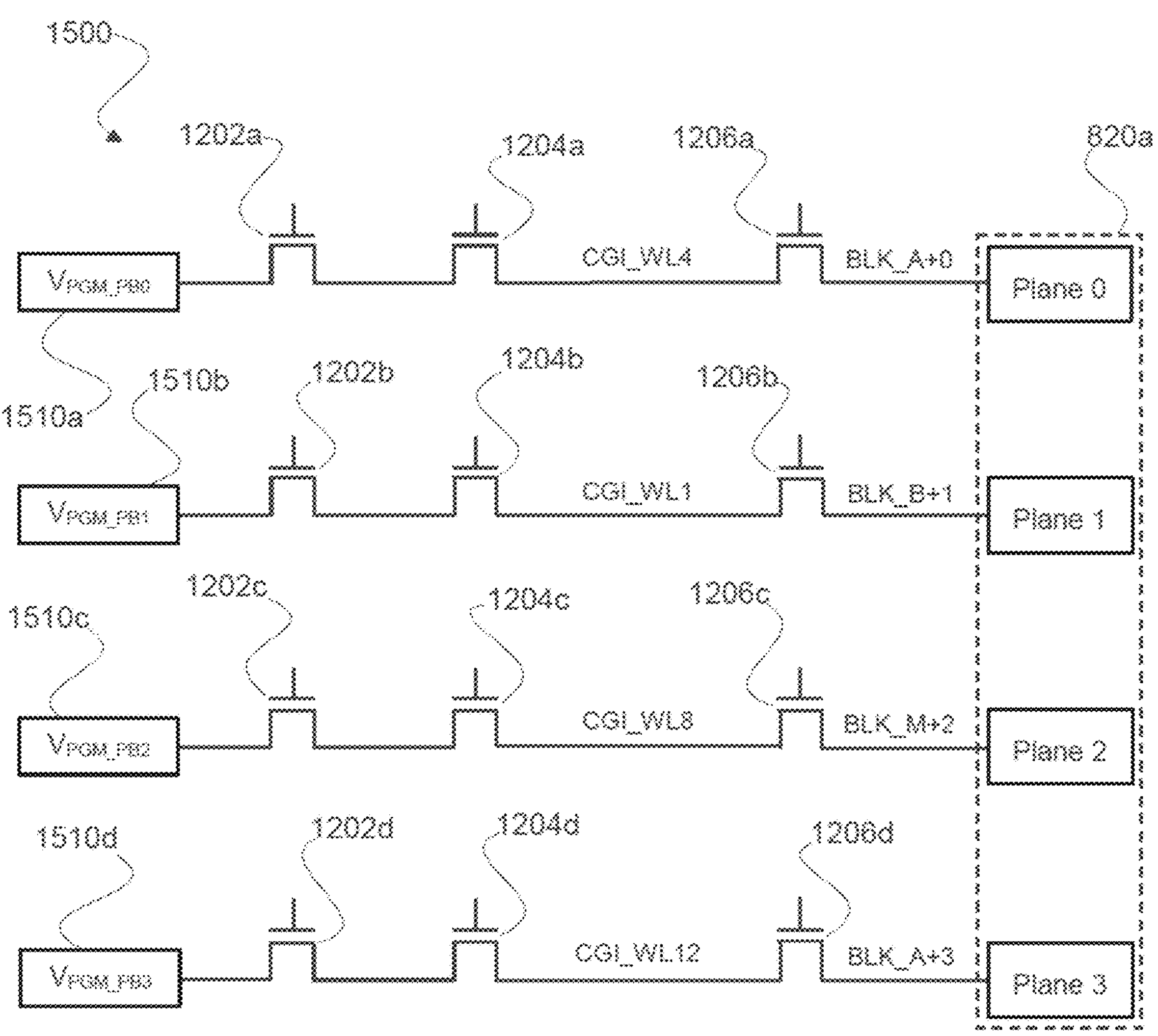
FIG. 27 schematically depicts a circuitry implementation that is employed in an "independent-plane" memory operation approach, in accordance with another exemplary embodiment.

It should be noted that the above description of an "independent-plane" concurrent memory operation approach specifically relates to concurrent memory operations that are performed synchronously (i.e., are initiated at the identical point in time) as necessitated by the use of a single global voltage bias source (e.g., voltage source 1210 of the embodiment that is shown in FIG. 22). However, according to certain other exemplary embodiments, a circuitry modification may be made in order to support the asynchronous memory operations as well. Pictured in FIG. 27 is one such exemplary circuitry embodiment, depicted as applied to the multiple memory planes of memory device 820*a*. Specifically, in FIG. 27, there is depicted a circuitry implementation or architecture 1500 that, for the most part, exactly corresponds to the circuitry implementation 1200 of the exemplary embodiment provided in FIG. 22. The only distinction between the two circuitry embodiments (1200 and 1500) is that, rather than apply a single global voltage bias source (e.g., voltage source 1210) to each of the four memory planes ("Plane 0" through "Plane 3") of the memory device 820*a*, the circuitry 1500 according to this embodiment associates each memory plane "Plane 0" through "Plane 3" with its own separate voltage bias source (see 1510*a*, 1510*b*, 1510*c*, and 1510*d*, respectively). That is to say, each memory plane is electrically coupled to its respective dedicated voltage bias source (e.g., "$V_{PGM\_PB0}$," "$V_{PGM\_PB1}$," "$V_{PGM\_PB2}$," and "$V_{PGM\_PB3}$," respectively). In other words, the voltage bias source may be characterized as "plane-separated." As a result, a memory operation with respect to one memory plane of a memory structure may start at a time that is independent (or irrespective) of the timing of a memory operation that is being applied to another memory plane of the memory structure.

Additionally, the following executable computer program code sequence is one exemplary embodiment for entry into an asynchronous "independent-plane" programming ("aIPW") mode:

CMD ZZ; ADD(yy); DATA(04);//enabling aIPW mode

Referring now to FIG. 28, there is provided a flow diagram generally outlining an exemplary embodiment of a process 1600 for performing an asynchronous "independent-plane" memory operation (e.g., read, program, erase). Beginning at step 1602, a memory operation is initiated with respect to a given memory structure (e.g., the memory device 820*a* depicted in FIG. 17) of a given memory system (such as a memory system that comprises the circuitry implementation 1500 shown in FIG. 27). According to this particular embodiment, the memory structure comprises an "N"-number of memory planes (wherein "N" is an integer that is greater than one), with each memory plane comprising: (1) an "M"-number of memory blocks (wherein "M" is an integer greater than one), and (2) an "X"-number of word lines (WLs) that are arranged in a serial order (wherein "X" is an integer greater than one). Also, according to this specific embodiment, the memory system comprises, associated with each memory plane, a voltage bias source, at least one electronic switching component, and at least one row decoder. Next, at step 1604, in regard to each memory plane, a respective memory block and a respective word line thereof is selected for application of the memory operation. It is noted that, with respect to the particular selection: (1) the memory operation has not yet been applied to the selected memory block and the selected word line, (2) the selected memory block of one memory plane can be located in a different memory block group from the selected memory block of another memory plane, and (3) the selected word line of one memory plane can be in a different position within the serial order from a position of the selected word line of another memory plane. Subsequently, at step 1606, the memory operation is then applied to the selected memory blocks and the selected word lines, wherein a starting time of the application of the memory operation in regard to one memory plane may differ from a starting time of the application of the memory operation to another memory plane. Once complete, a determination is made as to whether the memory operation has been applied to all memory blocks and all word lines of all memory planes of the memory structure (see step 1608). If the determination is made that the memory operation has been applied to the entire memory structure, then the memory operation is deemed finished (see step 1610). However, if the determination is made that the memory operation has not yet been applied to the entire memory structure, the process 1600 returns to the selection step (i.e., step 1604). Accordingly, the process 1600 will cycle through steps 1604, 1606, and 1608 until the memory operation has been applied to the entire memory structure.

The above discussion is meant to be illustrative of the principles and various embodiments of the present invention. Numerous variations and modifications will become apparent to those skilled in the art once the above disclosure is fully appreciated. For example, although on-memory controllers have been described as performing or controlling the methods that are described above, any processor executing software within a host system can perform the methods described above without departing from the scope of the disclosure. In particular, the methods and techniques described herein as performed in the on-memory controller(s), may also be performed in a host. Furthermore, the methods and concepts disclosed herein may be applied to other types of persistent memories other than flash. It is intended that the following claims be interpreted to embrace all such variations and modifications.

What is claimed is:

1. A method for performing a multi-plane memory operation with respect to a multi-plane memory structure, wherein the multi-plane memory operation includes programming multiple memory planes in a same programming operation, the method comprising:

initiating a memory operation with respect to a memory system, wherein:

the memory system comprises a non-volatile memory structure having a plurality of memory planes, with each memory plane comprising: (1) a plurality of memory blocks, and (2) a plurality of word lines arranged in a serial order; and electrically connected with each memory plane are: (1) a respective voltage bias source from among a plurality of plane-independent voltage bias sources, (2) at least one electronic switching component, and (3) at least one row decoder;

with respect to each memory plane, selecting a respective memory block and a respective word line for application of the memory operation, wherein:

the memory operation has not yet been applied to the selected memory block and the selected word line;

the selected memory block of one memory plane is located in a different memory block group from the selected memory block of another memory plane; and the selected word line of one memory plane can be in a different position within the serial order from a position of the selected word line of another memory plane;

in a first mode, using the respective voltage bias sources, concurrently applying the memory operation to the respective selected memory blocks and to the respective selected word lines, wherein the respective voltage bias sources comprise multiple voltage bias sources, wherein each of the respective voltage bias sources is associated with a specific one of the memory planes, and in a second mode, performing an asynchronous memory operation in which a starting time of the application of the memory operation with respect to one memory plane differs from a starting time of the application of the memory operation to another memory plane by applying respective voltage biases to the memory planes from the plurality of plane-independent voltage bias sources.

2. The method according to claim 1, wherein the memory structure comprises a plurality of NAND-type memory cells, and:

at least one of the memory blocks comprises a population of SLC-type memory cells; and at least one of the other memory blocks comprises a population of memory cells having a higher storage density than an SLC-type memory cell.

3. The method according to claim 1, wherein a memory block group comprises all memory blocks located within a same memory array row.

4. A memory controller configured to perform a multi-plane memory operation in which multiple memory planes are programmed in a same programming operation, the memory controller comprising:

a communication pathway configured to couple to a memory system, wherein:

the memory system comprises a non-volatile memory structure having a plurality of memory planes, with each memory plane comprising: (1) a plurality of memory blocks, and (2) a plurality of word lines arranged in a serial order, and electrically connected with each memory plane are: (1) a respective voltage bias source from among a plurality of plane-independent voltage bias sources; (2) at least one electronic switching component, and (3) at least one row decoder;

the memory controller is configured to:

initiate a memory operation with respect to the memory system;

with respect to each memory plane, select a respective memory block and a respective word line for application of the memory operation, wherein:

the memory operation has not yet been applied to the selected memory block and the selected word line;

the selected memory block of one memory plane can be located in a different memory block group from the selected memory block of another memory plane; and the selected word line of one memory plane can be in a different position within the serial order from a position of the selected word line of another memory plane;

in a first mode, using the respective voltage bias sources, concurrently apply the memory operation to the respective selected memory blocks and to the respective selected word lines, wherein the voltage bias source comprises multiple voltage bias sources, wherein each voltage bias source is associated with a specific one of the memory planes; and in a second mode, performing an asynchronous memory operation in which a starting time of the application of the memory operation with respect to one memory plane differs from a starting time of the application of the memory operation to another memory plane by applying respective voltage biases to the memory planes from the plurality of plane-independent voltage bias sources.

5. The memory controller according to claim 4, wherein the memory structure comprises a plurality of NAND-type memory cells, and:

at least one of the memory blocks comprises a population of SLC-type memory cells; and at least one of the other memory blocks comprises a population of memory cells having a higher storage density than an SLC-type memory cell.

6. The memory controller according to claim 4, wherein a memory block group comprises all memory blocks located within a same memory array row.

7. A non-volatile memory system configured to perform a multi-plane memory operation in which multiple memory planes are programmed in a same programming operation, comprising:

a memory structure having an a plurality of memory planes, with each memory plane comprising: (1) a plurality of memory blocks, and (2) a plurality of word lines arranged in a serial order;

electrically connected with each memory plane: (1) a respective voltage bias source from among a plurality of plane-independent voltage bias sources; (2) at least one electronic switching component, and (3) at least one row decoder;

a memory controller coupled to the memory structure and configured to:

initiate a memory operation with respect to the memory system;

with respect to each memory plane, select a respective memory block and a respective word line for application of the memory operation, wherein:

the memory operation has not yet been applied to the selected memory block and the selected word line;

the selected memory block of one memory plane can be located in a different memory block group from the selected memory block of another memory plane; and the selected word line of one memory plane can be in a different position within the serial order from a position of the selected word line of another memory plane;

in a first mode, using the respective voltage bias sources, concurrently apply the memory operation to the respective selected memory blocks and to the respective selected word lines, wherein the voltage bias source comprises multiple voltage bias sources, wherein each voltage bias source is associated with a specific one of the memory planes; and in a second mode, performing an asynchronous memory operation in which a starting time of the application of the memory operation with respect to one memory plane differs from a starting time of the application of the memory operation to another memory plane by applying respective voltage biases to the memory planes from the plurality of plane-independent voltage bias sources.

8. The non-volatile memory system according to claim 7, wherein the memory structure comprises a plurality of NAND-type memory cells, and:

at least one of the memory blocks comprises a population of SLC-type memory cells; and at least one of the other memory blocks comprises a population of memory cells having a higher storage density than an SLC-type memory cell.

9. The non-volatile memory system according to claim 7, wherein a memory block group comprises all memory blocks located within a same memory array row.

* * * * *